(12) United States Patent
Rasmussen et al.

(10) Patent No.: US 7,878,888 B2
(45) Date of Patent: Feb. 1, 2011

(54) RACK ENCLOSURE

(75) Inventors: Neil Rasmussen, Concord, MA (US); Mark H. Germagian, Hudson, MA (US); Victor P. Avelar, Pawtucket, RI (US); James Edward Donovan, Tewksbury, MA (US)

(73) Assignee: American Power Conversion Corporation, West Kingston, RI (US)

( * ) Notice: Subject to any disclaimer, the term of this patent is extended or adjusted under 35 U.S.C. 154(b) by 0 days.

(21) Appl. No.: 11/510,501

(22) Filed: Aug. 25, 2006

(65) Prior Publication Data

US 2007/0129000 A1 Jun. 7, 2007

Related U.S. Application Data

(63) Continuation of application No. 10/781,556, filed on Feb. 17, 2004, now Pat. No. 7,112,131, which is a continuation-in-part of application No. 10/436,886, filed on May 13, 2003, now Pat. No. 7,033,267.

(51) Int. Cl.
H05K 5/00 (2006.01)
H05K 7/20 (2006.01)

(52) U.S. Cl. .................. 454/184; 361/695

(58) Field of Classification Search .......... 454/184; 361/695

See application file for complete search history.

(56) References Cited

U.S. PATENT DOCUMENTS

| | | |
|---|---|---|
| 3,102,184 A | 8/1963 | Sherron |
| 4,352,274 A | 10/1982 | Anderson et al. |
| 4,774,631 A | 9/1988 | Okuyama et al. |
| 4,851,965 A | 7/1989 | Gabuzda et al. |

(Continued)

FOREIGN PATENT DOCUMENTS

DE 101 28 367 A1 1/2003

(Continued)

OTHER PUBLICATIONS

See attached DE 10128367A1 document with abstract translation.*

(Continued)

*Primary Examiner*—Steve McAllister
*Assistant Examiner*—Kosanovic Helena
(74) *Attorney, Agent, or Firm*—Lando & Anastasi, LLP

(57) ABSTRACT

An enclosure is provided for housing electronic equipment that accommodates the different cooling and ventilating requirements of different types of equipment. The enclosure is constructed and arranged to support cooling airflow in a front-to-back configuration through the enclosure and in a side-to-side configuration from one side to an opposite side of the enclosure. The enclosure can thereby provide within a single enclosure means cooling air for components using front-to-back airflow for cooling, such as information technology (IT) equipment, and for components using side-to-side airflow, such as certain types of telecommunications equipment. The enclosure can thereby support a mix of IT and telecommunications equipment, providing flexibility and adaptability in network room and data center configuration. The enclosure is further configured to separate intake air used by equipment for cooling from exhaust air vented by equipment into its interior during operation. As a result, the enclosure promotes sufficient equipment cooling and prevents/minimizes equipment overheating.

8 Claims, 57 Drawing Sheets

U.S. PATENT DOCUMENTS

| | | | |
|---|---|---|---|
| 5,063,477 | A | 11/1991 | Paggen et al. ............... 361/695 |
| 5,210,680 | A | 5/1993 | Scheibler |
| 5,409,419 | A | 4/1995 | Euchner et al. |
| 5,440,450 | A | 8/1995 | Lau et al. ..................... 361/695 |
| 5,497,288 | A | 3/1996 | Otis et al. ................... 361/687 |
| 5,540,548 | A * | 7/1996 | Eberhardt et al. ........ 415/182.1 |
| 5,544,012 | A | 8/1996 | Koike |
| 5,657,641 | A | 8/1997 | Cunningham et al. |
| 5,718,628 | A | 2/1998 | Nakazato et al. |
| 5,910,045 | A | 6/1999 | Aoki et al. |
| 5,914,858 | A | 6/1999 | McKeen et al. |
| 5,982,618 | A | 11/1999 | Roos |
| 5,999,403 | A | 12/1999 | Neustadt |
| 6,000,232 | A | 12/1999 | Witten-Hannah et al. |
| 6,052,282 | A | 4/2000 | Sugiyama et al. |
| 6,075,698 | A | 6/2000 | Hogan et al. |
| 6,101,459 | A | 8/2000 | Tavallaei et al. |
| 6,104,607 | A | 8/2000 | Behl |
| 6,145,502 | A | 11/2000 | Lyons et al. |
| 6,164,369 | A | 12/2000 | Stoller |
| 6,198,628 | B1 | 3/2001 | Smith ......................... 361/695 |
| 6,222,729 | B1 | 4/2001 | Yoshikawa |
| 6,252,770 | B1 | 6/2001 | Yu et al. |
| 6,288,897 | B1 | 9/2001 | Fritschle et al. |
| 6,305,180 | B1 | 10/2001 | Miller et al. ............... 62/259.2 |
| 6,317,320 | B1 | 11/2001 | Cosley et al. ............... 361/695 |
| 6,368,064 | B1 | 4/2002 | Bendikas et al. |
| 6,375,561 | B1 | 4/2002 | Nicolai et al. |
| 6,406,257 | B1 | 6/2002 | Houdek |
| 6,412,292 | B2 | 7/2002 | Spinazzola et al. |
| 6,459,579 | B1 | 10/2002 | Farmer et al. ............... 361/695 |
| 6,462,944 | B1 | 10/2002 | Lin |
| 6,463,997 | B1 | 10/2002 | Nicolai et al. |
| 6,494,050 | B2 | 12/2002 | Spinazzola et al. |
| 6,535,382 | B2 | 3/2003 | Bishop et al. |
| 6,557,357 | B2 | 5/2003 | Spinazzola et al. |
| 6,565,428 | B2 | 5/2003 | Hsiao |
| 6,574,970 | B2 | 6/2003 | Spinazzola et al. |
| 6,611,428 | B1 | 8/2003 | Wong ......................... 361/695 |
| 6,668,565 | B1 | 12/2003 | Johnson et al. ................ 62/89 |
| 6,682,159 | B2 | 1/2004 | Compagnucci |
| 6,704,196 | B1 | 3/2004 | Rodriguez et al. |
| 6,704,199 | B2 | 3/2004 | Wiley ......................... 361/695 |
| 6,722,151 | B2 | 4/2004 | Spinazzola et al. |
| 6,724,624 | B1 * | 4/2004 | Dodson ....................... 361/695 |
| 6,745,579 | B2 | 6/2004 | Spinazzola et al. |
| 6,778,386 | B2 | 8/2004 | Garnett et al. |
| 6,788,535 | B2 | 9/2004 | Dodgen et al. ............. 361/695 |
| 6,819,560 | B2 | 11/2004 | Konshak et al. |
| 6,822,859 | B2 | 11/2004 | Coglitore et al. |
| 6,889,752 | B2 | 5/2005 | Stoller |
| 6,927,977 | B2 | 8/2005 | Singer ....................... 361/695 |
| 7,033,267 | B2 | 4/2006 | Rasmussen |
| 7,112,131 | B2 | 9/2006 | Rasmussen et al. |
| 7,500,911 | B2 | 3/2009 | Johnson et al. |
| 2001/0029163 | A1 | 10/2001 | Spinazzola et al. |
| 2002/0007643 | A1 | 1/2002 | Spinazzola et al. |
| 2002/0059804 | A1 | 5/2002 | Spinazzola et al. |
| 2002/0108386 | A1 | 8/2002 | Spinazzola et al. |
| 2002/0121555 | A1 | 9/2002 | Cipolla et al. |
| 2003/0235035 | A1 | 12/2003 | Wintersteen et al. ........ 361/687 |
| 2004/0099747 | A1 | 5/2004 | Johnson et al. |
| 2004/0160720 | A1 | 8/2004 | Yamanashi et al. |
| 2004/0227435 | A1 | 11/2004 | Rasmussen ................. 312/236 |
| 2005/0048896 | A1 | 3/2005 | Shaben |
| 2005/0159098 | A1 | 7/2005 | Johnson et al. |
| 2005/0170770 | A1 | 8/2005 | Johnson et al. |
| 2006/0276121 | A1 | 12/2006 | Rasmussen |
| 2007/0129000 | A1 | 6/2007 | Rasmussen et al. |
| 2007/0171613 | A1 | 7/2007 | McMahan et al. |
| 2009/0308579 | A1 | 12/2009 | Johnson et al. |

FOREIGN PATENT DOCUMENTS

| | | |
|---|---|---|
| DE | 10128367 A1 * | 1/2003 |
| EP | 0 741 269 B1 | 11/1996 |
| EP | 1 705 977 B1 | 9/2006 |
| FR | 2 193 303 | 2/1974 |
| FR | 2 831 019 | 4/2003 |
| FR | 2 831 019 A1 | 4/2003 |
| GB | 2 354 066 A | 3/2001 |
| JP | 51-55922 | 4/1976 |
| JP | 54-56503 | 4/1979 |
| JP | 59-151478 | 10/1984 |
| JP | 62-174397 | 11/1987 |
| JP | 1-163541 | 6/1989 |
| JP | 3-85797 | 4/1991 |
| JP | 4-85785 | 7/1992 |
| JP | 5-15423 | 1/1993 |
| JP | 5-160592 | 6/1993 |
| JP | 6-272694 | 9/1994 |
| JP | 7-98781 | 4/1995 |
| JP | 8-285421 | 11/1996 |
| JP | 9-64555 | 3/1997 |
| JP | 10-339500 | 12/1998 |
| JP | 11-184570 | 7/1999 |
| JP | 2000-47757 | 2/2000 |
| JP | 2000-112574 | 4/2000 |
| JP | 2000-315883 | 11/2000 |
| JP | 2001-257496 | 9/2001 |
| WO | 0162060 A1 | 8/2001 |
| WO | 01/86217 A1 | 11/2001 |
| WO | 02/16854 A1 | 2/2002 |
| WO | 02/093093 A1 | 11/2002 |
| WO | 2004/049773 A2 | 6/2004 |

OTHER PUBLICATIONS

Website: http://www.sharkrack.com/cart/display.php?category_id=16&product_is=25.
Website: http://www.edpeurope.com/sharkrack.html.
Enterprise 4000/4500/Stor Rack Kit Installation Instructions.
Liebert, "Foundation—60Hz", May 2002, 9 pages.
Liebert, "DataCool—60Hz", May 2002, 2 pages.
International Search Report mailed May 4, 2005.
International Search Report for PCT/US2005/005148 mailed Jun. 17, 2005.
Partial International Search Report for PCT/US03/37625 mailed Jun. 1, 2004.
European Search Report for EP 08 16 4463 dated Mar. 1, 2010.

* cited by examiner

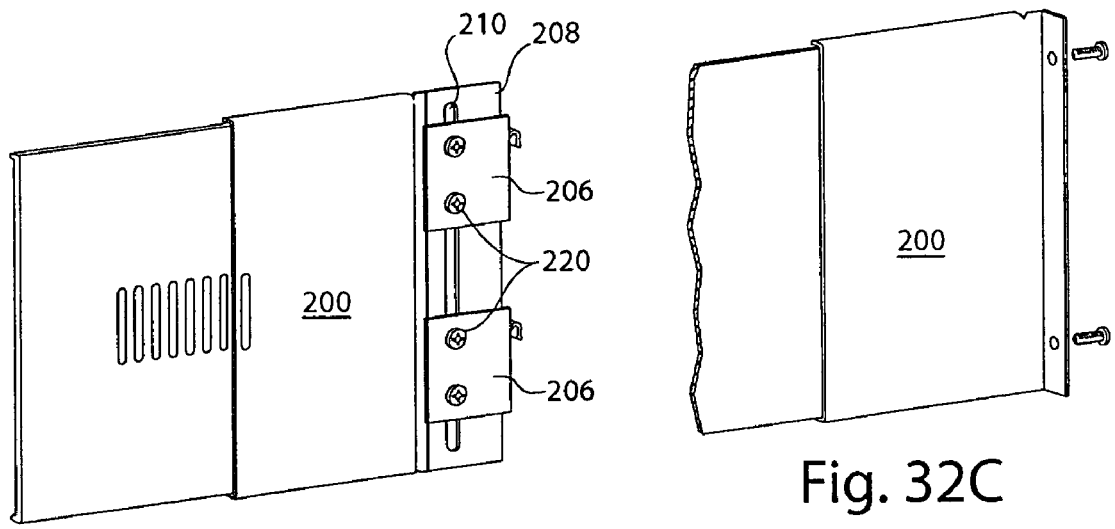
Fig. 32B
Fig. 32C
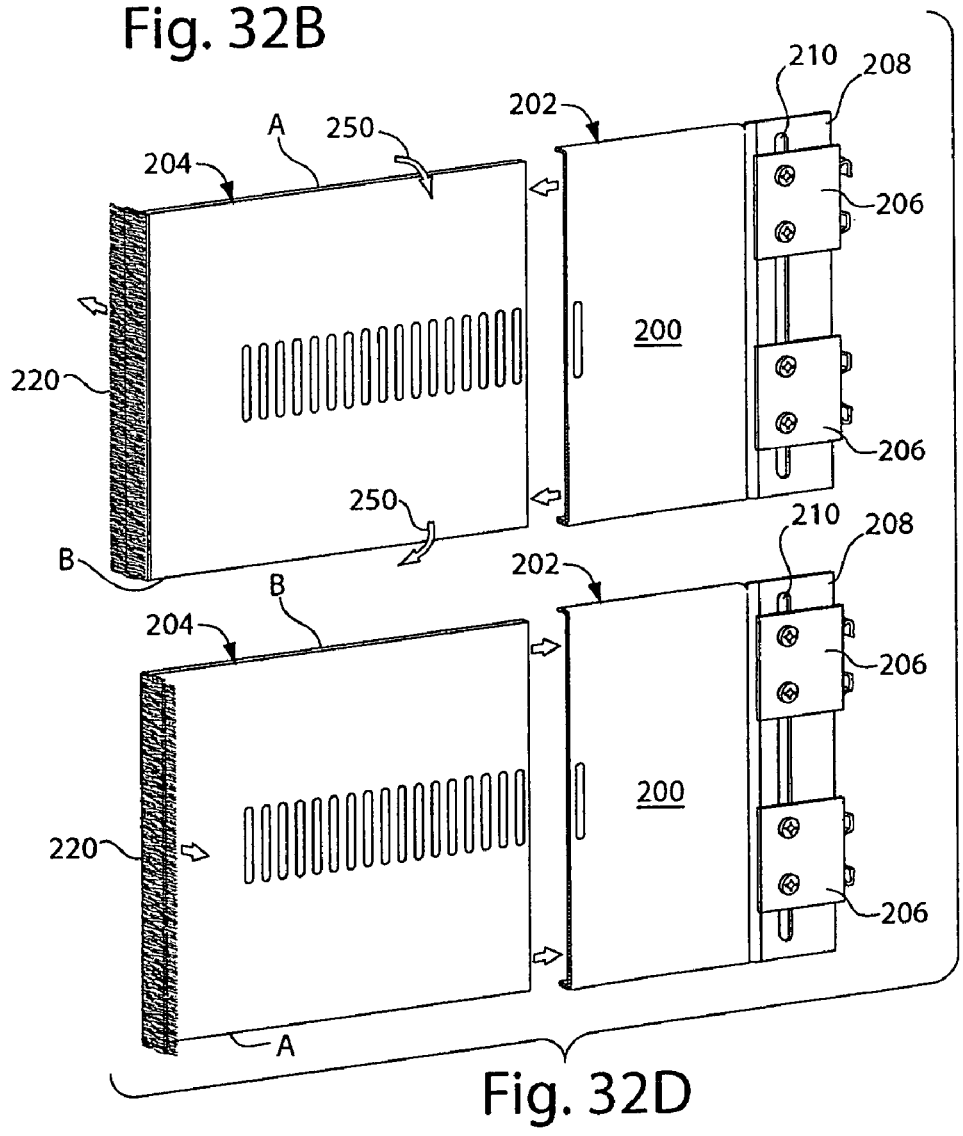
Fig. 32D

RACK ENCLOSURE

PRIOR RELATED PATENT APPLICATIONS

This application is a continuation of patent application Ser. No. 10/781,556, filed on Feb. 17, 2004, now U.S. Pat. No. 7,112,131, which is a continuation-in-part patent application under 37 C.F.R. §1.53(b) of U.S. patent application Ser. No. 10/436,886 filed on May 13, 2003, now U.S. Pat. No. 7,033,267, all of which are incorporated herein by reference.

FIELD OF THE INVENTION

The invention relates to an enclosure for use with rack-mounted equipment.

BACKGROUND OF INVENTION

Advancements in information technology (IT) equipment present challenges in creating a more effective IT environment in data centers and networking facilities. Equipment enclosures designed for high power density applications employing servers and networking equipment typically must provide not only effective cable management and power distribution, but also adequate cooling and ventilation to assure proper and reliable operation of equipment. Equipment rack enclosures for use in such high heat generating applications are primarily configured and equipped to provide front-to-back airflow to accommodate the standard front-to-back airflow pattern used by IT equipment for cooling and ventilation. However, IT equipment racks and enclosures generally cannot provide adequate cooling and ventilation for equipment that typically uses a side-to-side airflow, such as certain types of telecommunications equipment. When an IT equipment enclosure includes equipment using side-to-side airflow and equipment using front-to-back airflow, the air intakes of the side-to-side equipment typically share the enclosure interior with the exhaust vents of all of the equipment. As a result, the air intakes of equipment using side-to-side airflow often do not receive sufficient cooling air required for proper operation of the equipment. Insufficient cooling air can cause overtemperature shutdown and unreliable performance and reduced lifetime of the equipment. IT equipment enclosures and racks configured to provide front-to-back airflow, therefore, are essentially incompatible with airflow patterns of some types of electronic equipment using side-to-side airflow for cooling and ventilating, such as certain types of telecommunications components.

Conventional solutions to this problem include mounting, for example, telecommunications equipment in open-frame racks to promote air circulation through components. Open-frame configurations do not confine hot and warm exhaust air within an enclosure or around equipment air intakes; however, such configurations do not prevent circulation of exhaust air to equipment air intakes and, therefore, do not overcome problems of insufficient cooling and overheating of equipment. Telecommunications equipment disposed in side-by-side rack configurations are susceptible to direct intake of exhaust air vented from adjacent or neighboring equipment and, as a result, have an increased risk of overheating during operation.

Another solution includes incorporating fans in a top of a housing of an enclosure to draw hot and warm air vertically upward from within a rack to vent exhaust air through the enclosure top. Such top-mounted fans, however, do not assure sufficient cooling air will be provided to air intakes of all equipments components mounted in a rack. Nor do top-mounted fans prevent exhaust air from circulating to air intakes of such components. Top-mounted fans can further overdrive airflow through a rack and can cause significant mixing of exhaust air with cooling air. Mixing exhaust air with cooling air can reduce the efficiency of a network room or data center's cooling system. Using top-mounted fans limits the space available on an enclosure top for other functions, including data and power cabling. In addition, top-mounted fans restrict the size and location of equipment that can be mounted in upper sections of the enclosure due to interference with fan airflow.

Further, the overall efficiency, cost, reliability and cooling capacity of a cooling system of a network room or data center is directly related to the ability to separate cooling air from hot and warm exhaust air within an equipment enclosure during operation of equipment. Separation of exhaust air from cooling air is a result of proper installation of rack enclosures; however, present enclosure and rack designs and cooling solutions for electronic equipment using side-by-side airflow do not separate exhaust air from cooling air. In the past, circulation of exhaust air with cooling air was not problematic because the power density of equipment, for instance, telecommunications equipment was significantly less than an average of 1 kW per rack. Current designs of telecommunications equipment, however, may consume 6 kW or more per rack, and, thus, require effective cooling methods.

SUMMARY OF THE INVENTION

In general, in an aspect, the invention provides an improved enclosure means for electronic equipment that accommodates cooling and ventilating requirements of different types of equipment. In one aspect, the invention provides an enclosure means configured to separate cooling intake air from exhaust air vented by equipment during operation to facilitate sufficient cooling and to prevent overheating of the equipment. In another aspect, the invention provides an enclosure means configured to separate cooling intake air from exhaust air vented by equipment using side-to-side airflow for cooling and ventilating. Another aspect of the invention provides an enclosure configured to simultaneously accommodate different cooling requirements of different types of rack-mounted equipment using front-to-back airflow or side-to-side airflow within the same enclosure, while separating cooling intake air from exhaust air. A further aspect of the invention provides an enclosure having an interior defining a plenum or chamber constructed and arranged to receive and to contain cooling air for intake by equipment using side-to-side airflow for cooling. In another aspect, a chamber or plenum can be configured within an equipment enclosure wherein the chamber or plenum is constructed and arranged to contain cooling air for intake by equipment using side-to-side airflow and to prevent air loss from the chamber or plenum. Yet another aspect of the invention provides an enclosure having an adaptable configuration to meet different airflow requirements of equipment using front-to-back airflow and equipment using side-by-side airflow for cooling and ventilating. Still a further aspect of the invention provides a system of barriers, partitions, interconnections and other components to permit an interior of an enclosure, and/or an equipment rack housed within the enclosure, to be easily and rapidly configured and arranged for mounting different types of equipment and for simultaneously supporting different airflow patterns used by the equipment for cooling and ventilating.

In general, in one aspect, the invention provides an enclosure for containing equipment comprising a housing including a top side, a bottom side, a first side, a second side, and a front side, at least one of the bottom side and the front side having formed therein at least one opening to receive cooling air into a front portion of an interior of the housing, and at least one of the rear side and the top side having formed therein at least one opening to allow exhaust air to vent from within a back portion of the interior of the housing to an area external to the housing; an internal frame disposed in the interior of the housing and spaced from the first side and the second side and secured therein to allow mounting of one or more equipment components in an equipment area formed by the internal frame; and a first air plenum disposed along a first side of the internal frame between the internal frame and the first side of the housing, the first air plenum being in fluid communication with the front portion of the interior of the housing to receive cooling air from the openings and being configured to contain air along the first side of the internal frame such that air can flow from the first air plenum into equipment in the internal frame.

Implementations of the invention may include one or more of the following features. The enclosure further comprises a second air plenum disposed along a second side of the internal frame between the internal frame and the second side of the housing, the second air plenum being in fluid communication with the back portion of the interior of the housing and adapted to receive exhaust air from equipment in the internal frame. The first air plenum includes a back section that provides an airflow blocking barrier between the first air plenum and the back portion of the interior of the housing. The second air plenum includes a front section that provides an airflow blocking barrier between the second air plenum and the front portion of the interior of the housing.

The enclosure further comprises a first partition removably mounted between the first air plenum and the first side of the internal frame to block air flow from the first air plenum into a portion of the equipment area of the internal frame. In addition, the enclosure further comprises a second partition removably mounted between the second air plenum and the second side of the internal frame to block air flow from a portion of the equipment area of the internal frame into the second air plenum. The enclosure further comprises an exhaust unit coupled to at least one of the rear panel and the top panel, the exhaust unit having at least one fan contained to draw air from within the interior of the enclosure.

The enclosure further comprises a first partition removably mounted between the first air plenum and the first side of the internal frame to block air flow from the first air plenum into a portion of the equipment area of the internal frame. The front portion is adapted to provide cooling air to equipment mounted to the internal frame, wherein the equipment is adapted for front to back cooling.

In another aspect, the invention provides a method of cooling a first device and a second device, each of which is mounted in an equipment enclosure, wherein the first device is configured for front to back cooling, and the second device is configured for side to side cooling, the method comprising receiving cooling air into an internal front portion of the equipment enclosure; drawing air from the internal front portion through the first device into a rear internal portion of the enclosure; drawing air from the internal front portion to a side internal portion of the enclosure; drawing air from the side internal portion through the second device and into a second side internal portion; exhausting air from the second side internal portion and from the rear internal portion out of at least one of a top of the enclosure and a back of the enclosure; and separating air exhausted from devices from air to be drawn into devices. The enclosure includes an equipment frame having an internal area that contains the first device and the second device, and wherein the method further includes removably mounting a first partition between the side internal portion and the internal area of the equipment frame to block air flow between the side internal portion and a portion of the internal area.

The method further comprises inserting a third device into the equipment frame, the third device being configured for side to side cooling; and removing the first partition to allow side to side airflow through the third device.

In a further aspect the invention provides an equipment enclosure for containing equipment comprising an external housing; an internal frame disposed in the interior of the housing and secured within the housing to allow mounting of equipment components in an equipment area formed by the internal frame, the equipment components including a first type of equipment having front to back cooling and a second type of equipment having side to side cooling; and means for facilitating air flow from a front internal portion of the external housing to a back internal portion of the external housing, such that when equipment of the first type is mounted in the internal frame, side to side cooling can be achieved and when equipment of the second type is mounted in the internal frame front to back cooling can be achieved.

In yet another aspect, the invention provides an equipment enclosure comprising a 23-inch enclosure housing having a front side, a first side, a second side and a back side; a 19-inch wide equipment frame disposed within the internal area of the enclosure housing, such that a first side area is formed between the first side of the enclosure housing and a first side of the equipment frame, a second side area is formed between a second side of the equipment frame and the second side of the enclosure housing, a front area is formed between the front side of the enclosure housing and a front side of the equipment frame, and a back area is formed between the back side of the enclosure housing and a back side of the equipment frame; a first internal panel disposed between the first side of the equipment frame and the first side of the enclosure housing to provide a substantially air tight seal between the first side area and the back area; and a second internal panel disposed between the second side of the equipment frame and the second side of the enclosure housing to provide a substantially air tight seal between the second side area and the front area. The enclosure includes a top side and a bottom side, and wherein at least one of the front side and the bottom side include openings to allow air flow into the enclosure, and at least one of the top side and the back side include openings to allow air flow out of the enclosure.

The enclosure further comprises at least one exhaust fan mounted to one of the top side of the enclosure and the back side of the enclosure to draw air from the back area.

Various aspects of the invention may provide one or more of the following advantages. A single type of equipment enclosure can be used to contain electronic equipment regardless of an airflow pattern, e.g., front-to-back airflow or side-to-side airflow, used by the equipment to meet its cooling and ventilating needs. The enclosure can thereby help to simplify the planning, design and maintenance of a data center or network room. Equipment components using side-to-side airflow can be mounted in a rack housed within an enclosure having one or more doors, e.g., as an alternative to an open-frame rack, to provide enhanced security and protection of the equipment.

An enclosure, and/or a rack housed within the enclosure, configured to permit front-to-back airflow can be converted, e.g., easily and rapidly reconfigured, to accommodate the operating requirements of equipment using side-to-side airflow for cooling and ventilating. The enclosure interior can be configured to define an air intake chamber or plenum along a side, e.g., left side, of the rack that is substantially enclosed and can receive and contain cooling air from which equipment using side-to-side airflow may draw from to meet its cooling and ventilating requirements. The enclosure, and/or the rack housed within the enclosure, can be configured to permit one or more air ducts having multiple fans to be mounted in the rack adjacent to and between equipment components using side-by-side airflow to increase a volume of cooling air directed to air intakes along the components. Air ducts can be configured and disposed within the rack such that the multiple fans draw cooling air into the air ducts and the air ducts direct cooling air into the chamber or plenum. The enclosure and/or the rack can thereby be configured to pressurize the chamber or plenum by increasing volumes and/or flow rate of cooling air into the chamber or plenum. Increased volumes of cooling air can be provided to equipment using side-to-side airflow for cooling when the equipment is housed in an enclosure and/or mounted to a rack that is configured to provide front-to-back airflow. Performance reliability and useful life of electronic equipment using side-to-side airflow can be increased and overheating and equipment shutdown reduced when housed in a standard enclosure providing front-to-back airflow in comparison to other cooling solutions.

An enclosure, and/or a rack housed within the enclosure, configured to simultaneously accommodate the cooling and ventilating requirements of equipment using front-to-back airflow and equipment using side-to-side airflow can allow the rack to operate at a high power density. The enclosure and the rack can house a mix of different types of equipment using front-to-back airflow or side-to-side airflow within a single enclosure means, and can thereby eliminate the need for two separate enclosures and racks, each configured to meet one type of airflow required for cooling and ventilating. The single enclosure means, therefore, can reduce floor space required to house different types of equipment. An enclosure, and/or a rack housed within the enclosure, configured to simultaneously accommodate the cooling and ventilating requirements of equipment using front-to-back airflow and equipment using side-to-side airflow can accept and accommodate cooling needs of equipment components, e.g., using side-to-side airflow, having different front-to-back depths as well as having air intake vents located at various sites along the components. Various barriers, partitions, panels, interconnections, gaskets, grommets and the like can be used to configure an enclosure interior, and/or a rack disposed in the enclosure, to provide front-to-back airflow and side-to-side airflow within a single enclosure means, and to separate cooling air from exhaust air.

An enclosure, and/or a rack housed within the enclosure, can be configured and arranged to separate exhaust air from intake air drawn by equipment using side-to-side airflow such that operating temperatures of the equipment can be reduced. Reduced operating temperatures can increase the lifetime of the equipment and can reduce the frequency of overtemperature alarms on the equipment. An enclosure, and/or a rack housed within the enclosure, can be configured and arranged to separate exhaust air from intake air drawn by side-to-side airflow equipment to help to reduce intake air volume and to increase required minimum temperatures of cooling air supplied to the enclosure by a cooling unit or system. An increase in required minimum temperatures of cooling air helps to increase the operating efficiency of the cooling unit or system. Performance reliability and useful life of IT rack-mounted electronic equipment can be increased and overheating and equipment shutdown reduced in comparison to other cooling solutions.

An enclosure can provide an interior configured and arranged to effectively separate intake air drawn into the enclosure by equipment components for cooling and ventilating purposes from exhaust air vented by the components during operation. Separating cooling air from hot and warm exhaust air can help to prevent/minimize mixing of cooling air with exhaust air and thereby can help to prevent/minimize the extent that exhaust air circulates to equipment air intakes. As a result, insufficient cooling and overheating of equipment components during operation can be prevented/minimized. Separating cooling air from exhaust air can help to increase temperatures of exhaust return air to a cooling unit or system associated with a data center or network room, which can help to increase an operating efficiency of the cooling unit or system. An increase in temperatures of exhaust air can help to reduce the air volume that the cooling unit or system is required to deliver to the equipment. Separating cooling air from exhaust air can permit the cooling unit or system to supply cooling air at increased temperatures, while maintaining the same operating temperatures of the equipment. Increased temperatures of cooling air supplied to the equipment can further help to improve the efficiency of the cooling unit or system.

Existing standard IT racks and enclosures can be configured and arranged to provide both front-to-back airflow and side-to-side airflow configurations through various sections of racks without significant retrofitting and cost. Standard IT racks and enclosures can enhance the adaptability and the flexibility of data center and equipment room configurations if such racks and enclosures are configured to accept and to appropriately cool different types of electronic equipment simultaneously mounted within a single rack/enclosure means. IT racks and enclosures that can accommodate the operation requirements of different types of equipment, such as a mix of IT and telecommunications equipment can provide greater ease and flexibility in reconfiguring equipment and efficient use of data center and equipment room space.

BRIEF DESCRIPTION OF THE DRAWINGS

FIGS. 32B-32C are partial side views of one end of further embodiments of the baffle shown in FIG. 30;

FIG. 32D is a side view of the baffle shown in FIG. 30 including a brush grommet with one or more adjustable plates.

DETAILED DESCRIPTION OF PREFERRED EMBODIMENTS

Aspects of the invention include an equipment rack enclosure having an interior configured for facilitating defined airflow conditions within the enclosure to meet cooling and ventilating requirements of rack-mounted equipment where the enclosure interior is structured and/or arranged to permit front-to-back airflow, e.g., used by information technology (IT) equipment, and side-to-side airflow, e.g., used by certain types of telecommunications equipment. An exemplary enclosure includes at least a first air intake plenum defined in the enclosure interior and disposed to contain cooling air that is directed and/or diverted from a front-to-back airflow to permit air to flow side-to-side through one or more sections of a rack. Different embodiments of an enclosure according to the invention permit an enclosure interior to be configured or adapted to accommodate different dimensions, e.g., depths, of different types of electronic equipment, while permitting airflow to meet the cooling and ventilating requirements of the different types of equipment. Embodiments according to the invention permit an enclosure to simultaneously contain telecommunications equipment and IT equipment such that cooling and ventilating requirements of each type of equipment are met. Other embodiments are within the scope of the invention.

Figure 1:
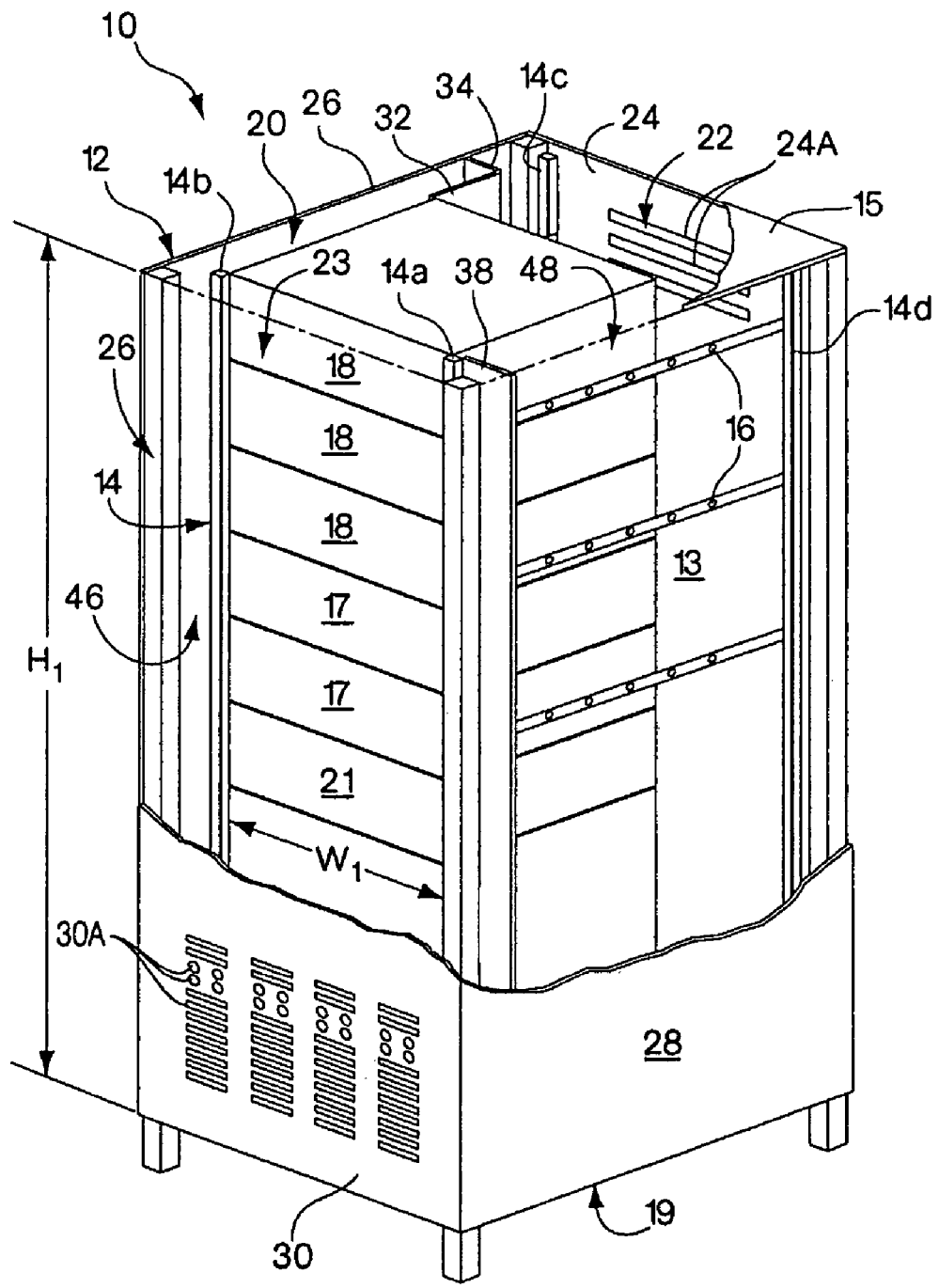
FIG. 1 is a cut-away perspective view of an equipment enclosure according to the invention.

Referring to FIG. 1, an equipment rack enclosure 10 includes an enclosed housing 12 and a rack 14. The housing 12 is configured and sized to define an interior 13 sufficient to contain or enclose the rack 14. In one embodiment, the housing is configured and sized to enclose the rack 14 in a substantially centered position. The housing 12 includes side panels 26 and 28 disposed on each side of the rack 14 to enclose the rack 14 and to define the housing 12. In one embodiment, the housing 12 further includes a vented rear panel 24 and a vented front panel or door 30. The front door 30 and the rear panel 24 of the housing 12 are configured and arranged to permit airflow through the rack 14. The door 30 is disposed to permit cooling air, e.g., ambient air of an equipment room or data center, to flow through multiple air vents 30A defined in the door 30 to the housing interior 13. The rear panel 24 is disposed to permit exhaust air to flow through multiple vents 24A defined in the rear panel 24 to an area external to the housing interior 13. In one embodiment, the housing further includes a top panel 15 and a bottom panel 19 that further define the housing 12.

In one embodiment, the rack 14 includes four vertical mounting rails 14a, 14b, 14c and 14d disposed to help to define a frame and an equipment area in which electronic equipment, e.g., information technology (IT) components 17 and/or telecommunications components 18, are disposed. The rack 14 can further include one or more horizontal mounting members 16 that extend from a front portion to a back portion of the housing 12 to help to define the equipment area and to mount the equipment 17 and 18. In another embodiment, the front mounting rails 14a and 14b of the rack 14 can be connected to front ends of one or more of the mounting members 16 and the back mounting rails 14c and 14d can be connected to back ends of the members 16 to help to define the rack 14 and the equipment area. One or more of the mounting rails 14a, 14b, 14c and 14d can be connected to one or more of the top panel 15, the bottom panel 19, the side panels 26 and 28, the front door 30 and the rear panel 24 to position and securely dispose the rack 14 within the housing interior 13.

The mounting rails 14a, 14b, 14c and 14d are disposed and configured such that the equipment components 17 and 18 are mounted thereto to dispose or rack-mount the equipment components 17 and 18 in the defined equipment area. In one embodiment, the front mounting rails 14a and 14b are configured to permit equipment, e.g., the IT components 17, to be mounted at a desired vertical height and depth in the rack 14, depending upon the U height, depth and other dimensions of the equipment. The mounting rails 14a, 14b, 14c and 14d can be disposed in the housing 12 such that the equipment components 17 are approximately centered when rack-mounted.

Embodiments of the enclosure 10 according to the invention can include the mounting rails 14a, 14b, 14c and 14d and/or the multiple mounting members 16 to rack-mount a mix of different types of equipment components, such as a mix of the IT and telecommunications components 17 and 18.

In one embodiment, the enclosure 10 is sized to enclose the rack 14 having a 19-inch width $W_1$ or a 23-inch width $W_1$. The rack 14 is configured to accept and to mount the equipment components 17 and 18 having a 19-inch width or a 23-inch width. In one embodiment, the rack 14 can have a 23-inch width $W_1$ and can be further configured to accept and to mount exclusively equipment having a 19-inch width, e.g., the IT components 17, or equipment having a 23-inch width, e.g., the telecommunications components 18. In another embodiment, the 23-inch rack 14 can be further configured to accept and to mount simultaneously a mix of equipment having either a 19-inch or a 23-inch width, e.g., a mix of the IT and the telecommunications components 17 and 18.

The enclosure 10 can have overall dimensions to house the rack 14 such that, for example, the space 46 along the left side of the rack 14 is sized to help to increase/optimize airflow along the left side of the rack 14, as described below in further detail. In different embodiments of the invention, the rack 14 can be moved from a center position within the enclosure 10 to increase one of the open spaces 46 and 48.

In one embodiment, the enclosure 10 can have overall dimensions to accommodate the rack 14 with a 23-inch width $W_1$. In this embodiment, the 23-inch enclosure 10 is sized to house the rack 14 having either a 19-inch or 23-inch $W_1$, thereby providing the enclosure 10 with flexibility and adaptability with respect to the types of equipment 17 and 18 it can contain at once. The enclosure 10 can have a width ranging from, but not limited to, about 24 inches to about 30 inches or more. The invention, however, is not limited to the enclosure 10 having specific overall dimensions, and, in particular, is not limited to a certain width and anticipates dimensions to accommodate different sizes and widths of the rack 14 and/or the equipment 17 and 18. The enclosure is sized and configured to accommodate the type and the distribution of the equipment components 17 and 18 mounted in the rack 14, and to help to increase/optimize airflow in the housing interior 13. Promoting and increasing airflow in the housing interior 13, e.g., along the left side of the rack 14, helps to configure side-to-side airflow conditions within the housing interior 13.

Figure 2:
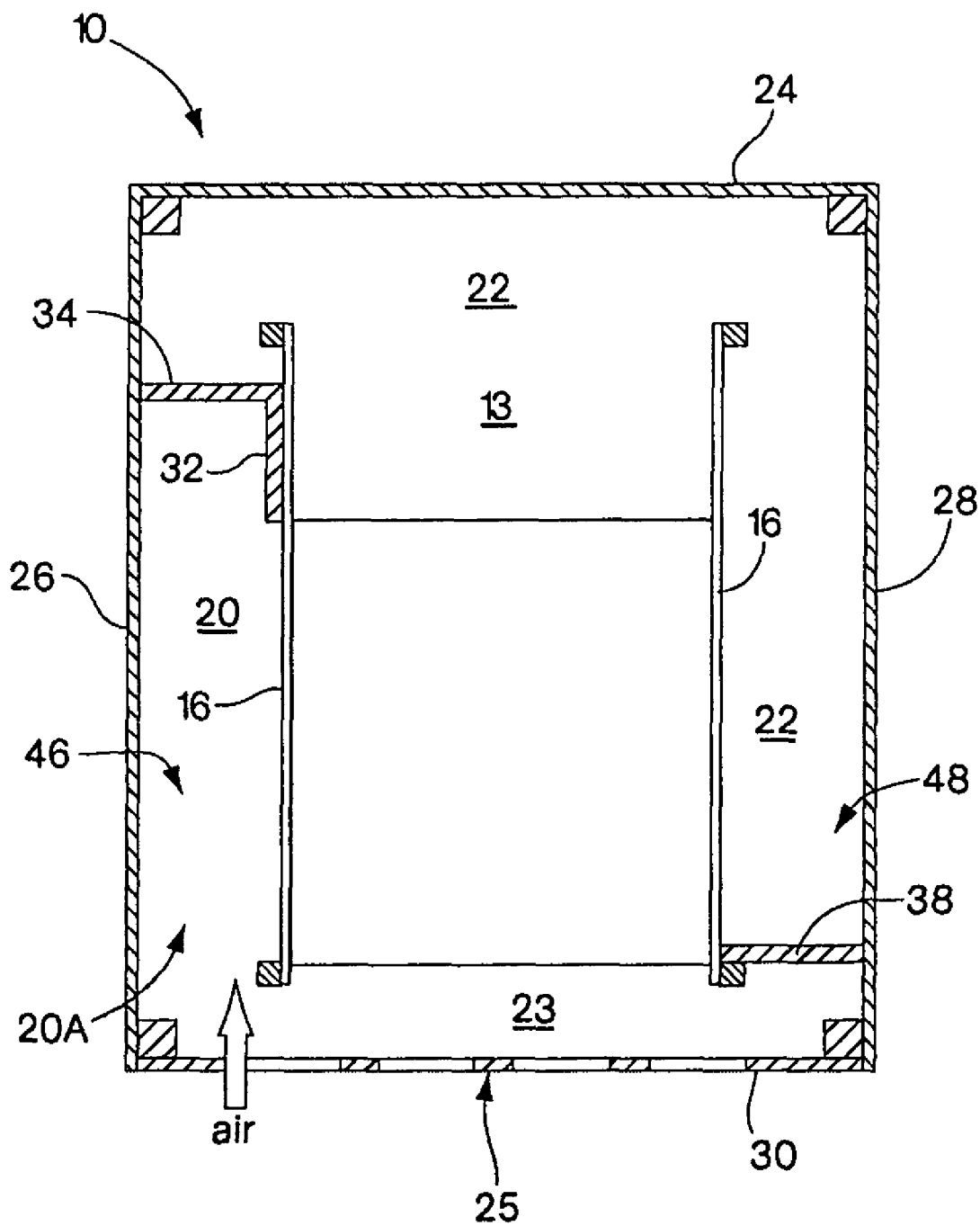
FIG. 2 is a top view cross section of the enclosure shown in FIG. 1 with a top panel removed.

Referring to FIG. 2 illustrating a top view cross-section of the enclosure 10, and with further reference to FIG. 1, in one embodiment, the housing interior 13 is configured to define at least a first air intake plenum 20 along a left side of the rack 14 in the open space 46 between the side panel 26 and the rack 14. The housing interior 13 is further configured to define a first exhaust air plenum 22 along a side and back portion of the enclosure 10. One or more barriers or partitions 32, 34 and 38 are configured and positioned in the spaces 46 and 48 between the side panels 26 and 28 and the rack 14 to help to define the first air intake plenum 20 and/or the exhaust plenum 22. The first air intake plenum 20, as described below in further detail, is a substantially enclosed configuration that is constructed and arranged along the left side of the rack 14 to receive and to contain cooling air from which equipment using side-to-side airflow for cooling may drawn from to meet its cooling and ventilating needs. The first intake plenum 20 defined within the housing interior 13 thereby helps to configure a side-to-side airflow used by the telecommunications equipment 18.

The one or more barriers or partitions 32, 34 and 38 are further configured and positioned to help to serve as a barrier or partition separating the first air intake plenum 20 from the exhaust plenum 22, and to thereby help to prevent circulation of exhaust air from the exhaust plenum 22 into the first air intake plenum 20. As will be described in further detail below, the partitions 32, 34 and 38 can be configured and arranged within the housing interior 13 to accommodate the different dimensions and, in particular, the different depths of the equipment 17 and 18 to achieve separation of cooling air from exhaust air. The top panel 15 and the bottom panel 19 of the housing 12 can further define the first intake plenum 20 and/or the exhaust plenum 22.

In one embodiment, the first intake plenum 20 is substantially enclosed having an open end 20A in fluid communication with a front portion of the housing interior 13 or an air intake side 25 of the rack 14. As shown in FIG. 2, the plenum 20 is disposed and configured to receive laterally directed and/or diverted flow of cooling intake air drawn into the housing 12 from the air vents 30A in the door 30 along the front portion of the housing interior 13 and/or the air intake side 25 of the rack 14. The first intake plenum 20 is further configured to contain sufficient cooling air from which air intakes of the equipment using side-to-side airflow, e.g., the telecommunications equipment 18, can draw from. In addition, the first intake plenum 20 can be further configured to limit air to flow in a side-by-side configuration through equipment in the rack 14 using side-to-side airflow.

The first intake plenum 20 is further disposed and configured to prevent/reduce air loss from the plenum 20 and to prevent/reduce airflow from the first intake plenum 20 to the exhaust plenum 22. The first intake plenum 20 helps to prevent/reduce exhaust air from circulating to the air intake side 25 and into the plenum 20. The plenum 20 and the top and bottom panels 15 and 19 can prevent airflow from a center, a top or a back portion of the rack 14 to the air intake side 25 and into the plenum 20. The plenum 20 is essentially disposed and configured or set up within the housing interior 13 to separate cooling intake air drawn into the front portion of the housing interior 13 from hot and warm exhaust air vented along the back portion of the rack 14. Separating cooling air from exhaust air prevents/minimizes the circulation of exhaust air to the air intake side 25 and the plenum 20, and prevents/minimizes mixing of cooling air with exhaust air during operation of the equipment 17 and 18.

In one embodiment, as shown in FIGS. 1-2, one or more partitions 32 and 34 are disposed on the left side of the rack 14 between the side panel 26 and one or more of the members 16 extending front-to-back along the left side of the rack 14 to define the first intake plenum 20. The one or more partitions 32 and 34 are disposed and configured to help to form a substantially airtight barrier between the first intake plenum 20 and the exhaust plenum 22 and to thereby help to separate cooling intake air within the plenum 20 from exhaust air vented to the exhaust plenum 22.

Figure 3:
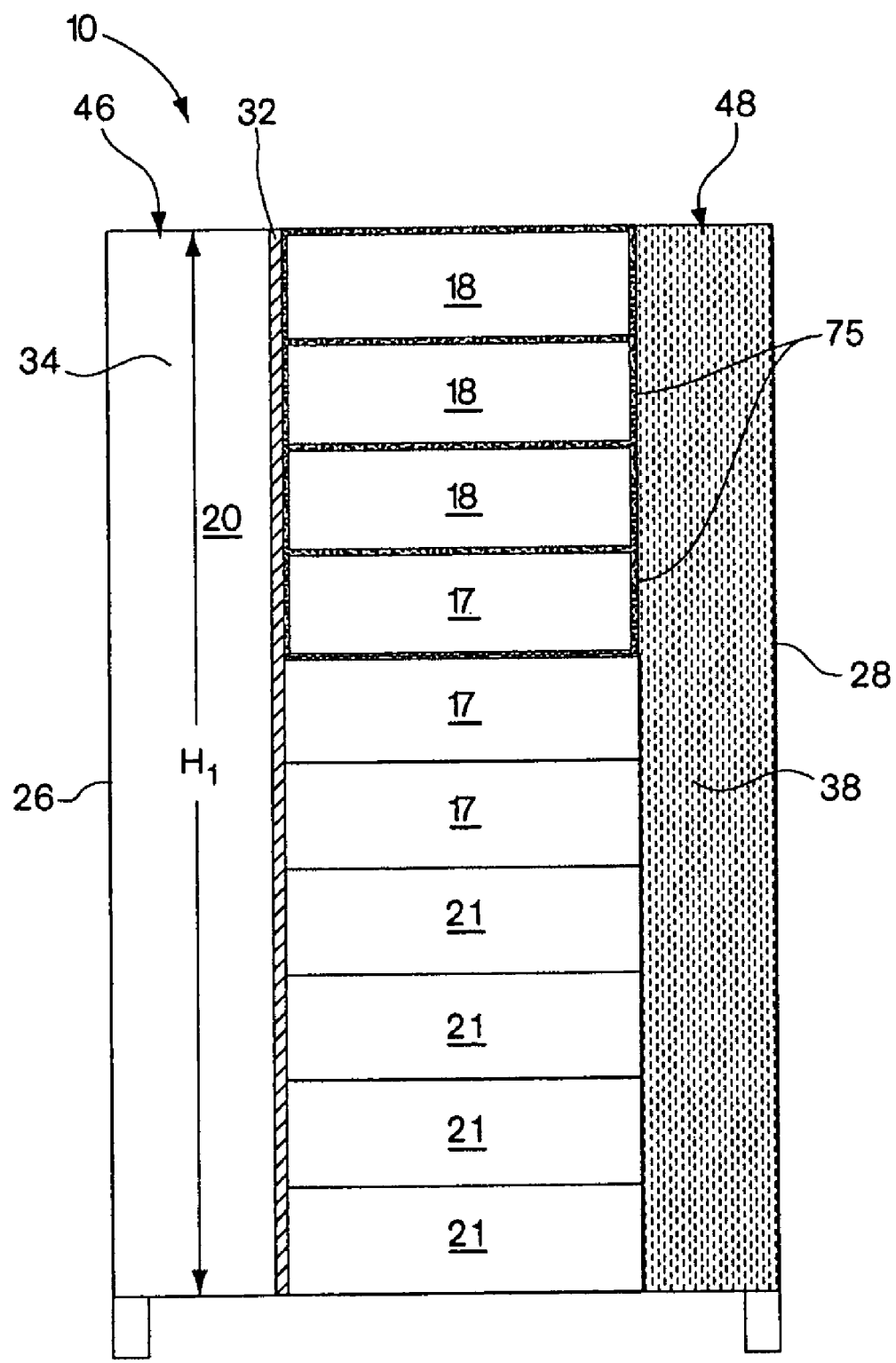
FIG. 3 is a front view of the enclosure shown in FIG. 1 with a front panel removed.

Referring to FIG. 3 illustrating a front view of the housing interior 13, and with further reference to FIGS. 1-2, in one embodiment, one partition 32 is disposed in a substantially parallel orientation to the left side panel 26 and the other partition 34 is disposed in a substantially perpendicular orientation to the left side panel 26. The partitions 32 and 34 can be joined or connected at an angle to help to define the first intake plenum 20. In one embodiment, the partition 32 disposed substantially parallel to the left side panel 26 extends vertically along at least a portion of the height $H_1$ of the rack 14, and the partition 34 disposed substantially perpendicular to the left side panel 26 similarly extends vertically along at least a portion of the rack height $H_1$ to define the first intake plenum 20.

In another embodiment, the partition 32 disposed substantially parallel to the left side panel 26 can be disposed and connected to the member 16 of the rack 14 such that the partition 32 extends from the member 16 to the left side panel 26 to help to define the first intake plenum 20, thereby eliminating the need for the partition 34.

Referring further to FIGS. 1-2, the partition 38 on the right side of the rack 14 is disposed and configured to help to define a front air intake plenum 23. The front air intake plenum 23 can include the front portion of the interior 13 of the housing 12 between the door 30 and the rack 14. The front air intake plenum 23 is configured and sized to receive air drawn into the front portion of the housing interior 13 from the vented front panel or door 30 along the air intake side 25 of the rack 14. The partition 38 is further configured to help to define the exhaust plenum 22. The partition 38 is disposed in a substantially perpendicular orientation to the right side panel 28 of the housing 12 and extends vertically along at least a portion of the height $H_1$ of the rack 14 and/or the housing interior 13. The partition 38 is further configured to form a substantially airtight barrier between the front intake plenum 23 and the exhaust plenum 22. The partition 38 thereby helps to prevent airflow from the front portion of the rack 14 to the exhaust plenum 22, and helps to prevent exhaust air from circulating to the first and the front intake plenums 20 and 23 and from mixing with cooling intake air contained therein. The right side partition 38, along with the partitions 32 and 34 on the left side of the rack 14, separate cooling intake air drawn into the housing interior 13 by the equipment 17 and 18 during operation from hot and warm exhaust air vented to the exhaust plenum 22.

Figure 4A:
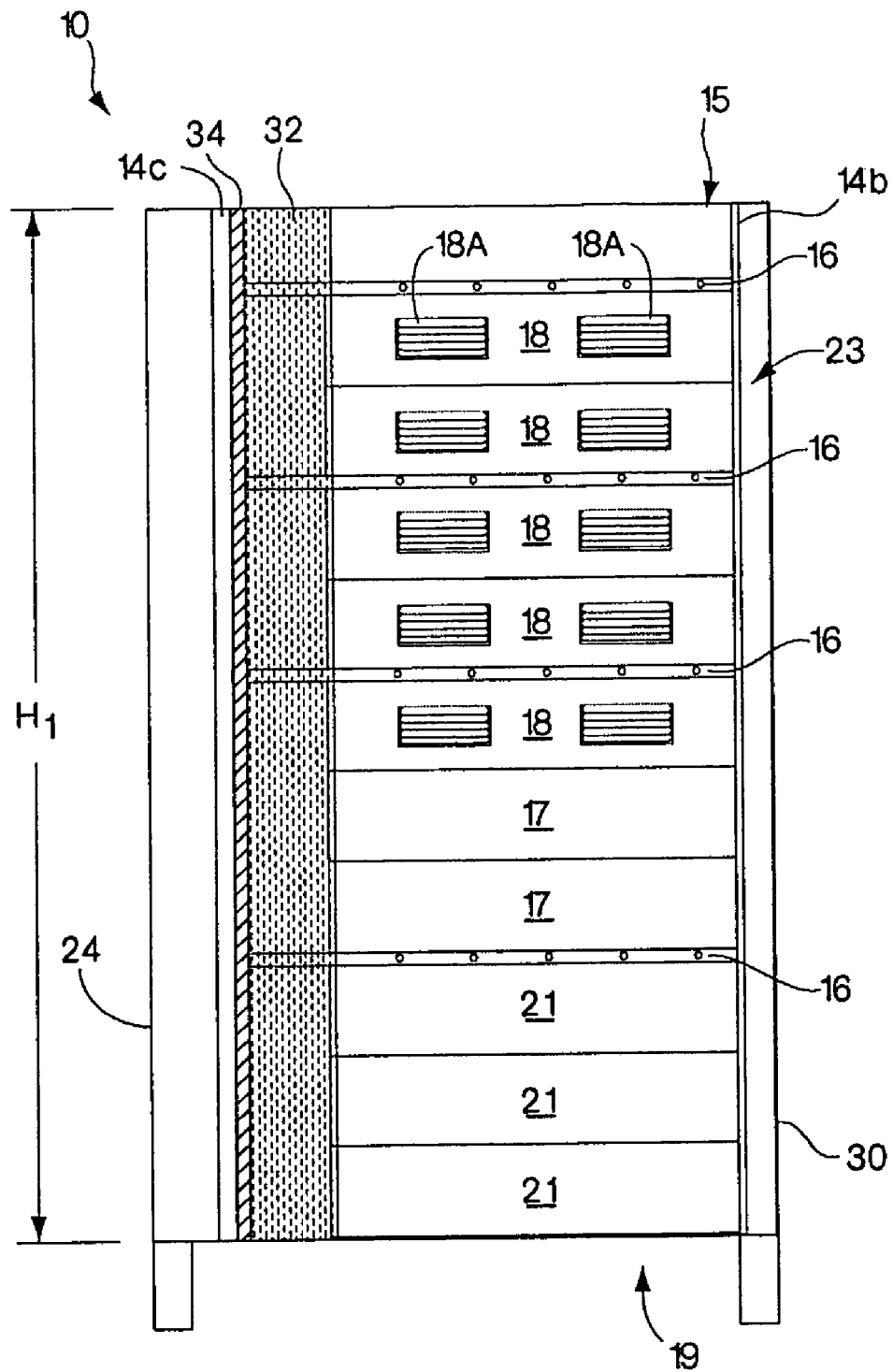
FIGS. 4A-4B are left side view cross sections of the enclosure shown in FIG. 1 with a left side panel removed.

Referring to FIG. 4A illustrating a left side view cross section of the enclosure 10, and with further reference to FIG. 3, in one embodiment, the partitions 32 and 34 extend vertically along substantially the entire height $H_1$ of the rack 14 and/or the housing interior 13 to help to define the first intake plenum 20 between the left side panel 26 and the equipment components 17 and 18.

Figure 4B:
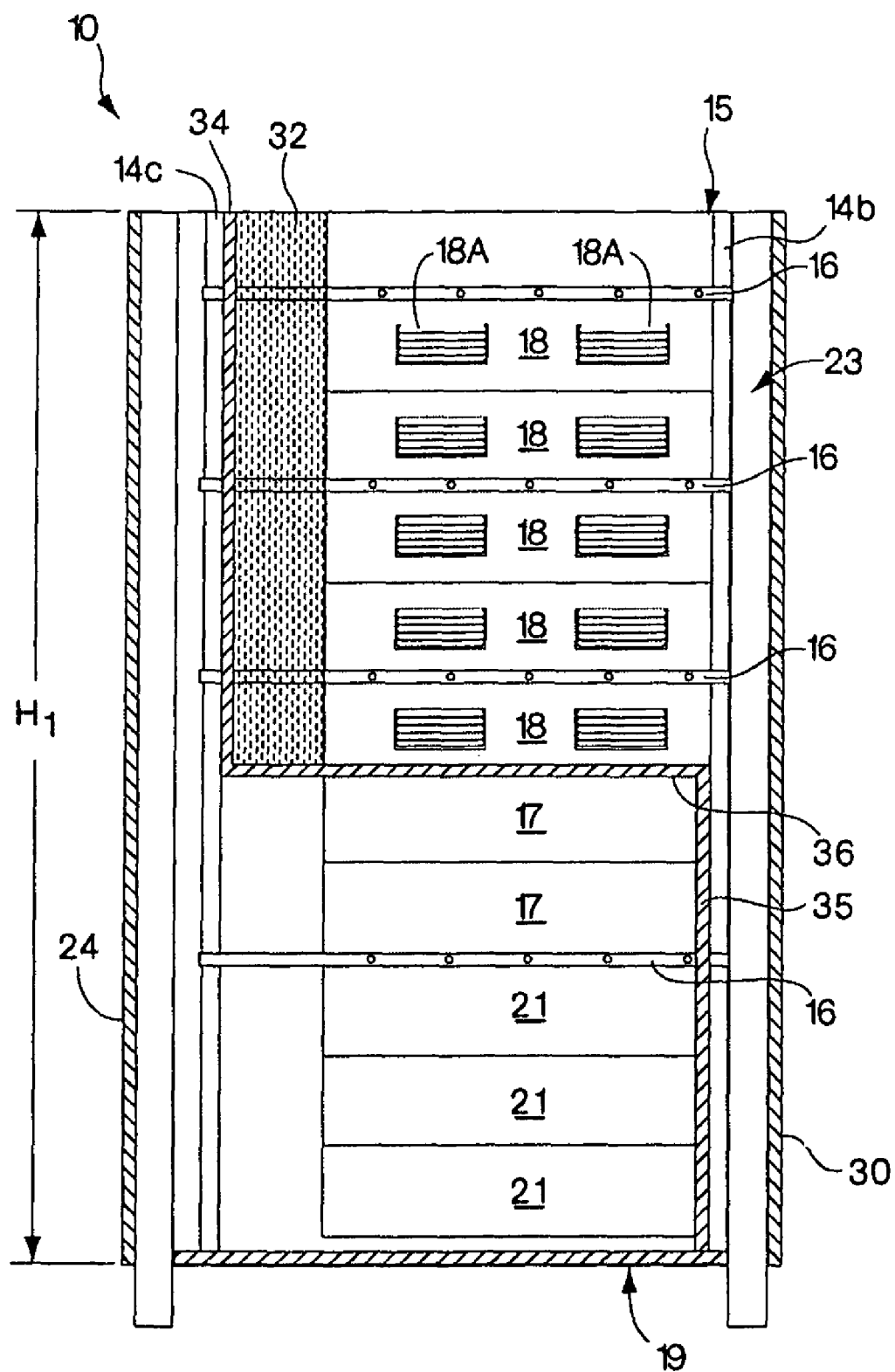

Referring to a left side view cross section illustrated in FIG. 4B, in another embodiment, each partition 32 and 34 extends vertically and equally with the other partition along only a portion of the height $H_1$ of the rack 14 and/or the housing interior 13 to the extent or the U heights of the telecommunications components 18 mounted vertically in the rack 14. In this case, a front partition 35 and a bottom partition 36 are disposed in the space 46 to help to define the first intake plenum 20 and to limit its configuration to the extent of the telecommunications components 18 in the rack 14. The front partition 35 is connected at a front side of the rack 14, e.g., either to the rack 14 or, if present, to a side or front portion of the member 16. The front partition 35 extends to the left side panel 26 of the housing 12 in a substantially perpendicular orientation to the panel 26 and downward along the $H_1$ of the rack 14 to the bottom panel 19. The front partition 35 is connected or joined to the bottom panel in an appropriate manner and by appropriate means, as described below in further detail. The bottom partition 36 extends from a front to a back portion of the rack 14 along the left side of the rack 14 in a substantially parallel orientation to the bottom panel 19. As shown in FIG. 4B, the front and the bottom partitions 35 and 36 intersect and are connected or joined in an appropriate manner and by appropriate means. In addition, the bottom partition 36 is joined or connected in an appropriate manner and by appropriate means to a portion, e.g., a bottom edge, of each of the partitions 32 and 34. The partitions 32, 34, 35 and 36 thereby help to define and to limit the plenum 20 to those sections of the equipment area of the rack 14 in which the telecommunications components 18 are mounted. The plenum 20 is essentially configured to receive cooling intake air drawn from the front portion of the housing interior 13 and/or the intake side 25 of the rack 14, and to contain cooling air to facilitate a side-to-side airflow condition the telecommunications components 18 use for cooling and ventilating.

Figure 5A:
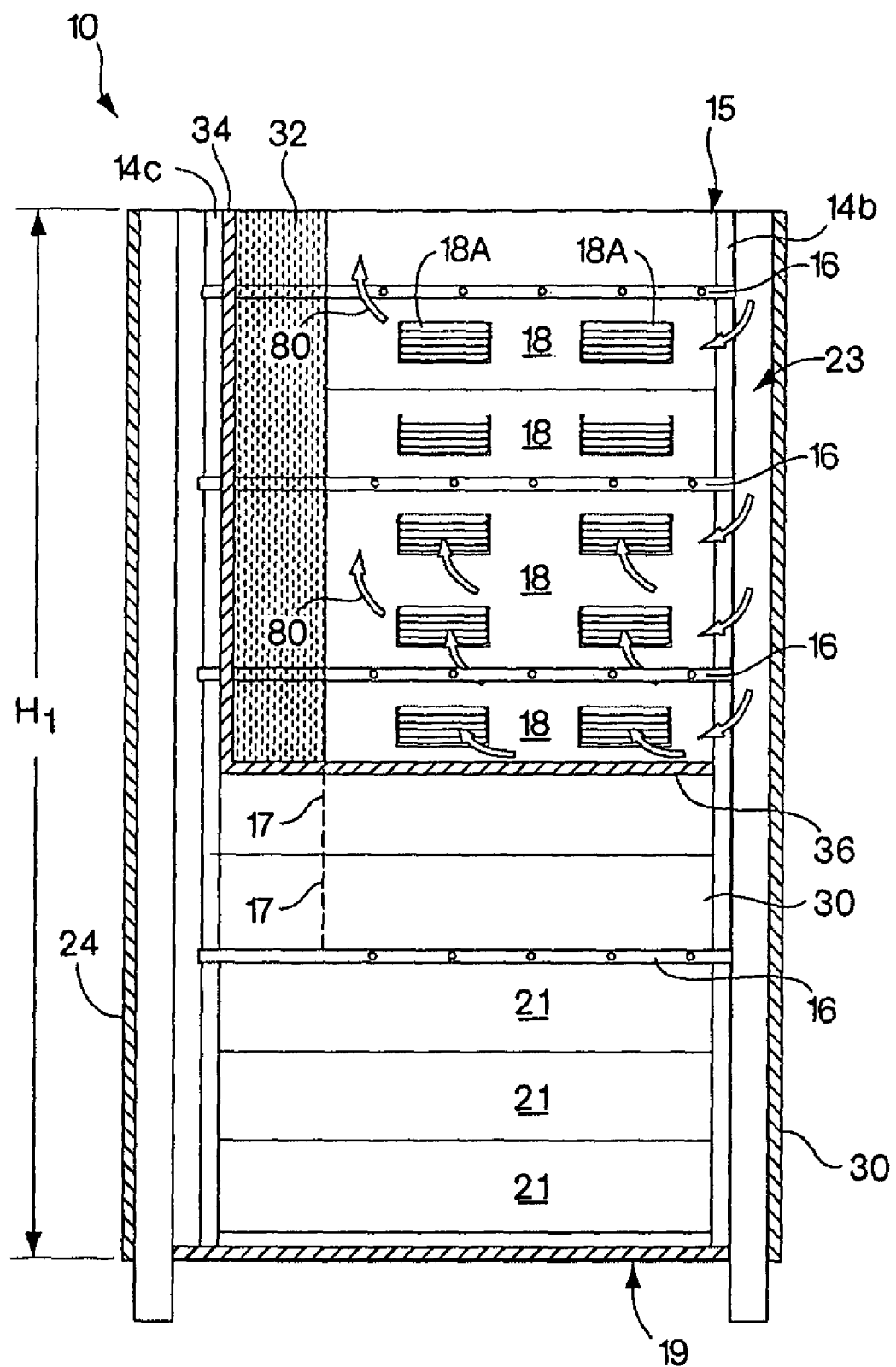
FIG. 5A is a left side view cross section of the enclosure shown in FIG. 1 with the left side panel removed.
Figure 5B:
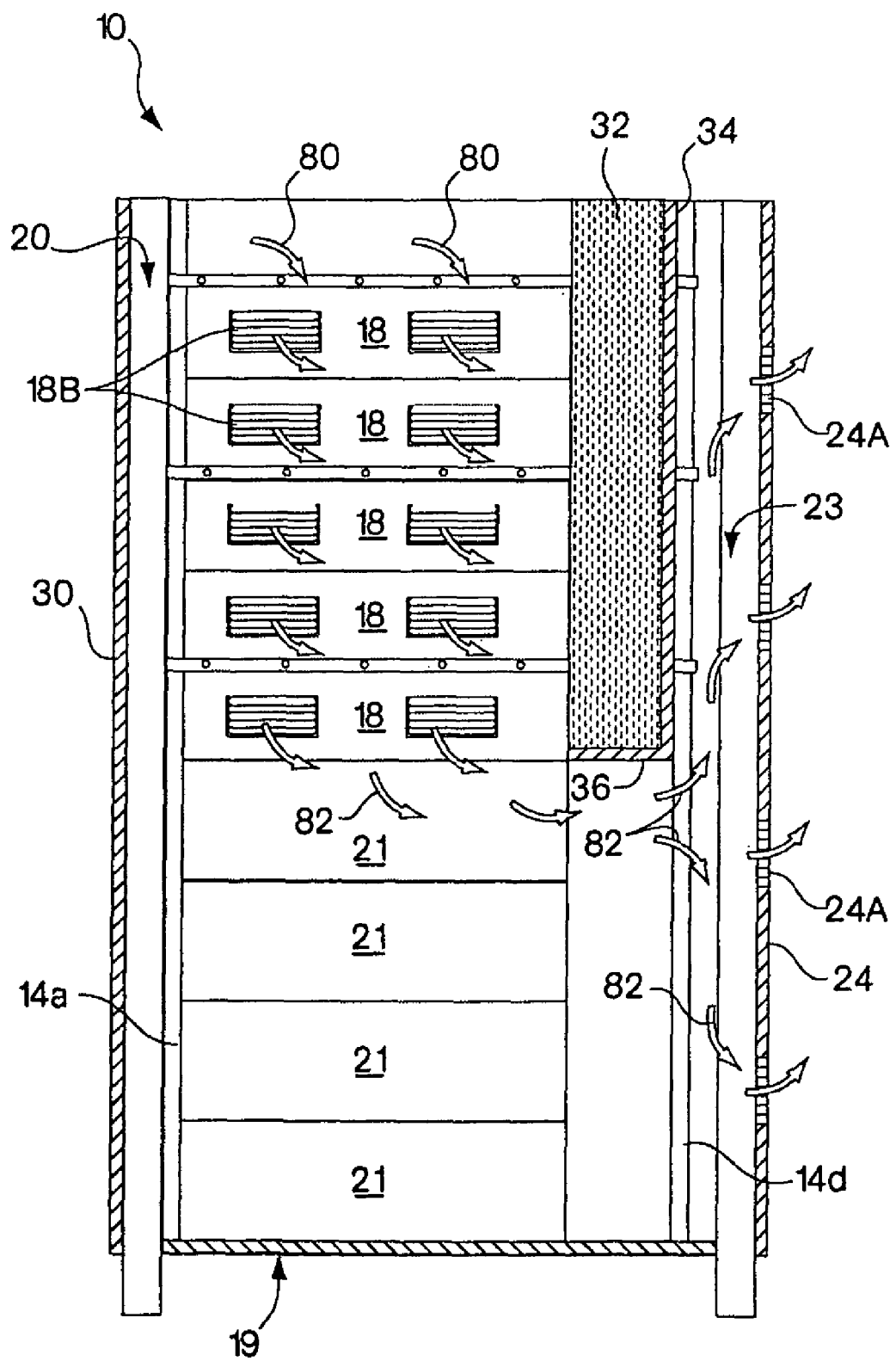
FIG. 5B is a right side view cross section of the enclosure shown in FIG. 1 with the right side panel removed.

Referring to FIGS. 5A-5B, and with further reference to FIGS. 4A-4B, in one embodiment, multiple blanking panels 21 can be mounted to one or more of the mounting rails 14a, 14b, 14c and 14d and/or the members 16 along each side or the front of the rack 14 to block sections of the equipment area that are vacant or include components that use front-to-back airflow, e.g., the IT components 17. The blanking panels 21 help to prevent air loss from the first and front intake plenums 20 and 23, from the rack 14, and/or from interfaces of the components 17 and 18 and surfaces of the rack 14. As shown in FIG. 5A, multiple blanking panels 21 can be mounted to the mounting rails 14b and 14c and/or one or more of the members 16 at sections of the rack 14 along its left side that include the components 17 and 18 or are vacant sections without equipment. The multiple blanking panels 21 cover the components 17 and the vacant sections to help to prevent/minimize air loss from the left side of the rack 14. As shown in FIG. 5B, illustrating a right side view cross section of the enclosure 10 and the exhaust side of the telecommunications components 18, multiple blanking panels 21 can be similarly mounted to the mounting rails 14a and 14d and/or the members 16 to cover the IT components 17 and the vacant sections of the rack 14 along the right side of the rack 14.

In one embodiment, use of the blanking panels 21 can help to permit air to flow upward over a top of the rack 14, as shown by arrows 80 in FIGS. 5A-5B, and to facilitate flow of hot and warm exhaust air vented from the exhaust vents 18B of the telecommunications components 18. Exhaust air within the exhaust plenum 23 can circulate, e.g., in upward and/or downward orientation, as shown by arrows 82 in FIG. 5B. The blanking panels 21 thereby help to facilitate circulation of air over the top of the rack 14 and within the exhaust plenum 23 before it is vented through the rear panel 24, which helps to lower air resistance within the housing interior 13.

Figure 6A:
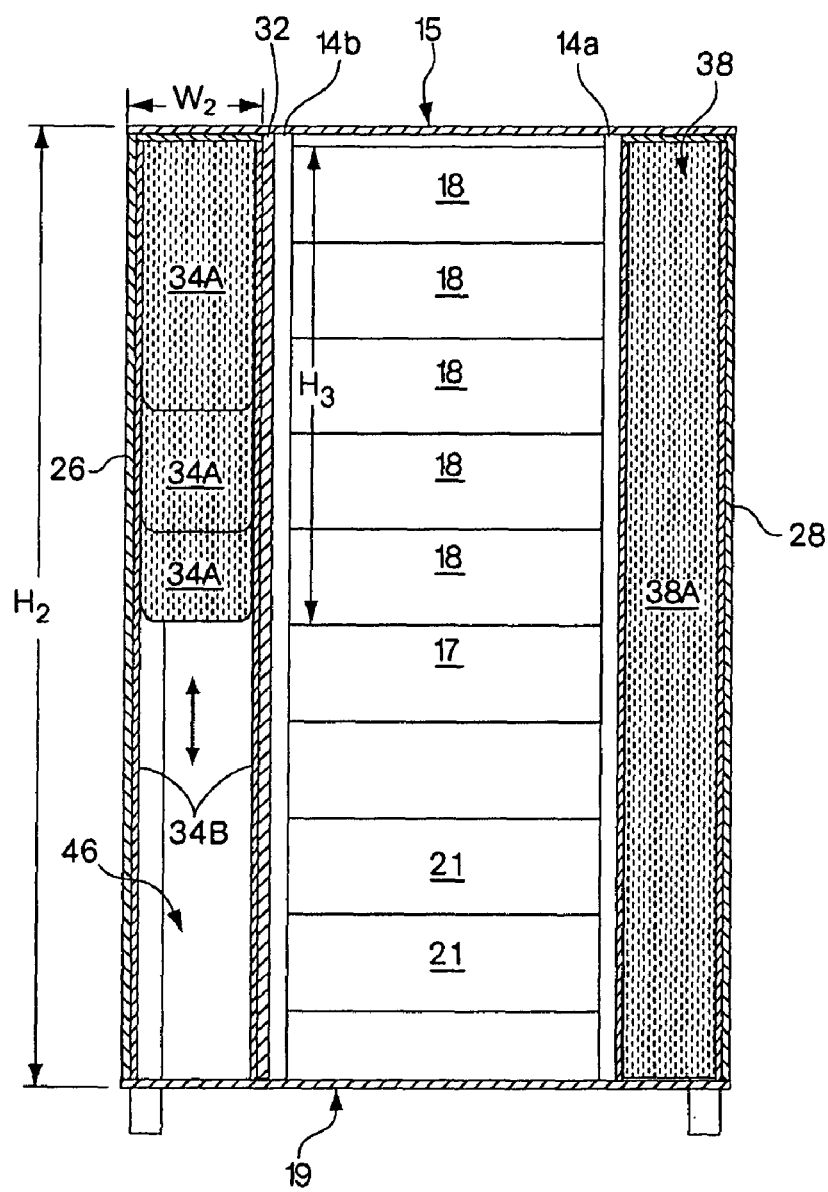
FIG. 6A is a front view of the enclosure shown in FIG. 1 with the front panel removed illustrating one embodiment of one or more partitions according to the invention.
Figure 6B:
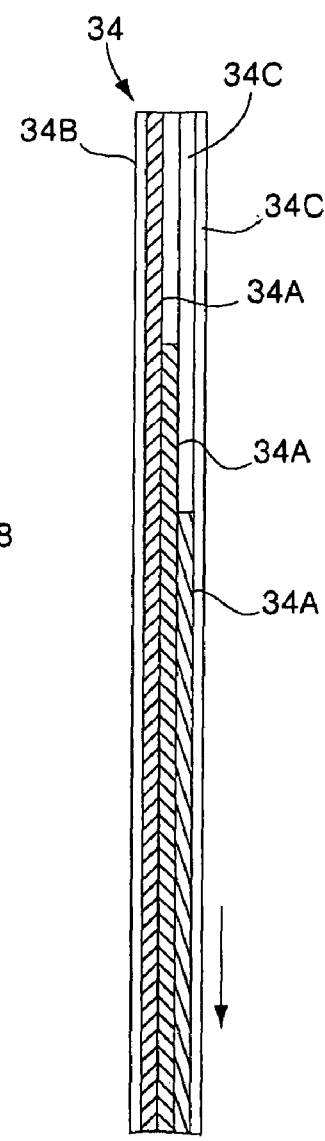
FIG. 6B is a side view cross section of a mounting frame shown in FIG. 6A.

Referring to FIGS. 6A-6B, in one embodiment, one or more of the partitions 32, 34, 35, 36 and 38 can be constructed with specific dimensions, e.g., height and width, to correspond to specific U heights and widths of one or more of the components 17 and 18. In another embodiment, the partitions 32, 34, 35, 36 and 38 can be configured and arranged as either a single partition or as two or more overlapping or stacked partitions. For example, as shown in FIG. 6A, the partition 34 positioned on the left side of the rack 14 can include two or more overlapping partitions 34a disposed within a mounting frame 34b. The mounting frame 34b can have appropriate dimensions, e.g., a height $H_2$ and a width $W_2$, such that the frame 34b can seat in the space 46 defined between the left side panel 26 and the rack 14. In one embodiment, the frame 34b can be constructed and arranged to be removably connected to one or more of the left side mounting rails 14b and 14c, one or more of the rack members 16, the top panel 15, the bottom panel 19 and the side panel 26 to securely position the frame 34b.

In another embodiment, the frame 34b can have dimensions and be constructed such that when the frame 34b is seated in the space 46, an outer perimeter of the frame 34b can bias against one or more of the rack members 16, the top panel 15, the bottom panel 19 and the side panel 26 to position the frame 34b within the housing interior 13.

As shown in FIG. 6B, a side view cross section of the mounting frame 34b is provided and illustrates that the partitions 34a can be slidably disposed in an overlapping arrangement within the frame 34b such that each partition 34a can slide across an adjacent partition 34b. In one embodiment, each of the partitions 34a is slidably mounted within a track or groove 34c defined vertically in an inner surface of the frame 34b. The partitions 34a can be pulled vertically along the height $H_2$ of the frame 34b in a downward/upward direction to extend or shorten the overlapping partitions 34a as needed.

As shown in FIG. 6A, the partitions 34a can be extended or shortened to define a height $H_3$ of the first intake plenum 20 such that the height $H_3$ of the plenum 20 can correspond to the location and the U height of, for example, the telecommunications components 18 in the rack 14. In one embodiment, the partitions 34b can be extended fully along the entire height $H_1$ of the rack 14 and/or the housing interior 13.

As noted above, one or more of the partitions 32, 34, 35, 36 and 38 can be constructed and arranged as a single partition. As shown in FIG. 6A, the partition 38 disposed on the right side of the rack 14, for example, can be a single partition 38a disposed in a mounting frame 38b. The mounting frame 38b is similar to the frame 34b disposed on the left side of the rack 14, and has appropriate dimensions such that the frame 38b can seat in the space 48 defined between the right side panel 28 and the rack 14. Like the frame 34b disposed on the left side of the rack 14, the frame 38b can be constructed and arranged to be removably connected by one or more of the above-described fasteners 44, or can have dimensions and be constructed to permit the frame 38b to bias against one or more of the rack members 16, the top panel 15, the bottom panel 19 and the side panel 26 when seated in the space 48.

Figure 7A:
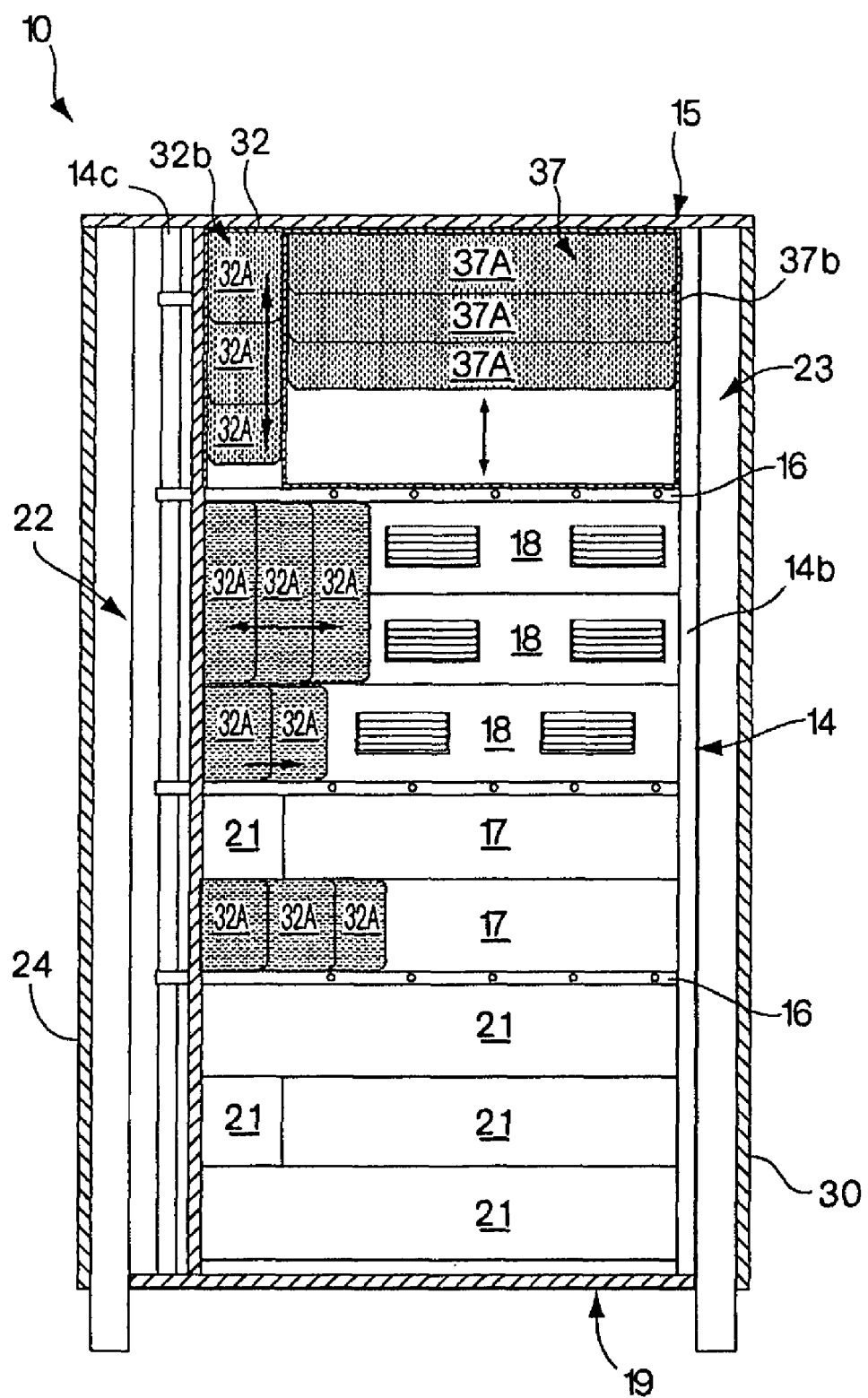
FIG. 7A is a left side view cross section of the enclosure shown in FIG. 1 with the left side panel removed illustrating embodiments of one or more partitions according to the invention.
Figure 7B:
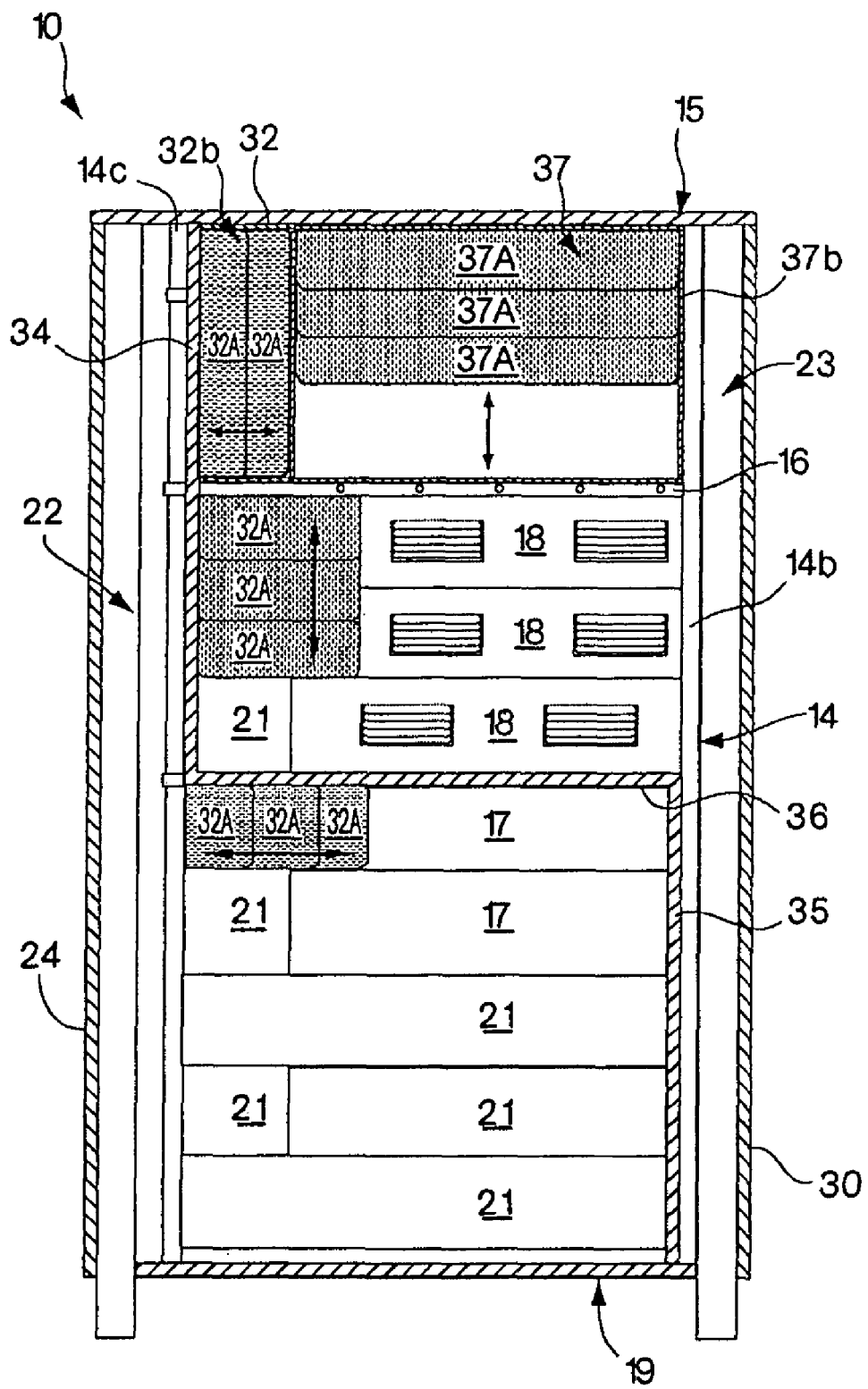
FIG. 7B is a left side view cross section of the enclosure shown in FIG. 1 with the left side panel removed illustrating embodiments of one or more partitions according to the invention.

Referring to FIGS. 7A-7B, in one embodiment, the partitions 32 and 34 and the blanking panels 21 can be configured and disposed along the left side of the rack 14 to accommodate different depths and U heights of the rack-mounted equipment components 17 and 18. As shown in FIGS. 7A-7B, the IT and telecommunications components 17 and 18 simultaneously mounted in the rack 14 can have different depths depending upon the type of the component 17 and 18. The partitions 32 and 34 and the blanking panels 21 can be constructed and arranged in different arrangements and configurations to accommodate space or area defined between the equipment components 17 and 18 and the left back mounting rail 14c or the other partition 34 that results from the different depths of the rack-mounted components 17 and 18. The partitions 32 and 34 and the blanking panels 21 can thereby help to define and configure the first intake plenum 20 along the left side of the rack 14 in response to changes of the mix of the equipment 17 and 18 in the rack 14.

As shown in FIGS. 7A-7B, in one embodiment, the partition 32 can be configured in one or more separate sections disposed along the left side of the rack 14 wherein a single section or two or more sections of the partition 32 define a height that corresponds to the U height of one or more components 17 and 18 and define a depth to accommodate the area between the components 17 and 18 and the partition 34 or the rail 14c. In one embodiment, one or more sections of the partition 32 can have a configuration and arrangement similar to the overlapping partitions 34a shown in FIG. 6A and include overlapping partitions 32a disposed in a mounting frame 32b. The mounting frame 32b holds the partitions 32a in an overlapping manner such that each partition 32a can slidably move over an adjacent partition 32a. The partitions 32a can be slidably moved upward/downward in a vertical direction to extend/reduce a length of the partition 32a, as shown in FIG. 7A, or can be slidably moved forward/backward in a horizontal direction to widen/narrow a width of the partition 32a, as shown in FIG. 7B. The mounting frame 32b can be sized and configured such that the frame 32b seats between the components 17 and 18 and the partition 34 or the left back mounting rail 14c. In another embodiment, the frame 32b can be removably joined or connected to the rail 14c, one or more of the mounting members 16, the partition 34 and/or the top or bottom panel 15 and 19.

Referring further to FIGS. 7A-7B, in different embodiments, the overlapping partitions 32a can be joined or connected removably and directly to the rail 14c, one or more of the members 16, the partition 34 and/or the top or bottom panel 15 and 19. In one embodiment, each partition 32a can be coupled to an adjacent partition 32a such that the partitions 32a are immobile. In another embodiment, each partition 32a can be slidably coupled to an adjacent partition 32a such that the partitions 32a can slide across or against each other in either an upward/downward orientation or a forward/backward orientation. Movement of the adjacent partitions 32a adjusts the height or the depth of the overlapping partitions 32a to accommodate the different depths and U heights of the components 17 and 18. As shown in FIGS. 7A-7B, each of the blanking panels 21 can have different lengths to accommodate the different depths of the equipment components 17 and 18. The partitions 32b and/or the multiple blanking panels help to define the first intake air plenum 20 and to form an airflow blocking barrier between the first intake plenum 20 and the exhaust plenum 22.

In a further embodiment, a blanking partition 37 can be incorporated along the left side of the rack 14, as shown in FIGS. 7A-7B. Like the multiple blanking panels 21, the partition 37 can help to block sections of the equipment area of the rack 14 that are vacant or include components that use front-to-back airflow, e.g., the IT components 17. The partition 37 can help to prevent air loss from the first and front intake plenums 20 and 23, from the rack 14, and/or from interfaces of the components 17 and surfaces of the rack 14. The partition 37 can include a set of overlapping partitions 37a disposed in a mounting frame 37b. The frame 37b can be similarly configured as the frame 34b shown in FIG. 6B. In one embodiment, the partitions 37a can be vertically moved upward/downward in to extend/reduce a length of the partitions 37a.

As shown in FIG. 7A, in one embodiment, the partition 34 extending perpendicular to the rack 14 can extend the height $H_1$ of the rack 14. The partition 32, the overlapping partitions 32a and the blanking panels, therefore, can be joined or connected in an appropriate manner by appropriate means, as described below in further detail. As shown in FIG. 7B, in another embodiment, the partition 34 can extend along the height $H_1$ of the rack 14 only to the extent of the U heights of the components 18 using side-to-side airflow. In this case, the partition 36 extending front-to-back along the left side of the rack 14 is joined or fastened to the partitions 32 and 34. The blanking panels and the overlapping partitions 32a are joined or connected to the left back mounting rail 14c in an appropriate manner by appropriate means to form an airflow blocking barrier.

Figure 8A:
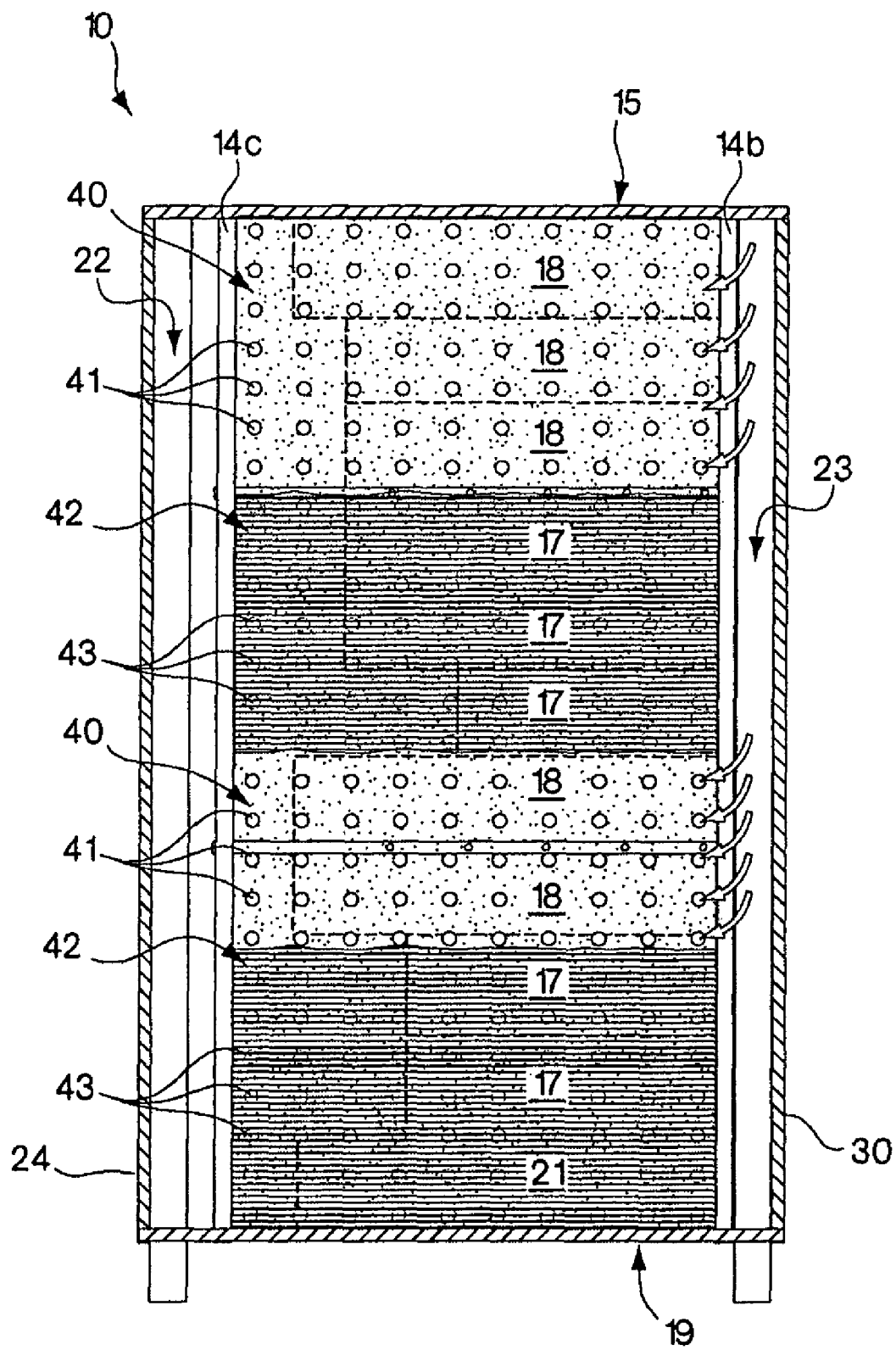
FIG. 8A is a left side view cross section of the enclosure shown in FIG. 1 with one embodiment of a partition according to the invention having multiple vents or holes.
Figure 8B:
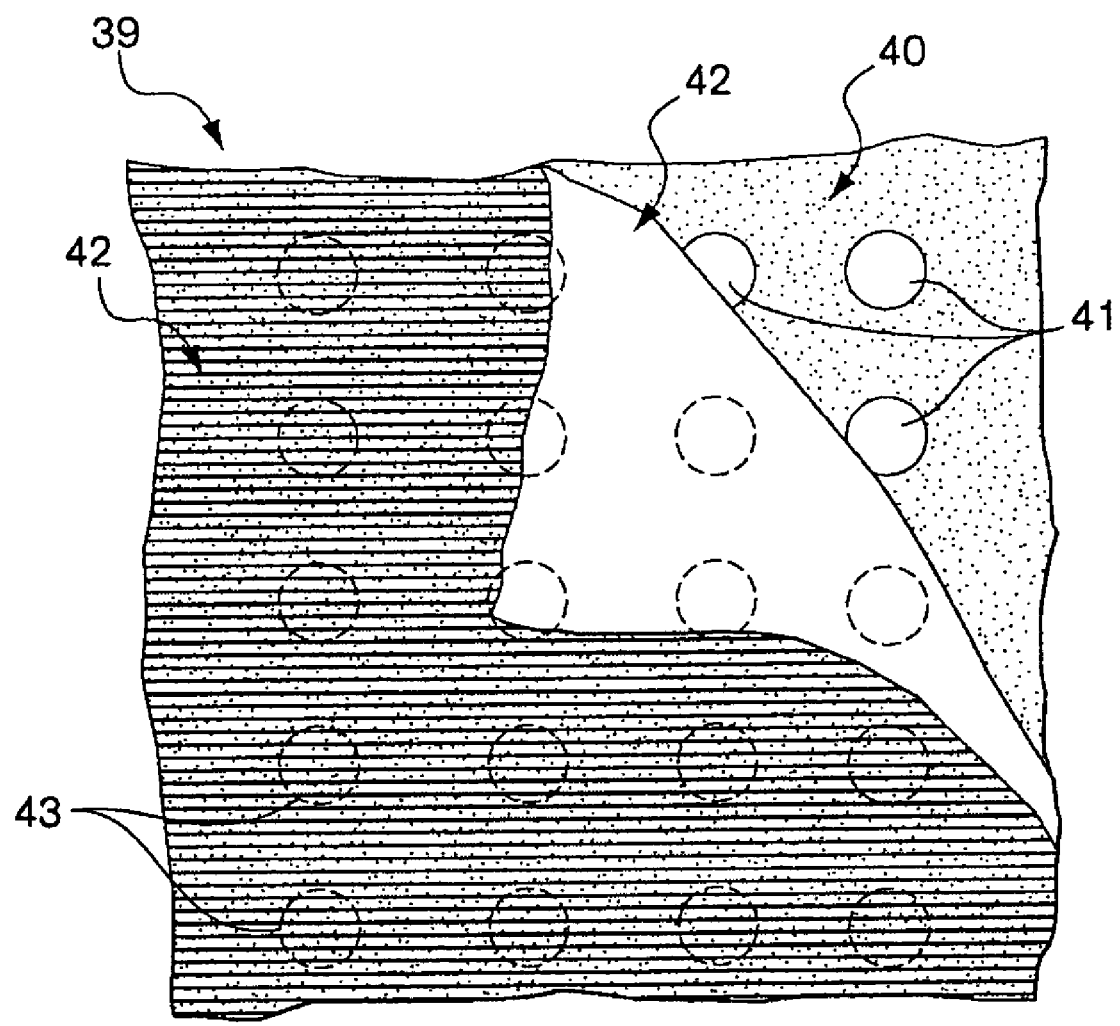
FIG. 8B is a cross-section perspective of a portion of the partition shown in FIG. 8A.

Referring to FIGS. 8A-8B, in one embodiment, a partition 39 is disposed along the left side of the rack 14. In one embodiment, the partition 39 can extend from the front mounting rail 14b to the back mounting rail 14c and substantially along the height $H_1$ the rack 14. In another embodiment, the partition 39 can extend along a portion of the height $H_1$ of the rack 14 to the extent or U heights of adjacent components using side-to-side airflow, e.g., the telecommunications equipment 18. In one embodiment, the partition 39 can be removably joined or connected to one or more of the rails 14b and 14c, the left side mounting members 16 and/or the top or bottom panel 15 and 19.

As shown in a front view of a portion of the partition 39 in FIG. 8B, the partition 39 is constructed of a single sheet of material 40, e.g., a heat resistant polyethylene, that defines multiple vents or openings 41 substantially across its height and width and has a removable covering or film 42, e.g. Mylar®, over its surface. In one embodiment, during installation, the partition 39 is coupled directly to the left side of the rack 14 adjacent to the equipment components 17 and 18. The removable covering or film 42 is slit or cut using an appropriate means, e.g., a cutting edge or knife, and thereafter removed or manually peeled from the surface of the material sheet 40. Removal of the covering 42 permits the multiple vents or openings 41 to be exposed and to thereby permit air to pass therethrough. When coupled to the left side of the rack 14, the multiple vents or openings 41 permit air to flow from the first intake plenum 20 into air intakes 18A disposed along the side of the components 18.

As shown in FIG. 8B, in one embodiment, the cover or film 42 can include printed markings or other indicia 43 to indicate the location of the components 18 using side-by-side airflow when the partition 39 is coupled to the rack 14. In one embodiment, the markings 43 can indicate the location of the air intake vents 18A of the components 18 such that the multiple vents or openings 43 exposed by removing the covering or film 42 will correspond and/or substantially align with the intake vents 18A when the partition 39 is coupled to the rack 14. The multiple vents or openings 43 can help to optimize/increase airflow from the first intake plenum 20 into the intake vents 18A and through the components 18 to configure side-to-side airflow.

In one embodiment, only a portion of the covering or film 42 is removed from the sheet material 40 to the extent of the distribution/location and/or the U heights of the components 18 mounted in the rack 14 using side-by-side airflow. Depending upon the distribution/location of the components 18 and the mix of the rack-mounted IT and telecommunications equipment 17 and 18, the partition 39 can either extend the entire height $H_1$ of the rack 14, or can be limited and extend only along a portion of the rack 14 containing the components 18 using side-to-side airflow. After installation of the partition 39 and the cutting and removal of the covering or film 42, the partition 39 can be adjusted to meet a reconfiguration of the rack 14 and a different mix or distribution of equipment 17 and 18 by placing a removable seal, e.g., tape, labels or Mylar® tabs, over one or more of the multiple vents or openings 43 to accommodate changes in airflow requirements. The multiple vents or openings 41 that no longer correspond to the air intake vents 18A of the components are thereby covered to help to prevent/minimize air loss.

Figure 8C:
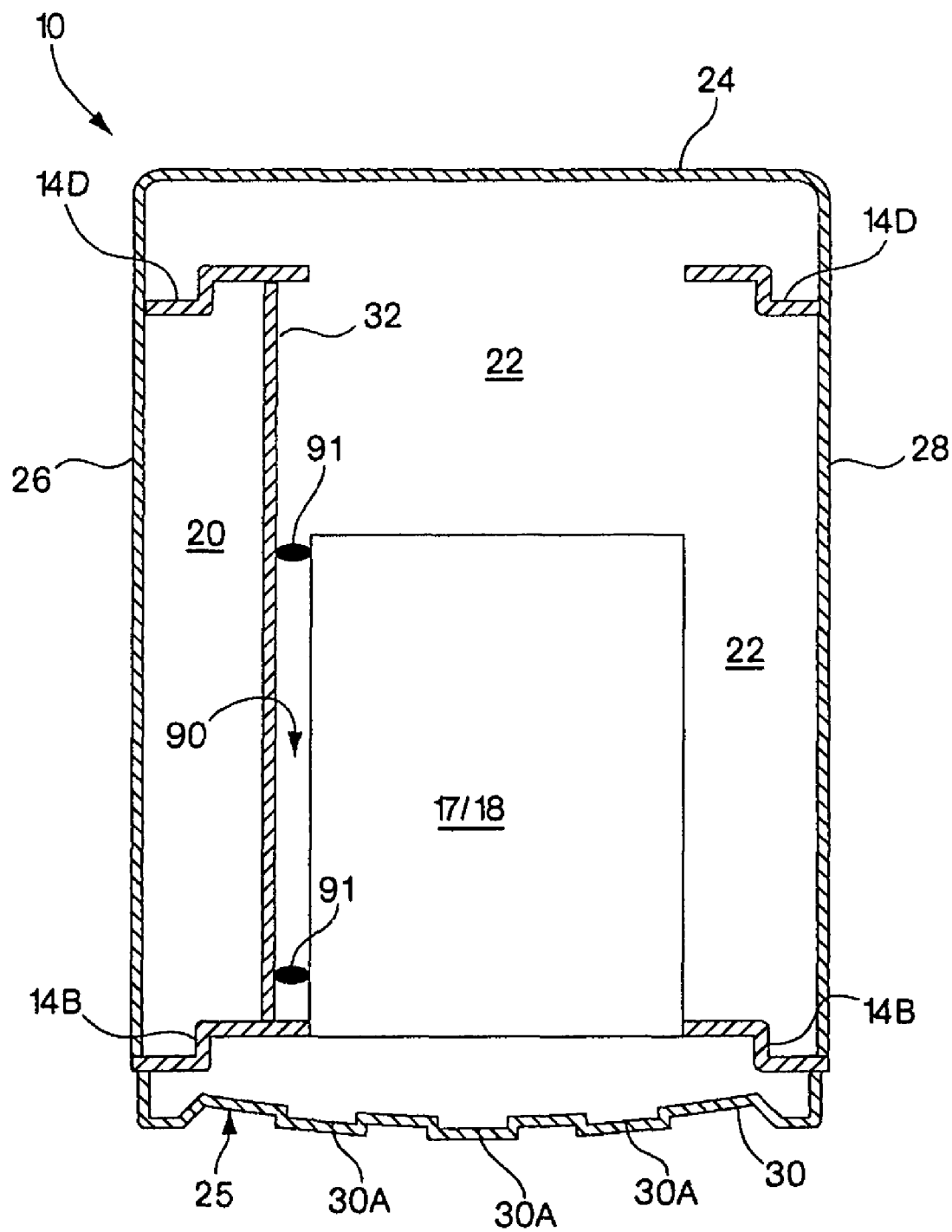
FIG. 8C is a top view cross section of the enclosure shown in FIG. 1 with the top panel removed illustrating one embodiment of the partition shown in FIG. 8A.

Referring to FIG. 8C, the partition 39 can extend from the left front mounting rail 14b to the left back mounting rail 14c.

In one embodiment, the left front and back mounting rails 14*b* and 14*c* help to define the first intake plenum 20. As described below in further detail, in different embodiments, the rack 14 can have a relatively wide width W₁, e.g., 23-inches, and the enclosure 10 can be sized such that the left front mounting rail 14*c* substantially fills the space 46 between the left front mounting rail 14*b* and the side panel 26, and the left back mounting rail 14*c* substantially fills the space 46 between the left back mounting rail 14*c* and the side panel 26. The partition 39 is removably joined or connected to the left front and back mounting rails 14*b* and 14*c* to help to define the first intake plenum 20.

As shown in FIG. 8C, the partition 39 is spaced from the left side of the rack 14 and the equipment 17 and 18 such that the partition 39 and the rack 14 and the equipment 17 and 18 define an area 90 sufficient to permit movement of one or more of the components 17 and 18 from the rack 14. In one embodiment, one or more of the components 17 and 18 is configured to slidably mount to the rack 14 such that, when desired, the one or more components 17 and 18 can slide horizontally outward from the rack 14 toward the front portion of the housing 12. The one or more components 17 and 18 can thereby be slidably removed in a drawer-like manner from the rack 14, with or without removal from the rack 14, to permit inspection, repair and/or replacement of the components 17 and 18.

In one embodiment, one or more brush grommets 91 are disposed in the area 90 between the rack 14 and the partition 39 to permit horizontal movement or a sliding motion of the components 17 and 18 forward/backward along the rack 14, while serving as air blocking barriers to prevent air loss from the area 90. The one or more brush grommets 91 are further configured to prevent mixing of exhaust air circulating in the exhaust plenum 22 with cooling intake air contained in the first intake plenum 20. In another embodiment, one or more gaskets or brush grommets can be disposed between the rack 14 and the partition 39 along that portion of the partition 39 from which the covering or film 42 has been removed. The one or more gaskets or brush grommets can be disposed along a perimeter of an area of the partition 39 defined by removal of the covering or film 42. The one or more gaskets or brush grommets can be disposed and configured help to form a seal between the rack 14, the equipment 17 and 18 and the partition 39 such that air loss is prevented/minimized.

Figure 9:
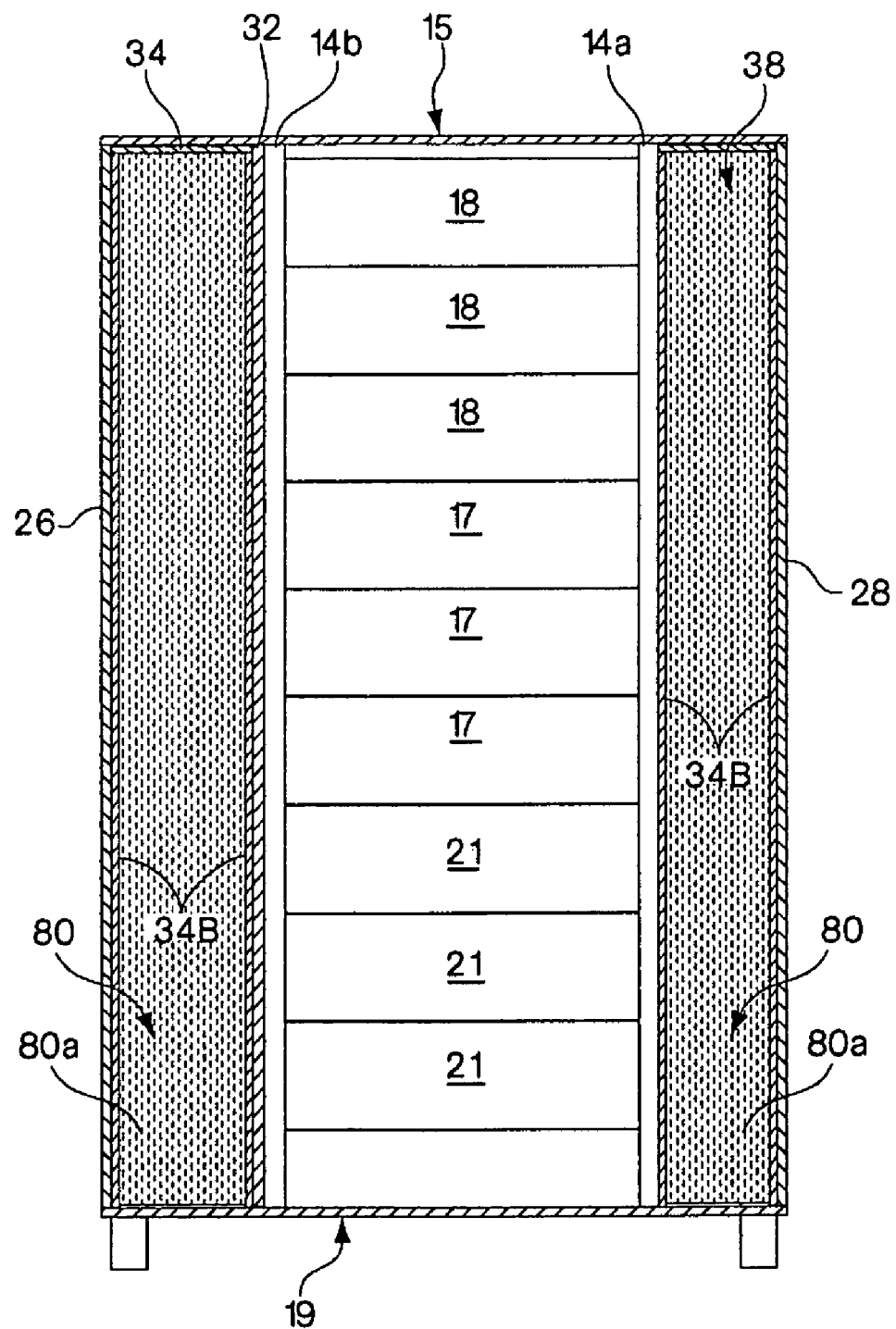
FIG. 9 is a front view of the enclosure shown in FIG. 1 with the front door removed illustrating another embodiment of one or more partitions according to the invention.

Referring to FIG. 9, in one embodiment, one or more of the partitions 32, 34, 35, 36 and 37 can be constructed and arranged as a gasket or brush grommet 80. In one embodiment, the gasket or brush grommet 80 can include the mounting frame 32*b*, 34*b*, 37*b* or 38*b*, as described above, such that the gasket or bros grommet 80 is disposed in the housing interior 13 in a desired position adjacent to the rack 14. The gasket or brush grommets or partitions 32, 34, 35, 36, 37 and 38 help to define the first intake plenum 20, the exhaust plenum 22 and the front intake plenum 23. The gasket or brush grommets or partitions 32, 34, 35, 36, 37 and 38 are constructed and arrange to permit one or more power or data cables and/or other connectors to be inserted into the gasket or brush portion 80A and threaded therethrough to route the cables and connectors through the rack 14 and along the left and/or the right side of the housing interior 13 to provide for cabling and power requirements. The gasket and brush grommets or partitions 32, 34, 35, 36, 37 and 38 are configured to permit cabling and to help to block/minimize airflow from the first and the front intake plenum 20 and 23 into the exhaust plenum 22, prevent/minimize circulation of exhaust air to intakes of the equipment components 17 and 18 and prevent/minimize mixing of cooling air with exhaust air.

Figure 10A:
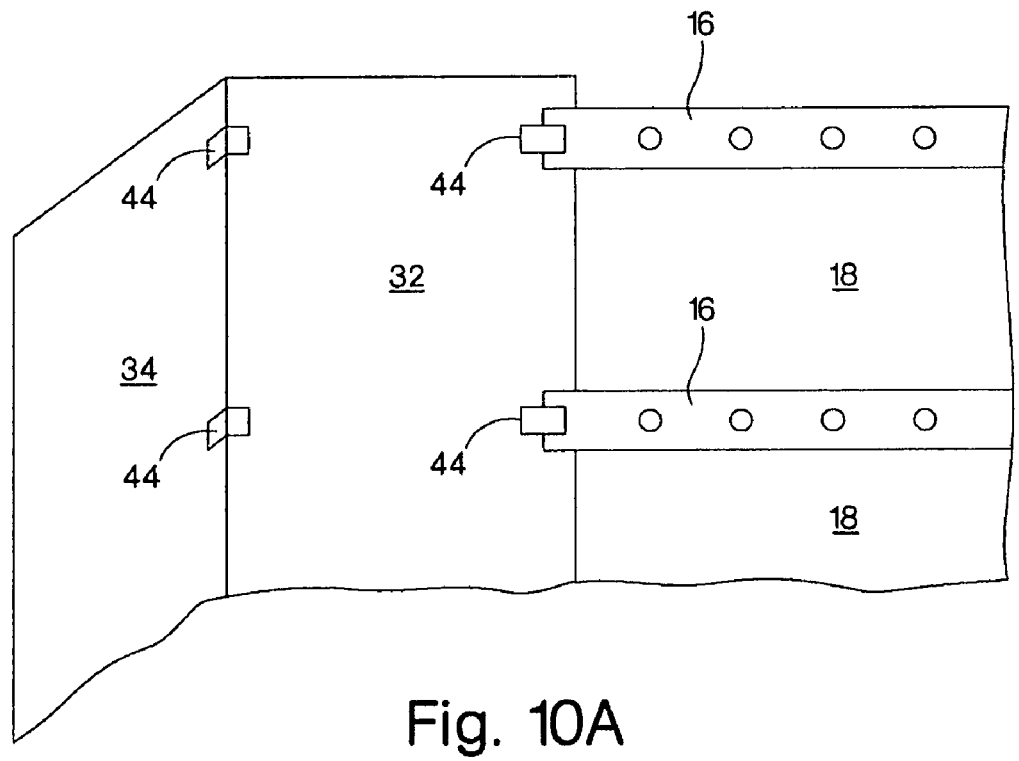
FIGS. 10A-10B are cut-away perspective views of portions of one or more partitions within the enclosure shown in FIG. 1 according to the invention.
Figure 10B:
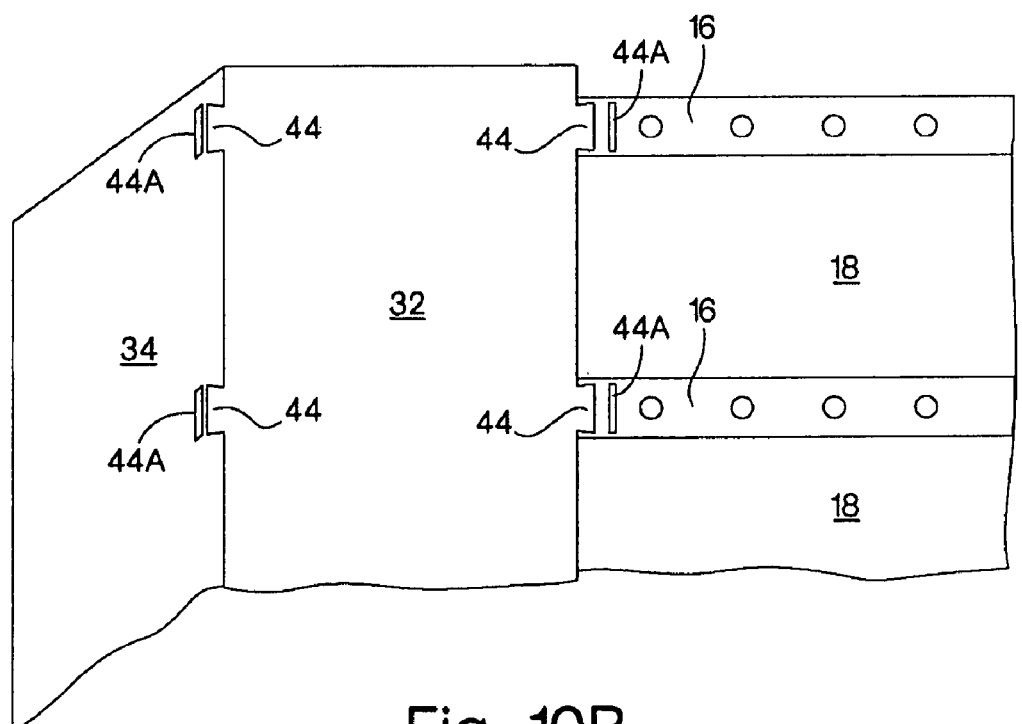

Referring to FIGS. 10A-10B, in one embodiment, one or more of the partitions 32, 34, 35, 36 and 38 can be removably joined or connected by one or more appropriate fasteners 44 to one or more of the members 16, the top panel 15, the bottom panel 19, the side panels 26 and 28 and the rear panel 24 to securely dispose the partitions 32, 34, 35, 36 and 38 in a desired position within the housing interior 13. Appropriate fasteners 44 are preferably constructed and arranged to permit quick connection to and removal from, e.g., the members 16, to enable the housing interior 13 to be easily configured in response to different types, sizes and U heights of the IT and telecommunications components 17 and 18, as well as to configure the interior 13 to accommodate airflow conditions and the distribution of the components 17 and 18 within the rack 14.

Preferred fasteners 44 can include, but are not limited to, screws, tabs, snap tabs, VELCRO® strips, and the like, which permit the partitions 32, 34, 36 and 38 to be readily removed and/or repositioned. An appropriate fastener 44 would depend on a material with which one or more of the partitions 32, 34, 36, and 38 is constructed as well as the size of the partition 32, 34, 36, and 38. For example, as show in FIG. 6A, in one embodiment, the partition 32 along the left side of the rack 14 can be removably connected to one or more of the members 16 by means of a metal snap or VELCRO® strip-like fastener 44, wherein an edge of the partition 32 butts an end or overlaps with the end of a member 16 and is connected thereto by the fastener 44. Similarly, the partition 32 can be removably connected to the adjacent partition 34 by similar means to help to define the first intake plenum 20.

As shown in FIG. 10A, in one embodiment, the partition 32 can be configured to include along a side edge one or more tabs 44 disposed and configured to be removably inserted into corresponding slots 44A defined in one or more of the members 16 to removably fasten or connect the partition 32 to the rack. The partition 32 can be further configured to include the tabs 44 on its opposite side to connect to the adjacent partition 34 to define the first intake plenum 20. In another embodiment, the partitions 32 and 34 can be formed from a single partition, wherein the single partition is constructed as a single plane and folded or bent to form the partitions 32 and 34 along the left side of the rack 14.

The partitions 32, 34, 35, 36, 37 and 38 can be constructed of a material suitable for use in an electronics environment. A material that is relatively lightweight to permit easy handling and portability, while sufficiently rigid to help to block/minimize airflow is suitable. A suitable material is relatively inexpensive such that in certain embodiments the partitions 32, 34, 35, 36, 37 and 38 can be economically constructed and, if desired, disposable. A material with which the partitions 32, 34, 35, 36, 37 and 38 can be constructed can be dependent upon the size and the position of the partitions 32, 34, 35, 36, 37 and 38 within the housing interior 13. In addition, a material of construction can be dependent on the extent and frequency with which the housing interior 13 will be reconfigured to accommodate the cooling and ventilating needs of the equipment 17 and 18. Such a material can include, but is not limited to, polypropylene or other thermoplastic plastics, aluminum sheeting, reinforced metal foil, reinforced plastic film, and combinations thereof.

The invention is not limited to the construction and arrangement of the partitions 32, 34, 35, 36, 37 and 38, and the blanking panels 21 as described above, and includes other barriers and/or partitions as well as other configurations and arrangements of the partitions 32, 34, 35, 36, 37 and 38 to help to define the first and/or the front intake plenums 20 and 22 and the exhaust plenum 23, as well as to help to configure or set up the housing interior 13 to facilitate front-to-back airflow and/or side-to-side airflow as needed. In particular, the invention includes various configurations and arrangements of barriers and/or partitions to accommodate the rack 14 containing exclusively IT or telecommunications components 17 and 18, or a mix of IT and telecommunications components 17 and 18 and to provide airflow to meet the cooling and ventilating requirements of each type of equipment 17 and 18.

Other features of the enclosure 10 according to the invention help to facilitate airflow within the housing interior 13 to achieve a front-to-back airflow configuration and/or a side-to-side airflow configuration. As noted above, the vented door 30 defines the multiple air vents 30A to permit air, e.g., ambient air, to flow into the front portion of the housing interior 13 and/or the air intake side 25 of the rack 14. In one embodiment, the door 30 can be sufficiently perforated, e.g., the multiple air vents 30A are concentrated along the left side of the door 30, to promote airflow into the first intake plenum 20. As shown in FIG. 3, in one embodiment, one or more gaskets 75, e.g., foam gaskets, can be disposed around perimeter edges of the equipment components 17 and 18 to help to provide a substantially airtight seal between the components 17 and 18 and the members 16 and between adjacent components 17 and 18 to help to prevent/minimize loss of cooling air from the first and front intake plenums 20 and 23.

Figure 11:
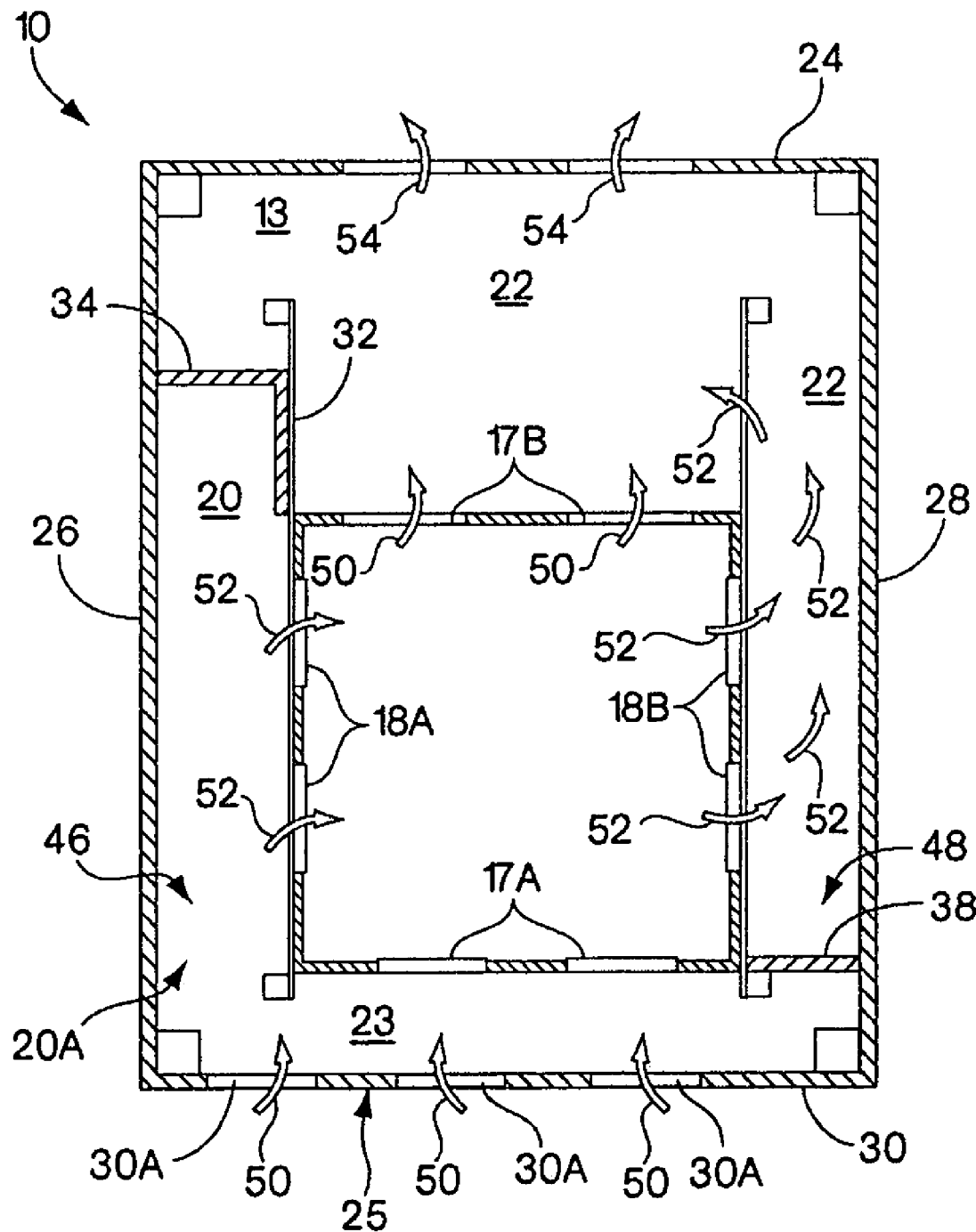
FIG. 11 is a top view cross section of the enclosure shown in FIG. 1 illustrating a first mode of airflow according to the invention.

Referring to FIG. 11, a top view cross-section of the enclosure 10 illustrates a first mode of airflow through the enclosure 10 that can be achieved where the front intake plenum 23 is in fluid communication with the first intake plenum 20. The first intake plenum 20 receives at least a portion of airflow directed and/or diverted laterally from the front intake plenum 23, as shown by arrow 51 in FIG. 11. To define a front-to-back airflow condition, cooling air is drawn from the vents 30A in the door 30 into the front intake plenum 23 by air intakes 17A disposed in front portions of the IT components 17. The air intakes 17A draw air into the front portions of the components 17. Drawn-in air flows from the front to back portions of the equipment 17 and is exhausted from back vents 17B disposed in the back portions of the components 17 in a front-to-back flow, as shown by arrows 50 in FIG. 11. To define a side-to-side airflow condition, cooling air is drawn from the door vents 30A and from the front intake plenum 23 by the air intakes 18A disposed in side portions of the telecommunications components 18, as shown by arrows 51 and 52 in FIG. 11. The air intakes 18A help to draw and/or to divert laterally into the first intake plenum 20 at least some portion of the front-to-back airflow, as well as help to draw cooling air directly from the door vents 30A. The intakes 18A along the side portions of the equipment 18 draw air from the plenum 20 into the components 18. Drawn-in air flows from one side to an opposite side of the components 18 and is vented from back vents 18A disposed along the opposite side of the components 18 in a side-to-side flow, as shown by arrows 52 in FIG. 11. Air vented from the IT and the telecommunications components 17 and 18 is exhausted from the exhaust plenum 22 to an area external to the housing 12, as shown by arrows 54 in FIG. 11.

Figure 12:
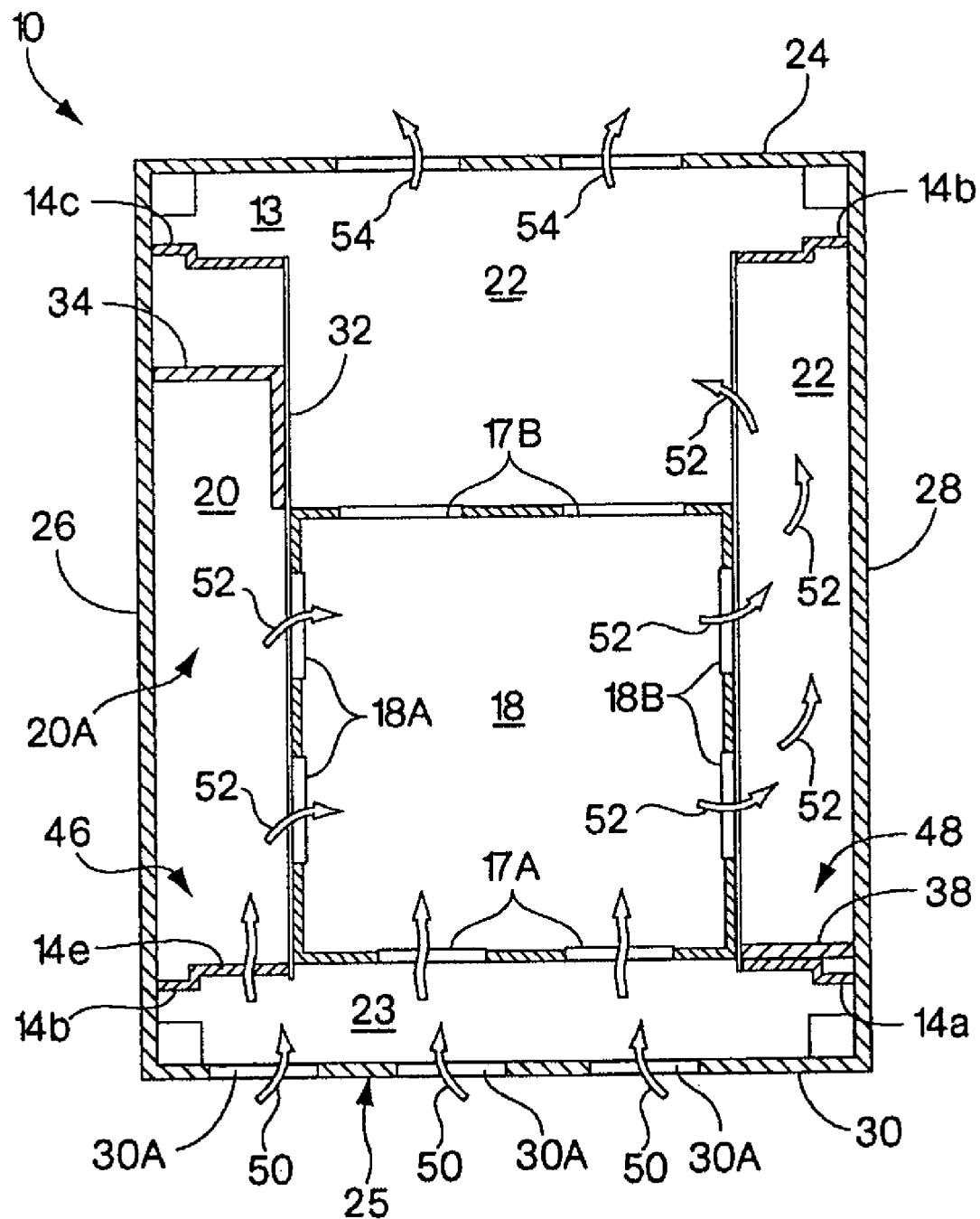
FIG. 12 is a top view cross section of the enclosure shown in FIG. 111 with the top panel removed illustrating one embodiment of the first mode of airflow.

Referring to FIG. 12, a top view cross section of the enclosure 10 illustrates embodiments of the enclosure 10 in which the rack 14 has a relatively wide width $W_1$, e.g., 23-inches, and is further configured such that the front vertical mounting rails 14a and 14b substantially fill an area at the front of the rack 14 between the rack 14 and each side panel 26 and 28, as shown. To facilitate the first mode of airflow through the enclosure 10, as described with reference to FIG. 11, the left vertical front mounting rail 14b can define multiple openings or vents 14e to permit air to flow into the first air intake plenum 20 from the air intake vents 30A of the door 30 and from the front portion of the housing interior 13 or the air intake side 25 of the rack 14, as shown by arrow 51 in FIG. 12. The multiple vents or openings 14e help to provide air to the first air intake plenum 30 to thereby help to provide sufficient side-to-side airflow used by, for example, the telecommunications equipment 18, for cooling, as shown by arrows 52 in FIG. 12. In one embodiment, the left vertical mounting rail 14b has the multiple vents or openings 14e defined along at least a portion of the height $H_1$ of the rack 14. In another embodiment, the left vertical mounting rail 14b has the multiple vents or openings 14e defined along a portion of the height $H_1$ of the rack 14 to the extent that the equipment components 18 using side-to-side airflow are mounted and distributed in the rack 14.

Figure 13:
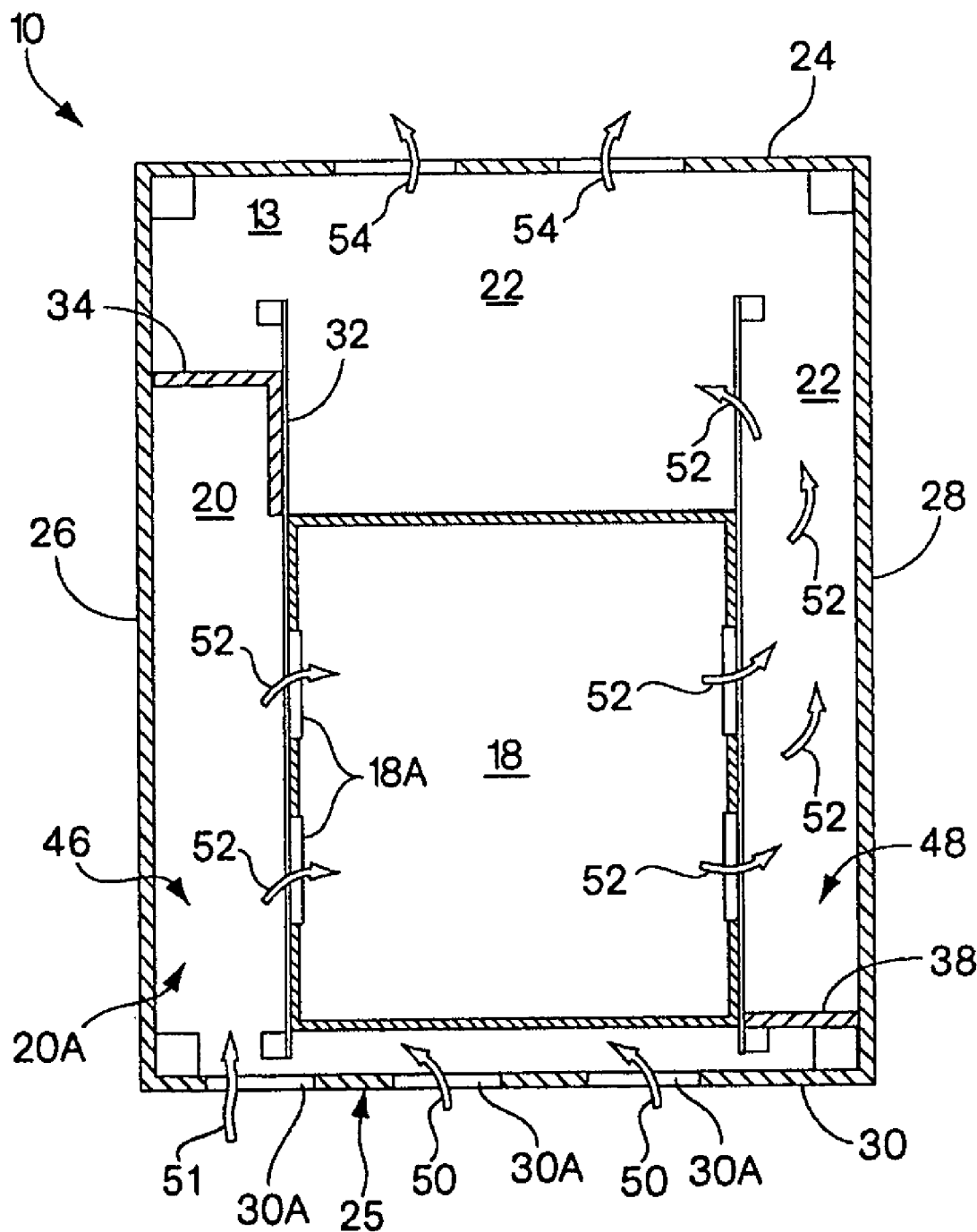
FIG. 13 is a top view cross section of the enclosure shown in FIG. 1 with the top panel removed illustrating a second mode of airflow according to the invention.

Referring to FIG. 13, a top view cross-section of the enclosure 10 illustrates a second mode of airflow through the enclosure 10 that can be achieved wherein the rack 14 is positioned at the front of the housing 12 such that the rack 14 and the partition 38 help to define the exhaust plenum 22 only. In this embodiment, the front intake plenum 23 is not defined in the housing interior 13 and the partition 38 is disposed behind the door 30. The housing interior 13 can accommodate the rack 14 loaded exclusively with the telecommunications components 18. Cooling air is drawn through the air vents 30A in the door 30 and flows directly into the plenum 20, as shown by arrows 50 and 51 in FIG. 13.

Figure 14A:
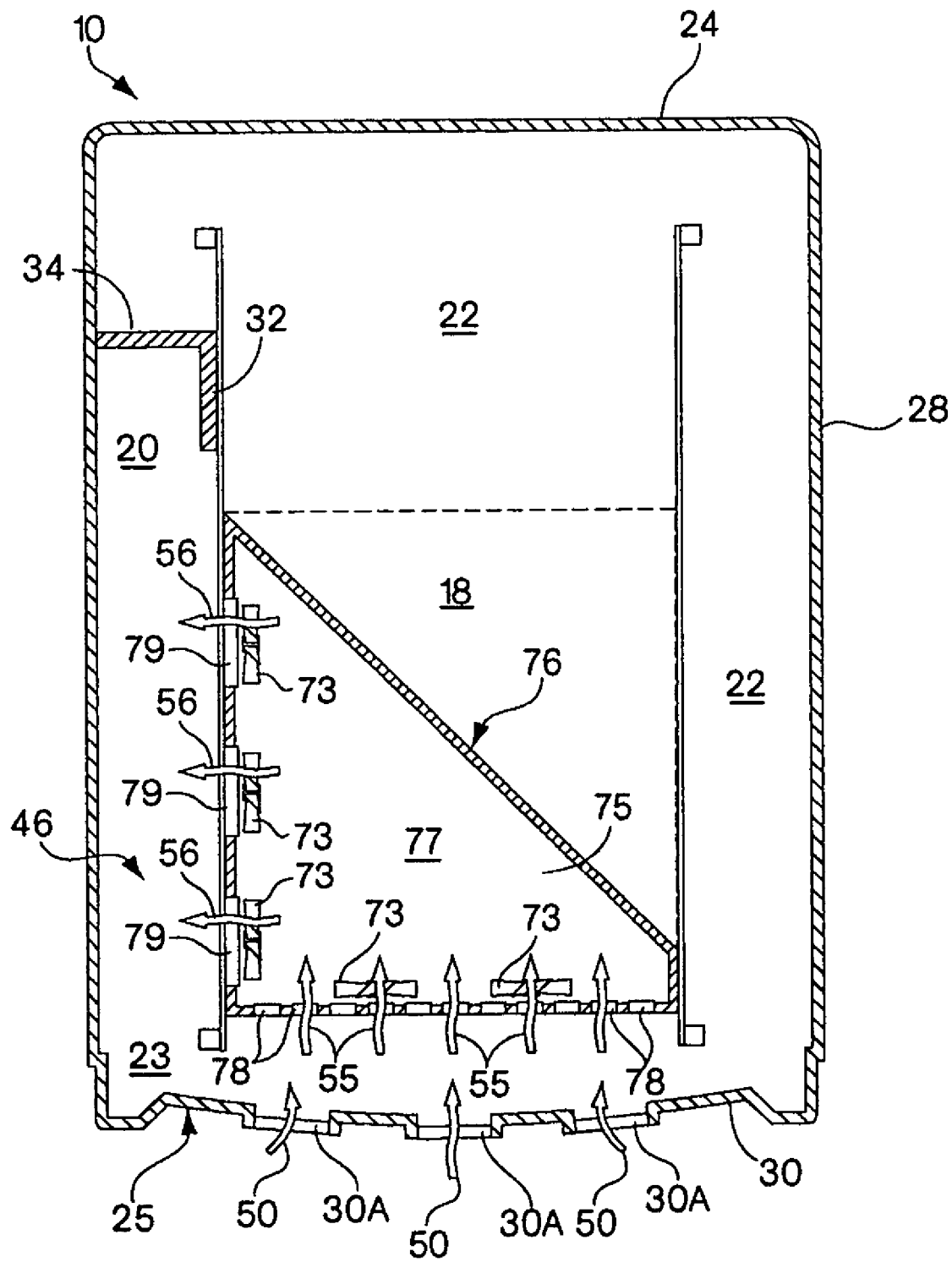
FIG. 14A is a top view cross section of the enclosure shown in FIG. 1 with the top panel removed illustrating a third mode of airflow according to the invention.
Figure 14B:
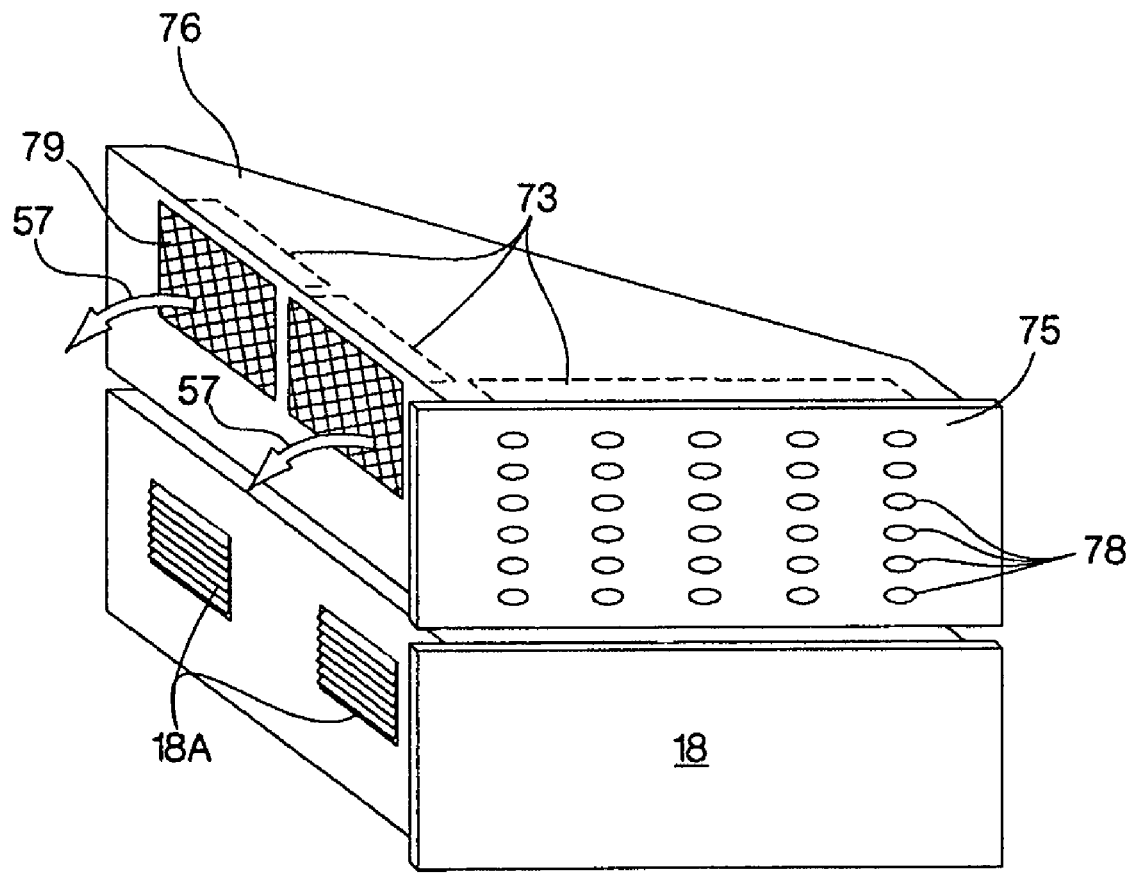
FIG. 14B is a perspective view of a duct unit and an electronic component that uses side-to-side airflow for cooling and ventilating.

Referring to FIGS. 14A-14B, in other embodiments of the enclosure 10 according to the invention, the enclosure 10 can include one or more duct units 75 configured and sized for vertical mounting in the rack 14. As shown in a top view cross section of the enclosure 10 in FIG. 14A, the duct unit 75 can have overall dimensions to permit rack mounting within the equipment area of the rack 14. The duct unit 75 includes a housing 76 defining an internal chamber or duct 77 that is configured to receive and to contain air. The duct unit 75 further includes multiple front vents or openings 78 defined in its front side and multiple side vents or openings 79 defined in its left side when rack-mounted. The chamber 77 of the duct unit 75 can be defined with overall dimensions such that it receives air from the multiple front openings 78 and helps to direct air through the duct unit 75 to the multiple side openings 79 to thereby provide air to the first intake plenum 20. As shown in FIG. 14A, in one embodiment, the housing 76 of the duct unit 75 can be constructed and arranged such that the housing defines the chamber 77 with a configuration or shape, e.g., a funnel-like shape as shown in FIG. 14A, that helps to direct or channel air from the multiple front openings 78 to the multiple side openings 79 and thereby helps to increase volume or rate of airflow into the first intake plenum 20.

The duct unit 75 is disposed in the rack 14 and the chamber 77 is configured such that the chamber 77 receives and thereby captures at least some portion of front-to-back airflow from the front intake plenum 20 in the front portion of the housing interior 13 or from the air intake side 25 of the rack 14, as shown by arrows 55 in FIG. 14A. As equipment components using front-to-back airflow draw air from the front vents 30A of the door 30 into the front intake plenum 23 to configure front-to-back airflow conditions, as described above with reference to FIGS. 11-12 and as shown by the arrows 50 in FIG. 14A, the duct unit 75 helps to divert some portion of the front-to-back airflow to the first intake plenum 20 along the left side of the rack 14, as shown by arrows 56 in FIG. 14A, to provide for side-to-side airflow.

Referring further to FIGS. 14A-14B, in one embodiment, the duct unit 75 can include one or more fans 73 disposed within the chamber 77. In one embodiment, one or more fans 73 can be coupled to the multiple front openings 78 where each fan 73 is disposed and configured to draw in cooling air from the front intake plenum 20 in the front portion of the housing interior 13 or from the air intake side 25 of the rack 14 into the chamber 77, as shown by the arrows 55 in FIG. 14A. The fans 73 are further configured to force drawn-in air into the chamber 77 and through the multiple side openings 79 into the first air intake plenum 20, as shown by the arrows 56 in FIG. 14B. In another embodiment, one or more fans 73 can be coupled to the multiple side openings 78 where each fan is disposed and configured to draw cooling air through the chamber 77 and from the front intake plenum or the air intake side 25 of the rack 14. The fans are further configured to force drawn-in air into the first intake plenum 20. In another embodiment, the duct unit 75 can include one or more fans 73 coupled to the multiple front and the side openings 78 and 79.

Figure 14C:
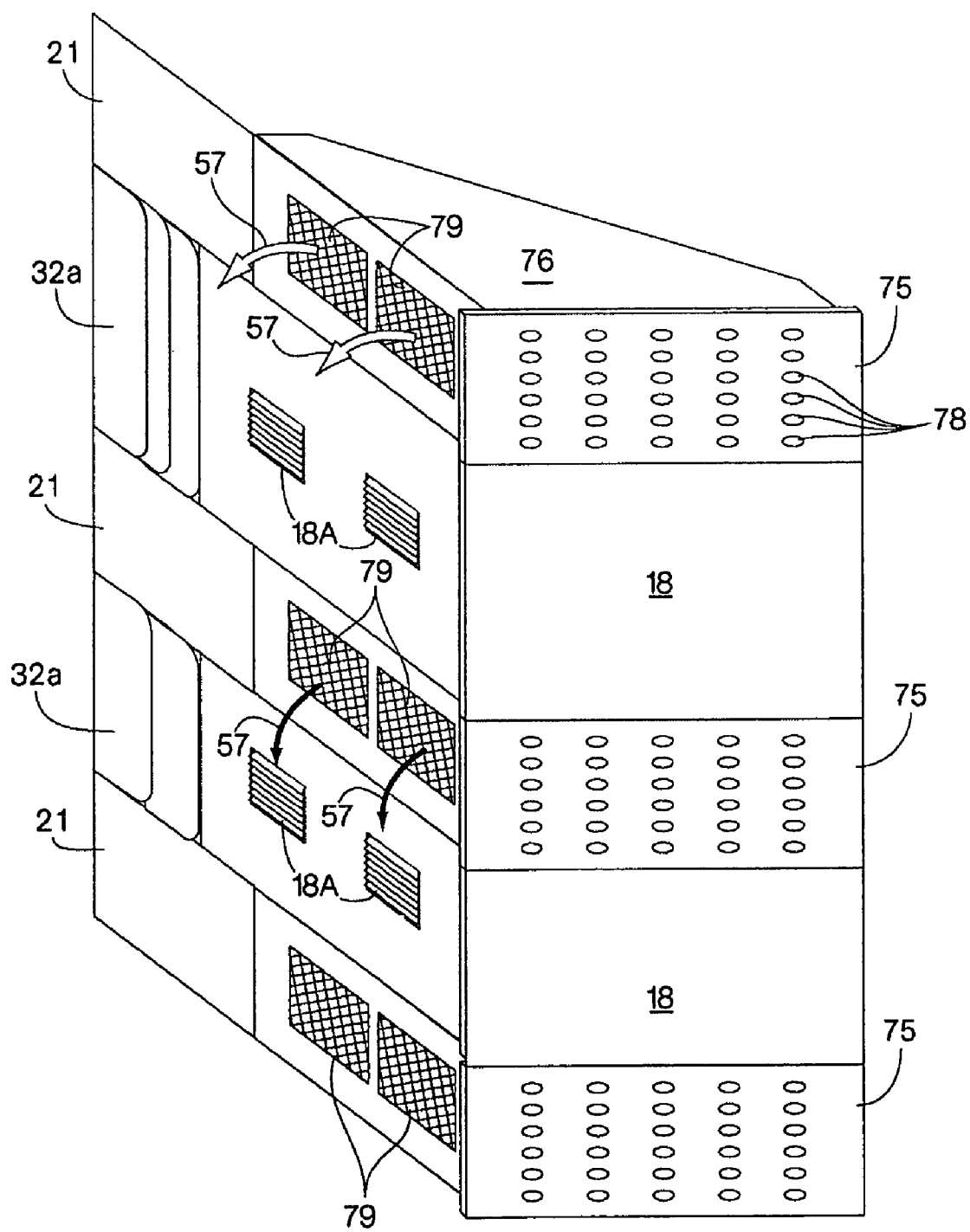
FIG. 14C is a perspective view of duct units in relation to electronic components that use side-to-side airflow.

Referring to FIG. 14C, and with further reference to FIG. 14B, in one embodiment, the housing 77 of the duct unit 75 can be constructed and arranged to define a certain U height and a certain depth to permit the duct unit 75 to be mounted vertically adjacent to and/or between the equipment components 17 and 18 disposed in the equipment area of the rack 14. The duct unit 75 can be mounted in the rack 14 at a desired position selected to correspond to the location and distribution of equipment using side-to-side airflow, such as the telecommunications components 18. As shown in FIG. 14C, the duct unit 75 can be mounted in the rack 14 adjacent, e.g. above or below, and/or between the equipment components 18 using side-by-side airflow. As shown in FIGS. 14B-14C, when mounted adjacent to or between the equipment components 18 using side-to-side airflow, the duct unit 75 can direct chamber air, e.g., drawn into the chamber 77 by the air intakes 18A of the components 18 and/or forced or drawn into the chamber 77 by the fans 73 coupled to the multiple front and/or side openings 78 and 79, through its multiple side openings 79 into the first intake plenum 20. The duct unit 75 thereby vents cooling air proximate to the side vents 18A of the components 18, as shown by arrows 57 in FIGS. 14B-14C. The side vents 18A can draw air from the multiple side openings 79 of the duct unit 75 to thereby help to draw sufficient intake air for cooling in a side-to-side condition.

Figure 15A:
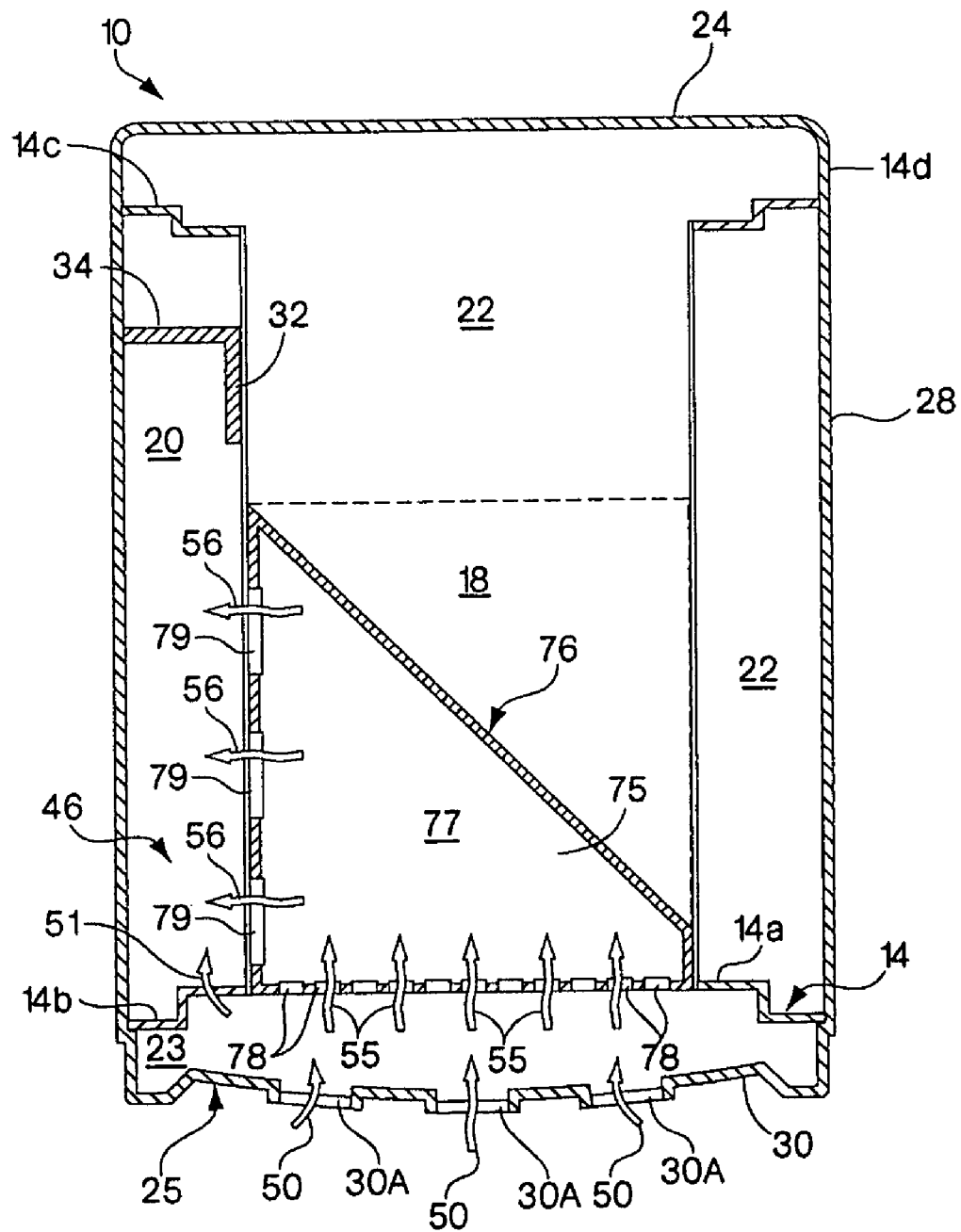
FIG. 15A is a top view cross section of the enclosure of FIG. 1 with the top panel removed illustrating one embodiment of the enclosure interior to permit airflow illustrated in FIG. 14A.

Referring to FIG. 15A, a top view cross section of the enclosure 10 illustrates one embodiment of the enclosure 10 illustrated in FIGS. 14A-14C in which the rack 14 has a relatively wide width $W_1$, e.g., 23-inches, and is further configured such that the front vertical mounting rails 14a and 14b substantially fill an area at the front of the rack 14 between the rack 14 and each side panel 26 and 28. The left vertical front mounting rail 14b can define the multiple vents 14e to permit air to flow into the first air intake plenum 20 from the air intake vents 30A of the door 30 and from the front portion of the housing interior 13 or the air intake side 25 of the rack 14, as shown by the arrow 51 in FIG. 15A and as described with reference to FIG. 11-12.

Figure 15B:
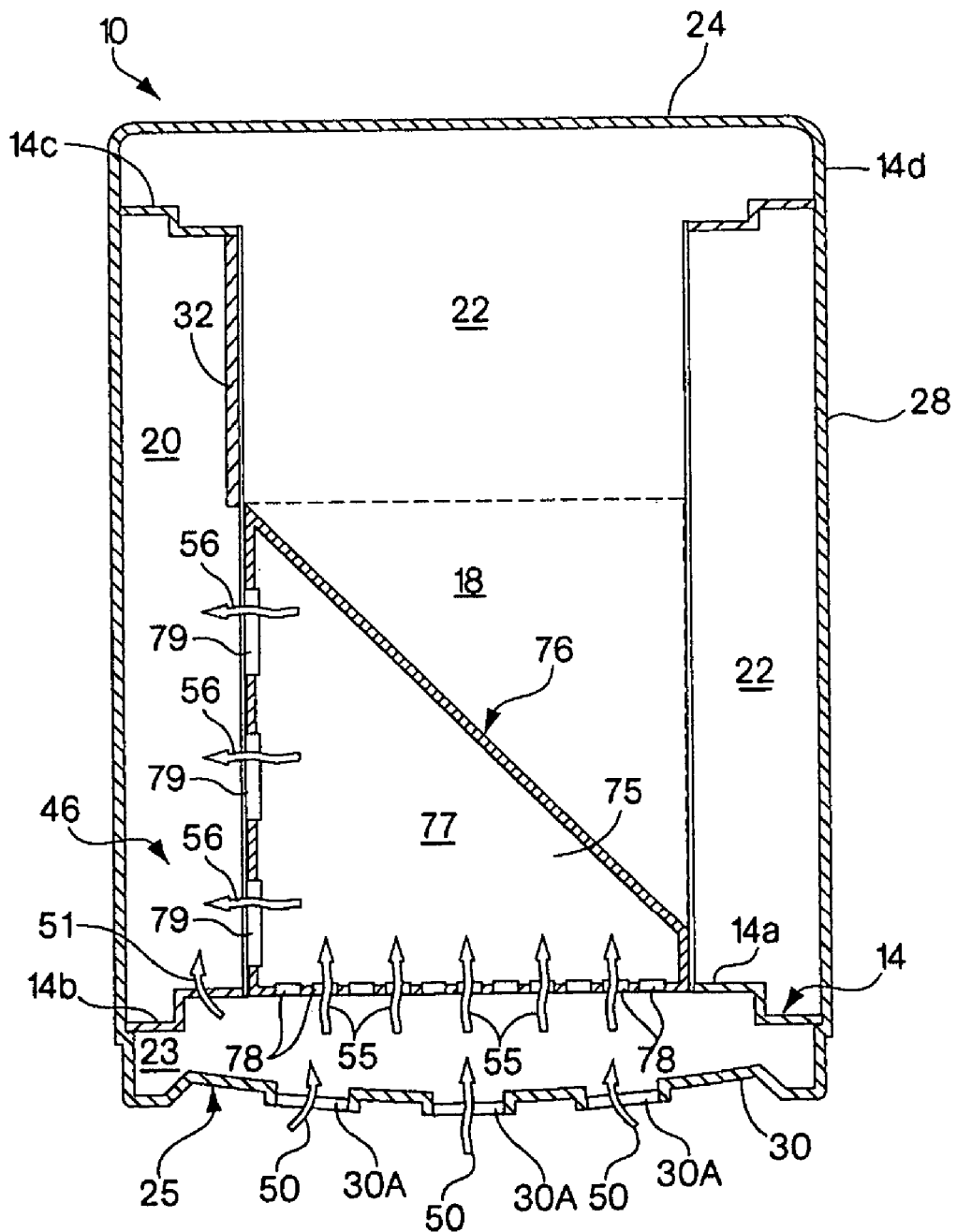
FIG. 15B is a top view cross section of the enclosure of FIG. 1 with the top panel removed illustrating another embodiment of the enclosure interior to permit airflow illustrated in FIG. 14A.

Referring to FIG. 15B, is another embodiment of the enclosure 10 shown in FIG. 15A, the partition 32 can extend from the equipment 17 and 18 to the left back mounting rail 14c to help to define the first intake plenum 20. In different embodiments, the partition 32 can include various configurations and arrangements are described above with reference to FIGS. 6A-6B, 7A-7B and/or 8A-8C.

Figure 16:
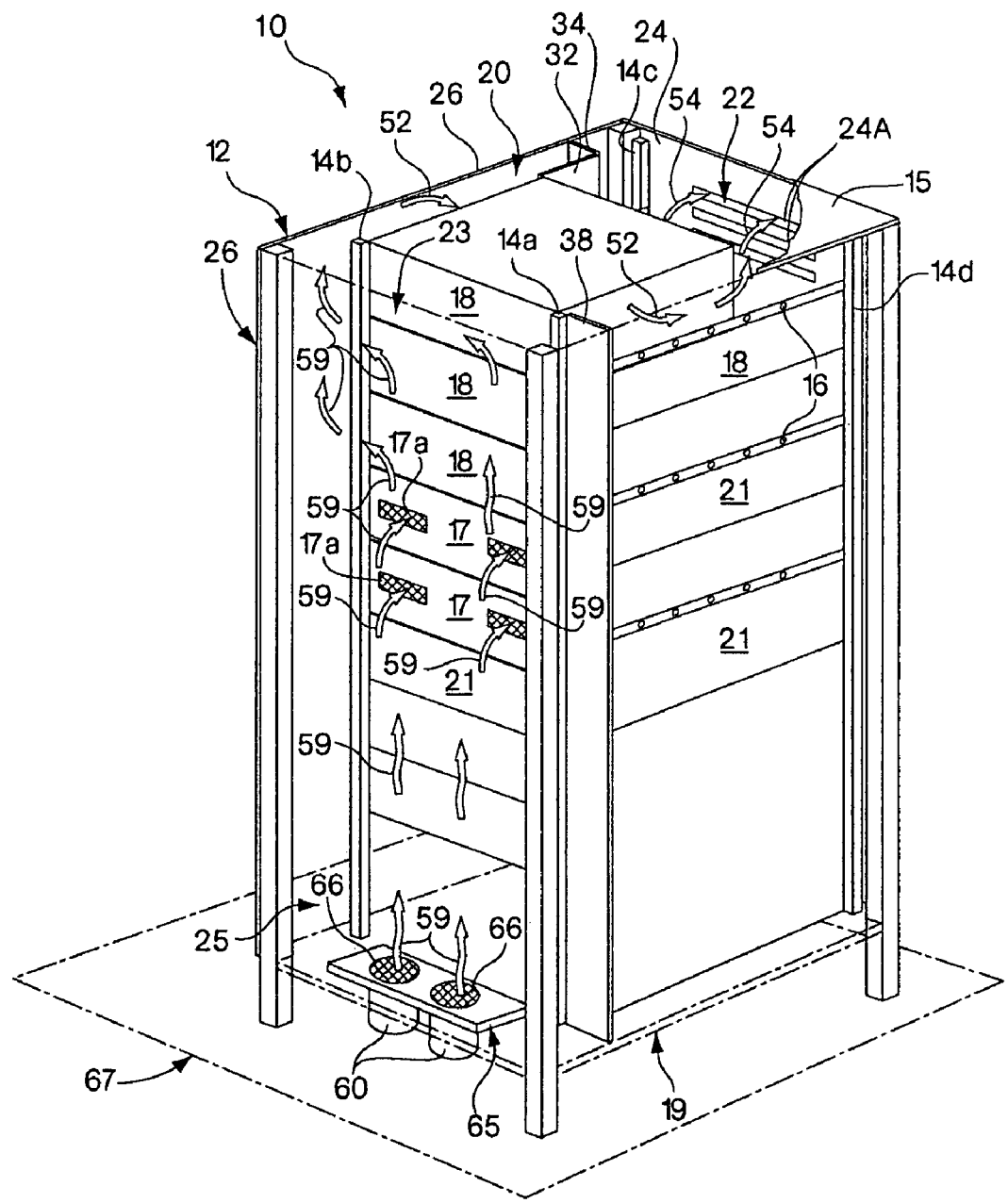
FIG. 16 is a perspective view of the enclosure shown in FIG. 1 with the front door, the side panel and the top panel removed and including an air distribution unit mounted therein.

Referring to a perspective view of the enclosure 10 in FIG. 16, a third mode of airflow through the enclosure 10 can be achieved where the front intake plenum 23 is in fluid communication with one or more openings in the bottom panel 19 of the housing 12. The one or more openings can serve to provide cooling air into the housing interior 13 such that the cooling air flows into the front intake plenum 23 and circulates upward vertically along the front portion of the housing interior 13 or along the air intake side 25 of the rack 14. As shown in FIG. 16, in one embodiment, each of the one or more openings in the bottom panel 19 is coupled to a plenum or duct 60 that extends externally from the bottom panel 19 and connects with a conventional raised floor configuration 67. The raised floor configuration 67 is well known in the art and can include a first floor and a second floor that define a conduit therebetween, wherein the conduit is connected to an air cooling unit or system that supplies cool air to the conduit. The conduit receives cool air from the cooling unit or system and directs the cool air into the one or more ducts 60 to supply cooling air to the housing interior 13.

Still referring to FIG. 16, in another embodiment, the one or more ducts 60 can be coupled to a rack-mounted air distribution unit 65, as disclosed in the applicants' copending patent application Ser. No. 10/121,313, which is incorporated herein by reference. The air distribution unit 65 is disposed along and/or coupled to the bottom panel 19 within the housing interior 13 and coupled to the raised floor configuration 67 through the one or more ducts 60 to receive and/or to draw in cool air. Multiple fans 66 of the unit 65 can draw cooling air from the ducts 60 into the front intake plenum 23 and can circulate cooling air upward along the front portion of the housing interior 13 or along the air intake side 25 of the rack 14 to configure a bottom-to-top airflow, as shown by arrows 59 in FIG. 16. In another embodiment, multiple fans are not connected to the ducts 60 and are configured to draw in ambient air external to the enclosure 10 into the system 65 for distribution upward as cooling air in bottom-to-top airflow condition, as described.

As shown in FIG. 16, the enclosure 10 is configured such that cooling air can be received by the first intake and the front intake plenums 20 and 23 from the unit 65, as described above and shown by arrows 59 in FIG. 16. In this case, a bottom-to-top airflow condition is defined as cooling air is forced and/or drawn upward through the front intake plenum 23 along the front portions of the IT components 17. The bottom-to-top airflow helps to contribute to a front-to-back airflow condition and a side-to-side airflow condition, for instance, by increasing the volume of the cooling air forced upward through the front intake plenum 23 and received by the first intake plenum 20. In addition, the air distribution unit 65 forces the bottom-to-top airflow into the first and the front intake plenums 20 and 23 such that the plenums 20 and 23 become pressurized due to an increased volume and rate of cooling air flowing into the plenums 20 and 23 from the ducts 60 and the unit 65.

Figure 17:
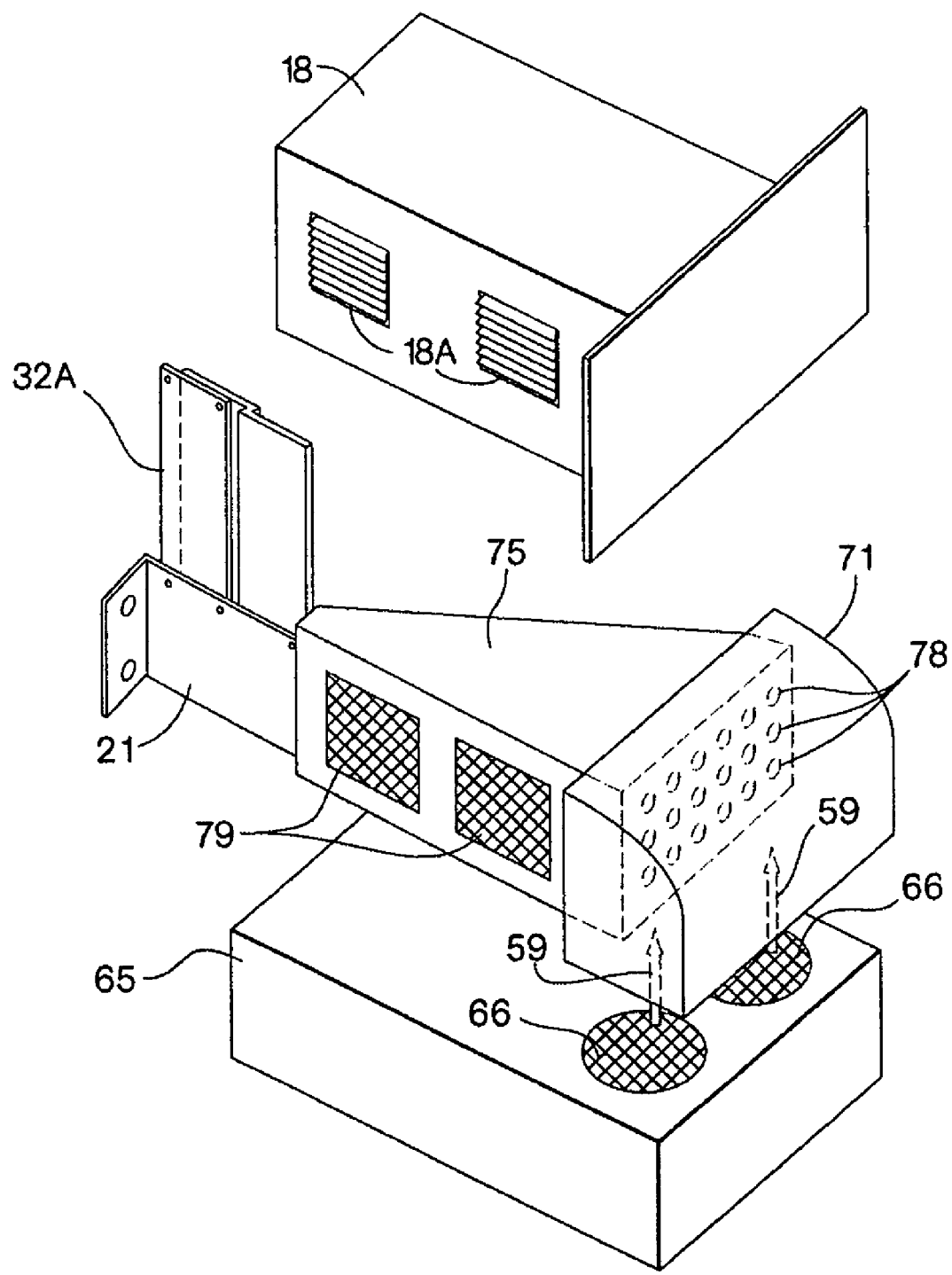
FIG. 17 is an exploded perspective view of the air distribution system shown in FIG. 16 and the duct unit shown in FIG. 14A-14C.

Referring to FIG. 17, in one embodiment, the enclosure 10 can include the air distribution unit 65, as described above, and can be further configured to rack-mount one or more of the duct units 75. As shown in an exploded perspective view of FIG. 17, the multiple fans 66 of the air distribution unit 65 can draw in cooling air and force drawn-in air into the front intake plenum 23 at the front portion of the housing interior 13 or the front intake 25 of the rack 14 and upward in a bottom-to-top airflow condition, as shown by the arrows 59 in FIG. 16. The multiple front openings 78 of one or more of the duct units 75 can receive or capture some portion of bottom-to-top airflow provided by the air distribution unit 75. In one embodiment, one or more of the duct units 75 includes one or more fans 73 disposed within the chamber 77, as described above, to drawn in the bottom-to-top airflow the air distribution system 65 creates by forcing cooling air into the front intake plenum 23 in the front portion of the enclosure interior 13. The unit 65 and the fans 73 of the duct units 75 help to increase the volume and/or rate of flow of cooling air into the first intake plenum 20 and thereby help to pressurize the first intake plenum 20. The first intake plenum 20 receives and contains cooling air under pressure, which helps to insure that the air intakes 18A of the side-to-side airflow components 18 have sufficient air from which to draw to meet its cooling needs.

In one embodiment, one or more of the duct units 75 further includes a hood-like member 71 that is configured to couple with a front portion of the duct unit 75 and is further configured to be disposed in the front intake plenum 23 or the front portion of the housing interior 13. The hood-like member 71 is disposed within the housing interior 13 and configured to capture some portion of cooling air forced upward in bottom-to-top airflow to help to provide sufficient cooling air to the first intake plenum 20 via the duct unit 75.

Other embodiments are within the scope and spirit of the appended claims. For example, the first intake plenum 20 can be disposed and configured on the right side of the rack 14. The partitions 32 and 34 can be disposed in the space 48 between the right side panel 28 of the housing 12 and the rack members 16 running front-to-back along the right side of the rack 14.

Another example includes embodiments wherein the vented rear panel 24 of the housing 12 can be configured to couple to an exhaust unit disposed externally along the rear of the enclosure 10 and having one or more fans for drawing and venting exhaust air, as disclosed in the applicants' copending U.S. application Ser. No. 10/303,641, which is incorporated herein by reference. In one embodiment, the external exhaust unit can replace the vented rear panel 24 and can be configured to serve as a back door of the housing 12. Each fan of the exhaust unit is coupled to an exhaust duct defined within the exhaust unit interior. The exhaust duct is configured to receive air the fan draws in and vents into the exhaust duct and to direct fan-vented air to a top portion of the exhaust unit for venting to an area external to the enclosure 10. Each fan is disposed in fluid communication with the exhaust plenum 23 and the equipment vents 17A and 18A of the components 17 and 18. Each fan draws in hot and warm exhaust air from the exhaust plenum 23 into the exhaust unit, and then vents drawn-in air into its associated duct. Fan-vented air is thereafter directed by the exhaust duct to the top of the exhaust unit for venting.

In another embodiment, the exhaust unit having one or more fans as described is disposed at a top of the enclosure 10. Each fan draws air from the exhaust plenum 23 and vents drawn-in air to an area external to the enclosure 10.

Figure 18:
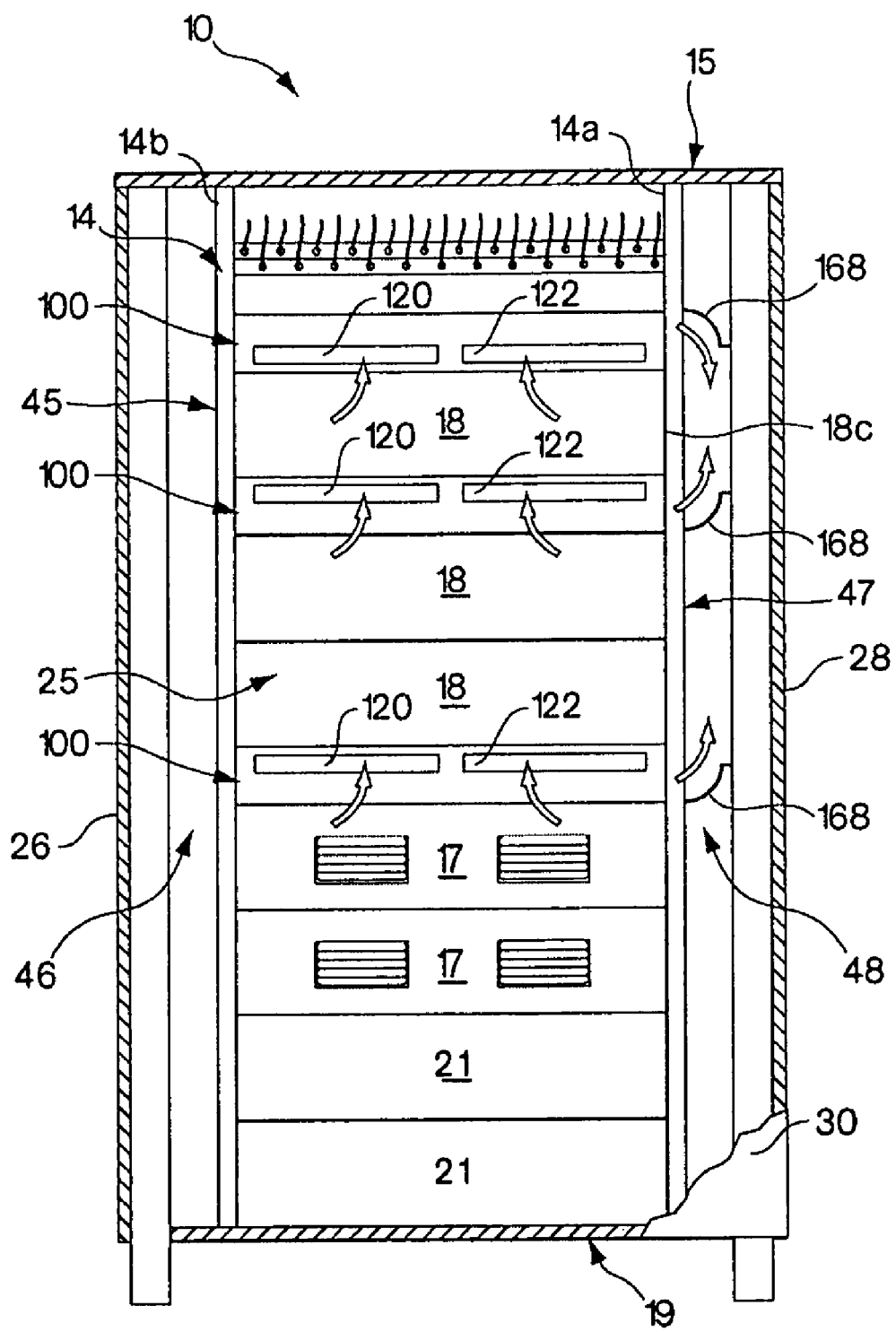
FIG. 18 is a front view of the enclosure shown in FIG. 1 with the front panel removed and a side air distribution unit according to one embodiment of the invention mounted therein.

Referring to FIG. 18, in further embodiments of the invention, a side air distribution unit 100 is provided for use within the enclosure 10 to provide cooling air directly to either a left side 45 of the rack 14 or a right side 47 of the rack 14. The unit 100 is configured and arranged to be removably mounted within the equipment area defined by the rack 14 and includes one or more fans (not shown). The one or more fans are disposed and configured to draw cooling air into the unit 100 from the front intake side 25 of the rack 14 through one or more front intake vents 120 and 122 disposed along the front of the unit 100. The fans vent the drawn-in cooling air from one or more side exhaust vents (not shown) to either the left side 45 or the right side 47 of the rack 14, as needed. The unit 100 thereby provides cooling air to rack-mounted electronic components 18, such as telecommunications components, that draw cooling air either from the left side 45 of the rack 14, to create a left-to-right airflow condition, or from the right side 47 of the rack 14, to create a right-to-left airflow condition, to meet its cooling requirements. In addition, in one embodiment, where the enclosure 10 includes the left side panel 26 and/or the right side panel 28, as shown in FIG. 18, the unit 100 can deliver cooling air along the left space 46 defined between the left panel 26 and the rack 14, or along the right space 48 defined between the right panel 28 and the rack 14. Further, the unit 100 can be used in the enclosure 10 to deliver cooling air to the first air intake plenum 20 defined along the left side 45 of the rack 14 or along the right side 47 of the rack 14 with one or more of the partitions 32, 34, 35 and 36, as described above.

The side air distribution unit 100 provides flexibility with respect to providing cooling air to the components 18 using a side-to-side airflow regardless of the type and the size of the telecommunications components 18, as well as the location of such components 18 in the rack 14. The side air distribution unit 100 has dimensions, e.g., width and depth (length) that permit the unit 100 to be mounted at any location in the rack 14. In addition, the unit 100 can have a U height, e.g., 2U, 3U, 4U or 5U, depending on the cooling air requirements of the side-to-side components 18 and the fan sizes and ratings required to meet such airflow requirements.

Figure 19A:
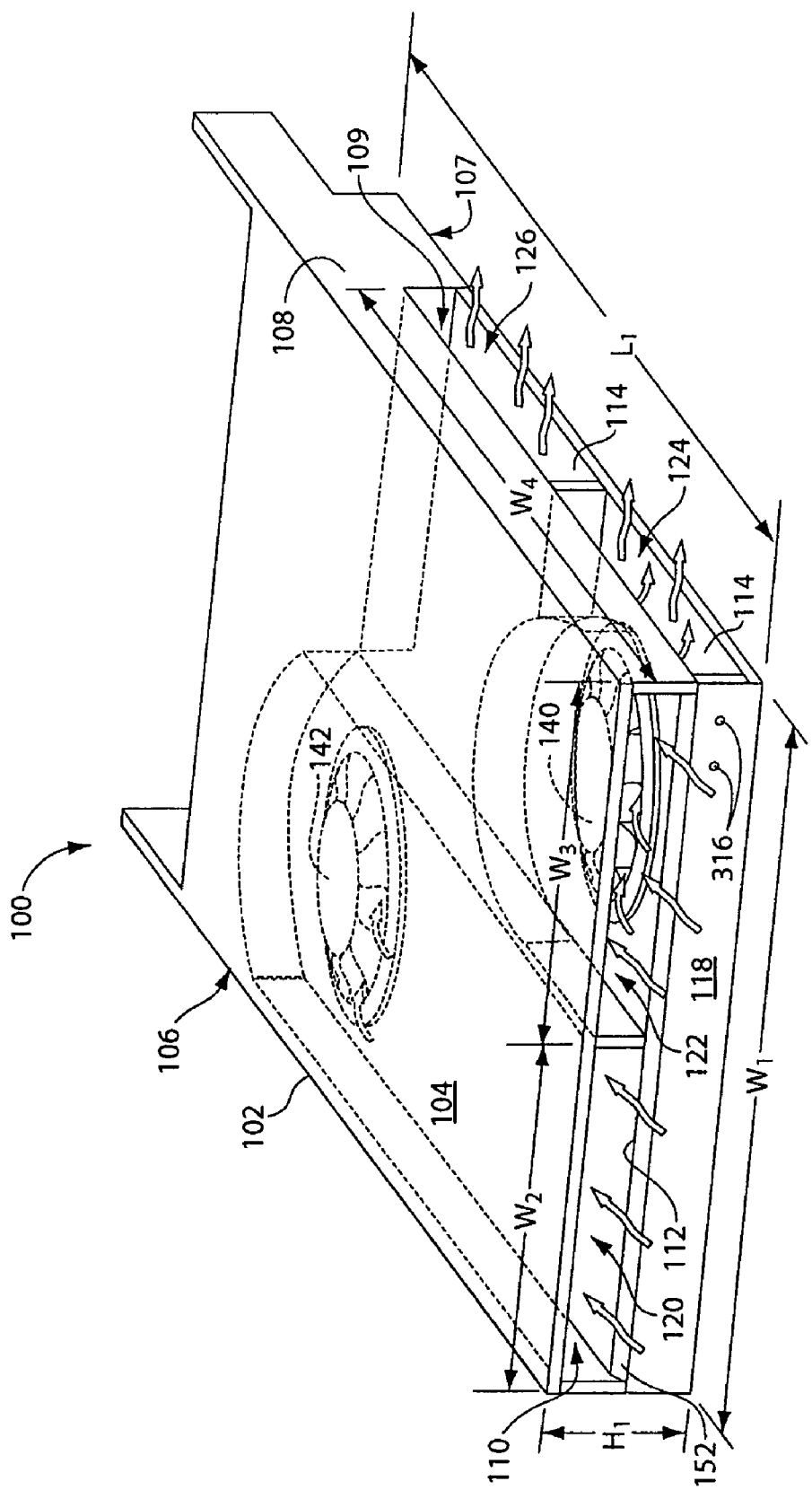
FIG. 19A is a perspective view of the unit shown in FIG. 18.
Figure 19B:
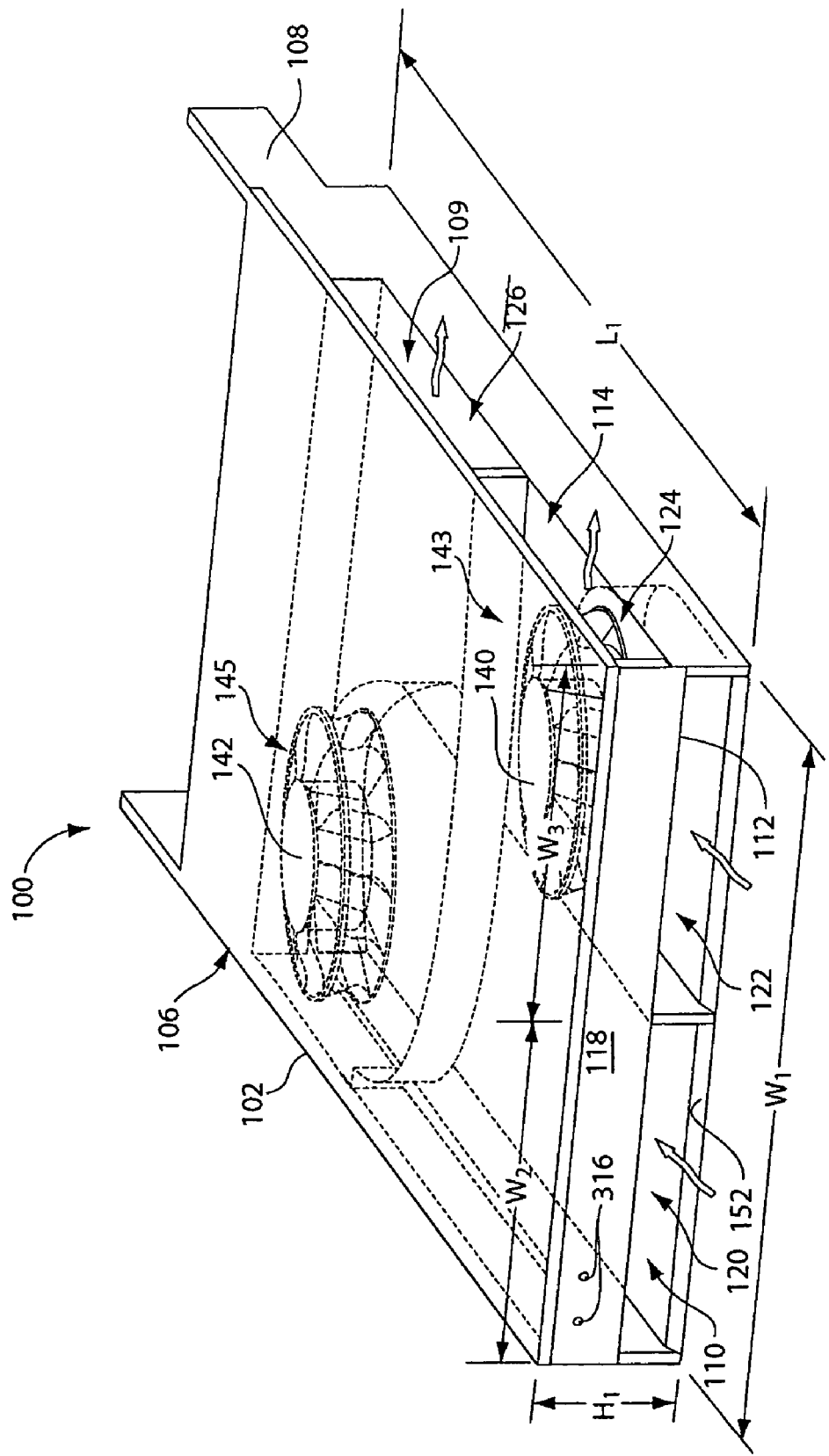
FIG. 19B is a perspective view of a side air distribution unit according to another embodiment of the invention.

Referring to FIGS. 19A and 19B, and with further reference to FIG. 18, the side air distribution unit 100 includes a housing 102 having a top panel 104, a bottom panel 107, a left side panel 106, a right side panel 108 and a back panel (not shown) configured to define an interior chamber. The unit 100 further includes an intake plenum 110 and an exhaust plenum 114 within the interior chamber. In one embodiment, the intake plenum 110 of the unit 100 is an upper plenum defined between the top panel 104 and a midplate 112, which is disposed horizontally within the interior chamber and is spaced from and parallel to the top panel 104. The exhaust plenum 114 is a lower plenum defined below the upper intake plenum 110 between the bottom panel 107 and the midplate 112. The one or more fans 140 and 142 (shown in phantom) are disposed in the exhaust plenum 114 in fluid communication with the intake plenum 110 to draw air through the front vents 120 and 122 into the unit 100. In an alternative embodiment of the unit 100, as shown in FIG. 19B, the intake plenum 110 is the lower plenum and the exhaust plenum 114 is the upper plenum. The invention is disclosed below in further detail with reference to the intake plenum 110 configured as the upper plenum and the exhaust plenum 114 configured as the lower plenum; however, the invention is not limited in this respect and those of ordinary skill in the art will recognize and appreciate that elements and aspects of the invention described below also apply to the embodiment of the unit 100 shown in FIG. 19B.

The housing 102 further includes a front panel 118 extending the width $W_1$ of the unit 100 and defining the one or more front intake vents 120 and 122. The intake vents 120 and 122 are disposed and configured in fluid communication with the intake plenum 110. Where the side air distribution unit 100 is rack-mounted, the intake vents 120 and 122 are positioned to permit the fans 140 and 142 to draw air from the front intake side 25 of the rack 14 through the intake vents 120 and 122 and into the intake plenum 110. The right side panel 108 of the housing 102 defines one or more right side exhaust vents 124 and 126 in fluid communication with the exhaust plenum 114. The right side exhaust vents 124 and 126 are positioned to permit the fans 140 and 142 to vent drawn-in air from the exhaust plenum 114 to an area external to the unit 100 along the right side 47 of the rack 14. Similarly, the left side panel 106 defines one or more left side exhaust vents (not shown) in fluid communication with the exhaust plenum 114. The left side exhaust vents are similarly disposed and configured as the right side exhaust vents 124 and 126 shown in FIGS. 19A and 19B. Where the side air distribution unit 100 is rack-mounted, the left side exhaust vents are positioned to permit the fans 140 and 142 to vent drawn-in air from the exhaust plenum 114 to an area external to the unit 100 along the left side 45 of the rack 14.

In use, the fans 140 and 142 vent cooling air from the exhaust plenum 114 either through the left or the right side exhaust vents 124 and 126, while the opposite side exhaust vents are blocked, e.g., using a blocking panel (not shown). The blocking panel is configured to mount to the left or the right side panel 106 or 108 and to block airflow from the left or the right side exhaust vents 124 and 126 when mounted thereto. The blocking panel permits the unit 100 to provide cooling air exclusively to either the left side 45 or the right side 47 of the rack 14, depending on the type and the location of the components 18 and the pattern of side-to-side airflow, e.g., left-to-right or right-to-left, the components 18 use for cooling and heat removal. The unit 100 is thereby flexible with respect to accommodating different types of components 18 produced by different manufacturers, as well as the location of the components 18 when rack-mounted. In addition, the unit 100 further includes electrical circuitry for driving the fans 140 and 142 that can be at least partially disposed within the housing 102.

Figure 20:
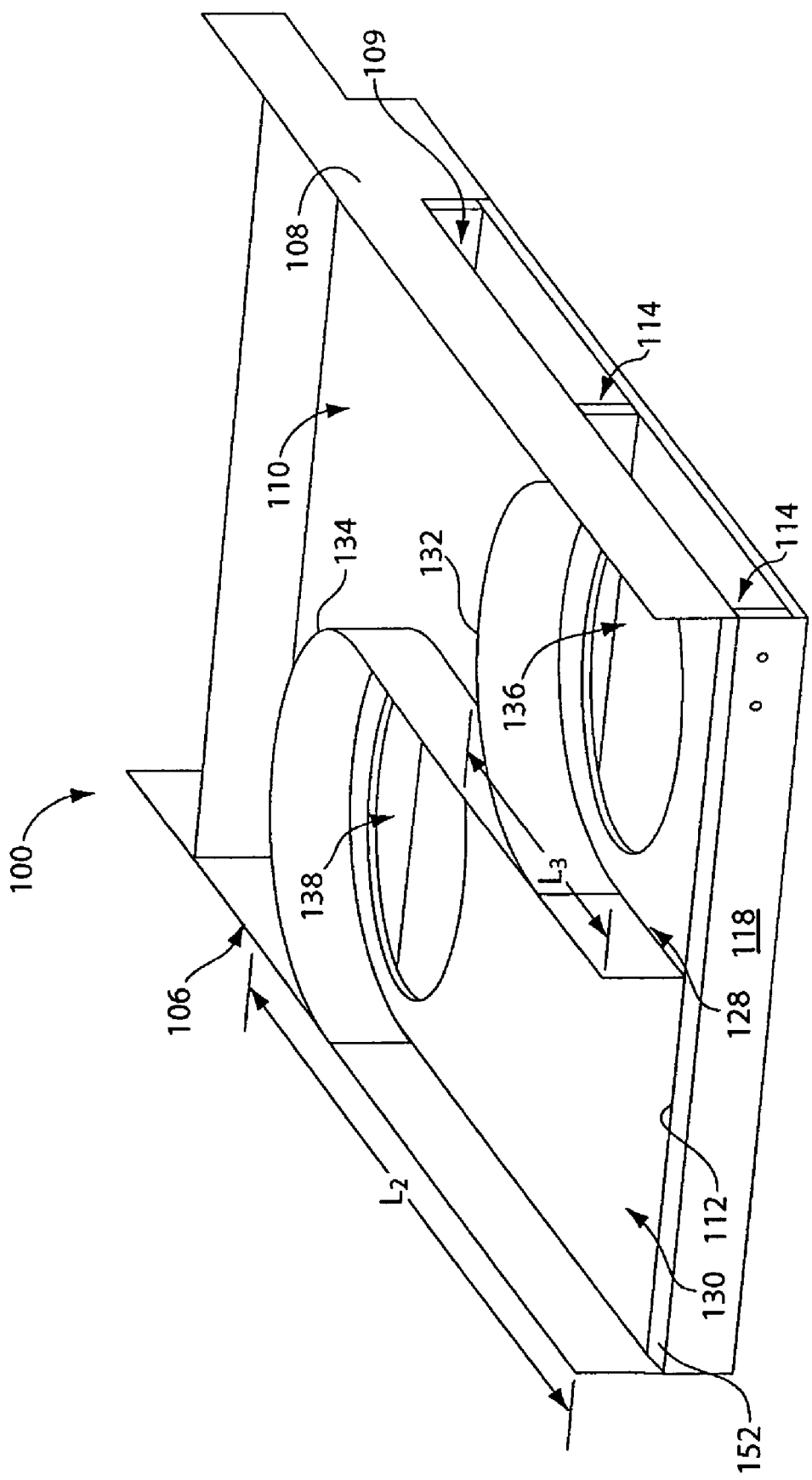
FIG. 20 is a perspective view of the unit shown in FIG. 19A with a top panel of a housing of the unit removed and a perspective view of an intake plenum of any of the units shown in FIGS. 19A-19C and FIGS. 19F-19G.
Figure 21:
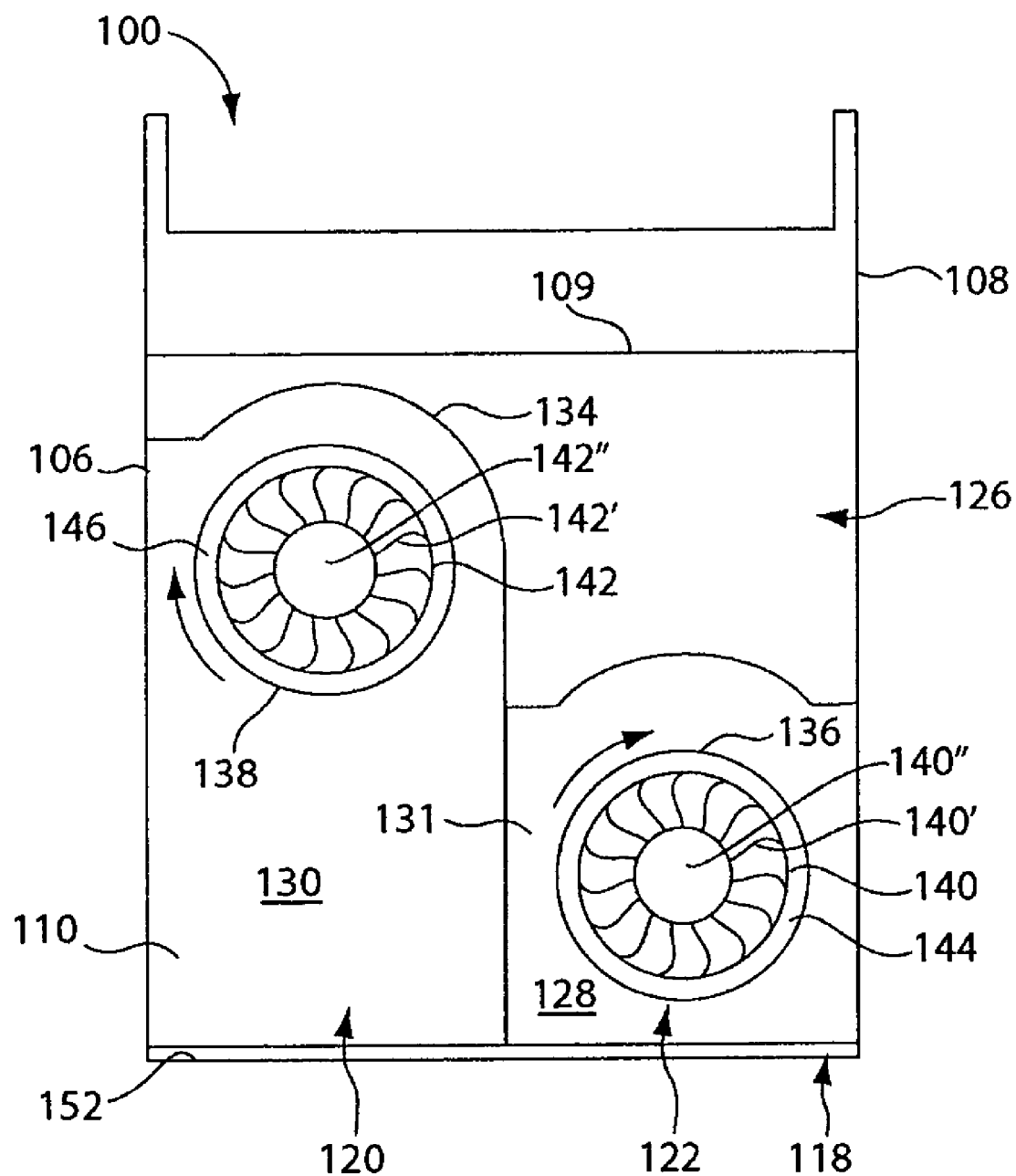
FIG. 21 is a top view of the intake plenum shown in FIG. 20.

Referring to FIGS. 20 and 21, a perspective view and a top view of the intake plenum 110 are provided. The intake plenum 110 includes parallel air paths 128 and 130 defined by the front intake vents 120 and 122, the midplate 112 and one or more dividing walls 132 and 134 mounted or connected to the midplate 112 that extend along at least a portion of the length $L_1$ of the interior of the housing 102. The midplate 112 defines a port 136 and 138 in each of the air paths 128 and 130. For instance, in one embodiment of the unit 100, a first or front port 136 is disposed in the right air path 128 and a second or back port 138 is disposed in the left air path 130. The front and back ports 136 and 138 are disposed in a staggered manner along a horizontal plane, or, in other words, are defined in the midplate 112 such that each port is offset in relation to the other port. Each port 136 and 138 is further disposed and configured to align with at least a portion of one of the fans 140 and 142 disposed in the exhaust plenum 114. Like the front and back ports 136 and 138, the fans 140 and 142 are disposed in a staggered manner along a horizontal plane such that each fan is offset in relation to the other fan and is aligned with one of the ports 136 and 138. As shown in FIG. 21, the front port 136 is disposed and configured, e.g., defines a certain diameter, such that it accommodates a span of a plurality of fan blades or impellers 140' of the front fan 140. The front fan 140 is disposed in the exhaust plenum 114 such that the front port 136 is open to the fan blades or impellers 140' and a central fan hub 140" to thereby place the front fan 140 in fluid communication with the right air path 128. The front port 136 and the front fan 140 are further disposed and configured to permit the front fan 140 to draw air from the right air path 128 and to allow drawn-air to pass through the port 136 into a span of the fan blades or impellers 140'. Similarly, as also shown in FIG. 21, the back port 138 is disposed and configured, e.g., defines a certain diameter, such that it accommodates a plurality of fan blades or impellers 142' of the back fan 142. Like the front fan 140, the back fan 142 is disposed in the exhaust plenum 114 such that the back port 138 is open to the fan blades or impellers 142' and a central fan hub 142" to place the back fan 142 in fluid communication with the left air path 130. The back port 138 and the back fan 142 are further disposed and configured to permit the back fan 142 to draw air from the left air path 130 and to allow drawn-air to pass through the port 138 into a span of the fan blades or impellers 142'.

Figure 22:
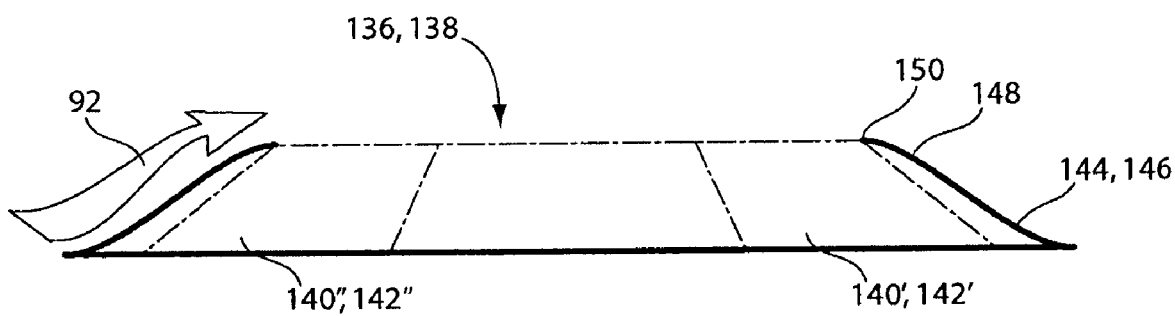
FIG. 22 is a side view of an inlet ring disposed in the intake plenum shown in FIGS. 20 and 21.

Referring to FIG. 22, and with further reference to FIGS. 20 and 21, each port 136 and 138 has an inlet ring 144 and 146 mounted or connected to the midplate 112 adjacent to a circumferential edge of each port 136 and 138 such that the inlet ring 144 and 146 helps to define an opening through which air passes from the air paths 128 and 130 to the plurality of blades or impellers, 140' and 142' of each fan 140 and 142. As shown by the cross-sectional view of the inlet ring 144 and 146 in FIG. 22, the inlet ring 144 and 146 has an upwardly curved cross-sectional profile 148 that terminates into a sloped or curved edge 150. The configurations of the inlet ring profile 148 and its edge 150 help to reduce/minimize airflow resistance when the fans 140 and 142 draw air from the air paths 128 and 130 and the drawn-air then passes over the inlet ring 144 and 146 to the ports 136 and 138. As shown by arrow 92 in FIG. 22, airflow passes over the inlet ring 144 and 146 toward the edge 150 such that the fans 140 and 142 can draw air downward into the fan blades or impellers 140' and 142' with minimal airflow resistance. The configuration of the inlet ring 144 and 146 thereby helps to increase airflow to the ports 136 and 138 and into the fans 140 and 142.

Still referring to FIGS. 20 and 21, and with further reference to FIGS. 19A and 19B, the front panel 118 of the side air distribution unit 100 defines a ramp 152 along the width $W_1$ of the housing 102 below the front intake vents 120 and 122. The ramp 152 slopes upwardly toward the interior of the intake plenum 110 such that the vents 120 and 122 defined in the front panel 118 are ramped openings into the air paths 128 and 130. The ramp 152 is configured to help to minimize/reduce static air pressure in front of the intake vents 120 and 122 and to reduce air resistance and increase airflow into the air paths 128 and 130. The sloped configuration of the ramp 152 helps to give airflow momentum as the fans 140 and 142 draw air from the front of the side air distribution unit 100 into the respective air paths 128 and 130. The sloped ramp 152 thereby helps to increase the volume of air entering the air paths 128 and 130 and the total output of the unit 110.

Figure 23:
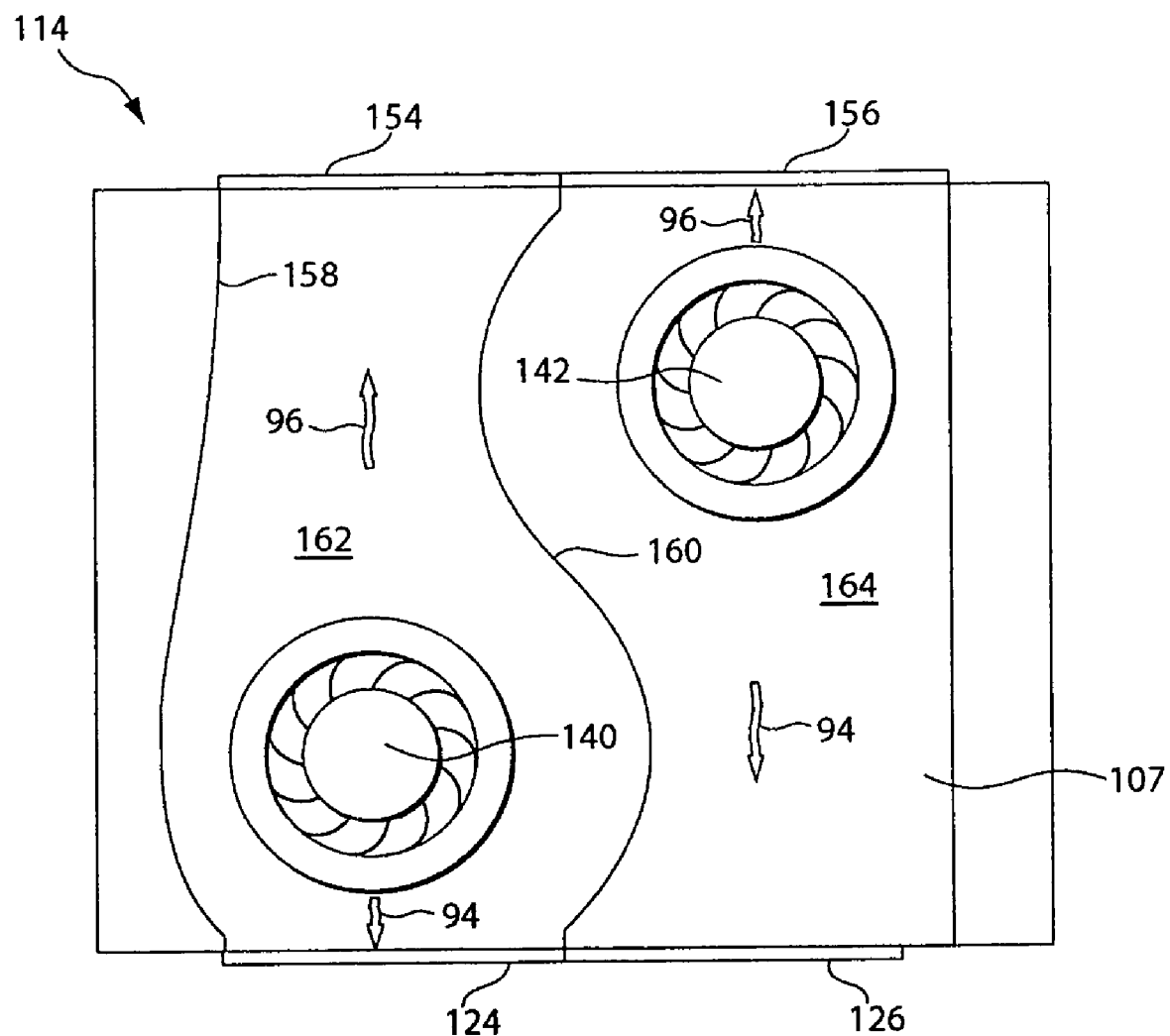
FIG. 23 is a top view of an exhaust plenum of any of the units shown in FIGS. 19A-19C and FIGS. 19F-19G.

As shown in FIGS. 20 and 21, the dividing walls 132 and 134 separate the intake plenum 110 into the parallel air paths 128 and 130. The walls 132 and 134 and the separate air paths 128 and 130 allow the operation of the fans 140 and 142 to be optimized separately with respect to each fan's 140 and 142 position within the unit 100 and its ability to draw cooling air into the intake plenum 110. Each fan 140 and 142 is positioned relative to the other fan to help to optimize/maximize flow of air each fan 140 and 142 draws from the front intake vents 120 and 122 into the intake plenum 110. The configuration and the location of each wall 132 and 134 help to minimize/reduce static air pressure along the front intake vents 120 and 122 and to increase/maximize flow of cooling air along each air path 128 and 130. In addition, as described below in further detail and as shown in FIG. 23, the exhaust plenum 114 includes one or more dividing walls 158, 159 and 150 to separate the exhaust plenum 114 into one or more parallel exhaust paths 162 and 164. The dividing walls 158, 159 and 160 and the separate exhaust air paths 162 and 164 of the exhaust plenum 114 similarly help to separately optimize the operation of each fan 140 and 142 with respect to its position within the unit 100 and its ability to force drawn-in cooling air through the exhaust paths 162 and 162 and from the left or the right side exhaust vents 124 and 126. Thus, the placement of the fans 140 and 142 and the configuration and location of the dividing walls 132 and 134 or 158, 159 and 160 help to separately optimize the operation of each fan 140 and 142 and to increase/maximize the total cooling air output of the unit 100.

Whether the operation of the fans 140 and 142 is optimized with respect to each fan's ability to draw cooling air into the unit 100 or to vent cooling air from the unit 100 can depend on areas of airflow resistance within the rack 14, for instance, along the front intake vents 120 and 122, and/or areas of back air pressure, for instance, along the exhaust air paths 162 and 164 or the left or the right side exhaust vents 124, 126 that have a significant effect on the total output of the unit 100. Each of the intake plenum 110 and the exhaust plenum 114 can be configured internally using the dividing walls 134, 138 and 158, 159 and 160 and placing the fans 140 and 142 accordingly to optimize/maximize airflow, e.g., cubic feet of air/minute (cfm), each fan 140 and 142 delivers to thereby optimize/maximize the total cooling air output of the unit 100. In one embodiment of the unit 100 according to the invention, the placement of the fans 140 and 142 within the unit 100 and the location and configuration of the walls 132 and 134 in the intake plenum 110 are used to help to optimize/maximize flow of cooling air into the intake plenum 110. In another embodiment of the invention, the fans 140 and 142 are placed and the walls 158, 159 and 160 are located and configured in the exhaust plenum 114 to help to optimize/maximize venting of cooling air from the exhaust plenum 114. In a further embodiment, the placement of the fans 140 and 142 and the configurations and locations of the walls 132, 134 and 158, 159 and 160 are used to help to optimize/maximize the operation of each fan 140 and 142 with respect its ability to draw cooling air and to vent cooling air from the unit 100.

As shown in FIGS. 20 and 21, an exemplary unit 100 according to the invention includes the two fans 140 and 142 as shown disposed in a staggered manner in relation to one another and as close to the front intake vents 120 and 122 as possible to help to optimize flow of cooling air into the intake plenum 110. The dividing walls 132 and 134 are disposed and configured to contain air each fan 140 and 142 draws into its air path 128 and 130 and to help to retain air proximate to each fan's blades or impellers 140' and 142'. In addition, the dividing walls 132 and 134 define the dimensions, e.g., length and width, of each air path 128 and 130 to help to induce airflow into the intake plenum 110 during operation of the fans 140 and 142. The shorter the air path 128 and 130 length $L_2$ and $L_3$, the less static air pressure and airflow resistance each fan 140 and 142 needs to overcome to draw an optimal flow of cooling air from the front intake vents 120 and 122, along its respective air path 130 and 128 and into its blades or impellers 140' and 142'. The width $W_2$ and $W_3$ of each front intake vent 120 and 122, and/or the width and length of each air path 128 and 130, can be adjusted to compensate for the length $L_2$ and $L_3$ of its respective air path 130 and 128. A wide front intake vent 120 and 122 helps to reduce static air pressure in front of the vents 120 and 122 and thereby helps to reduce airflow resistance and increase airflow along the length $L_2$ and $L_3$ of each air path 130 and 128. As shown in FIGS. 20 and 21, the front intake vent 120 that provides air to the left air path 130 has a larger width $W_2$ than the width $W_3$ of the intake vent 122 that provides air to the right air path 128 to accommodate the longer length $L_2$ of the right air path 130. The wider width $W_2$ of the back fan's 142 intake vent 120 helps to reduce static air pressure and airflow resistance the back fan 142 needs to overcome to draw sufficient cooling air from the front intake vents 120 and 122 into and along the right air path 130. The unit 100 shown in and described with reference to FIGS. 20 and 21 can be used, for instance, where static air pressure along the front intake vents 120 and 122 is problematic and has a significant effect on the total cooling air output of the unit 100.

Figure 24:
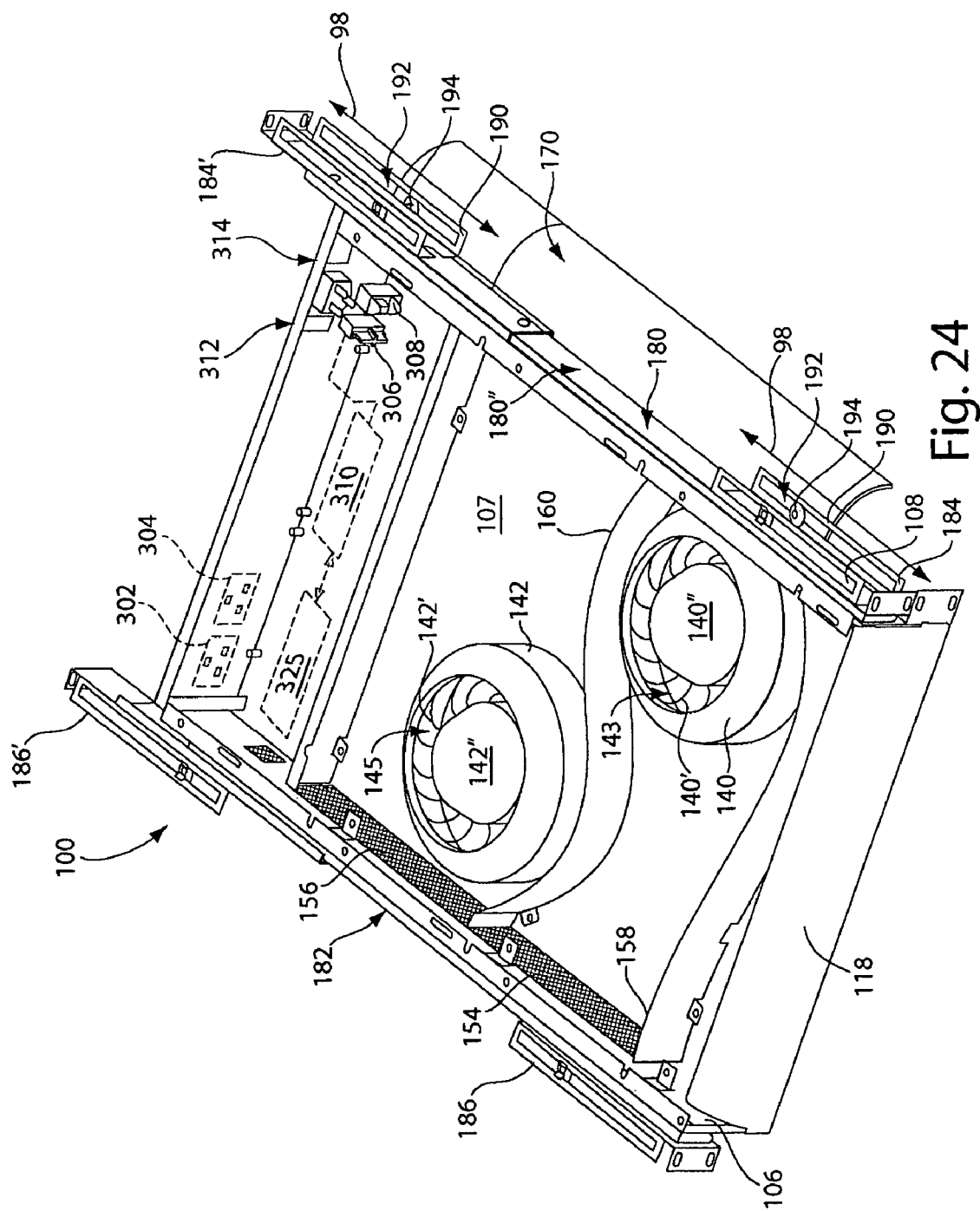
FIG. 24 is a perspective view of the exhaust plenum shown in FIG. 23 as a lower plenum of the unit shown in FIGS. 19A and 19C and FIGS. 19F-19G.

Referring to FIGS. 23 and 24, and with further reference to FIG. 19A, a top view and a perspective view of the exhaust plenum 114 with the front and the back fans 140 and 142 disposed therein are provided. The fans 140 and 142 can be positioned in the exhaust plenum 114 in an offset manner in relation to one another and are disposed and configured to deliver cooling air to the left side exhaust vents 154 and 156 that vent to the left side 45 of the rack 14, or to the right side exhaust vents 124 and 126 that vent to the right side 47 of the rack 14, as needed. The fans 140 and 142 are configured to be mounted or connected to the bottom panel 107 of the housing 102, and are configured for radially outward airflow. The one or more dividing walls 158, 159 and 160 are mounted and/or connected to the bottom panel 107 and/or the side panels 106 and 108 of the housing 102 to divide the plenum 114 into separate exhaust air paths 162 and 164. With this arrangement, the only openings in the exhaust plenum 114 for air are the side exhaust vents 124, 126 and 154, 156. Using the blocking panel (not shown) to block either the left or the right side exhaust vents, the openings are further limited to vent airflow from the left or the right vents 124, 126 or 154, 156.

The dividing walls 158, 159 and 160 configure each air path 162 and 164 to receive and isolate cooling air vented from one fan from cooling air vented from the other fan. In addition, the dividing walls 158, 159 and 160 are positioned and configured to help to direct a stream of cooling air vented from each fan 140 and 142 toward its respective side exhaust vent 124, 126 or 154, 156, and to minimize/reduce any turbulent air zones or other impedance to flow of cooling air along the exhaust air path 162 and 164.

Further, the dividing walls 158, 159 and 160 are positioned and configured such that the unit 100 is configured to optionally deliver cooling air either to the left side 45 or the right side 47 of the rack 14, as needed. As shown in FIGS. 23 and 24, the exhaust air paths 162 and 164 are defined by the dividing walls 158, 159 and 160 such that each exhaust air path 162 and 164 can help to direct air toward the right exhaust vents 124, 126 or toward the left exhaust vents 154, 156. The configuration of the exhaust paths 162 and 164 provides flexibility to the unit 100 that allows the unit 100 to be used for delivery of cooling air to the left side 45 of the rack 14 and the right side of the rack 14, as needed.

The fans 140 and 142 are configured to be mounted or connected to the bottom panel 107, e.g., with screws, and in alignment with the ports 136 and 138 of the midplate 112 when the midplate 112 is connected, e.g., by screws or fasteners, to the side panels 106 and 108 and the back panel 109 of the housing 102. The fans 140 and 142 are also configured to receive air flowing through the ports 136 and 138, as described above.

Further, the fans 140 and 142 are configured to rotate about the respective hubs 140" and 142", which include internal motors (not shown), wherein the plurality of blades or impellers 140' and 142" rotates relative to the hubs 140" and 142". The motors are configured to rotate the impellers 140' and 142' in a clockwise direction when viewed from above, as in FIGS. 21 and 23. The plurality of fan blades or impellers 140' and 142' can include rings of blades or impellers, as shown, angled relative to a radial direction of the fans 140 and 142 such that rotation of the rings by the motors will draw air through the ports 136 and 138 into internal regions 143 and 145 of the fans 140 and 142 that are in fluid communication with the ports 136 and 138. The rotation of the fans 140 and 142 will force the drawn-in air out of the fans 140 and 142 from the internal regions 143 and 145 and radially outward into the air paths 162 and 164, as indicated by arrows 94 and 96 in FIG. 24. The internal regions 143 and 145 span areas at least as large as areas spanned by the ports 136 and 138 such that air will flow only, or substantially only, into the exhaust plenum 114 through the ports 136 and 138. The fans 140 and 142 may be backward impeller-type fans such as those available from EBM of Farmington, Conn. or Soler & Palau (S&P) of Pine Brook, N.J., although numerous other fans including fans made by other manufacturers are acceptable and can be used as the fans 140 and 142.

Still referring to FIG. 24, and with further reference to FIG. 19B, where the intake plenum 110 is the lower plenum and the exhaust plenum 114 is the top plenum, the fans 140 and 142 are configured to be mounted or connected either to the midplate 112 or to the top panel 104, e.g., with screws, of the housing 102. The fans 140 and 142 are connected or mounted to the midplate 112 or the top plate 104 such that each fan 140 and 142 is in alignment with one of the ports 136 and 138 of the midplate 112. A portion of each fan 140 and 142 is received by one of the ports 136 and 138 to place the fan 140 and 142 in fluid communication with the lower intake plenum 110. In this case, each fan 140 and 142 is disposed such that the plurality of fan blades or impellers 140' and 142" and the fan hub 140" and 142" are oriented in a downward manner in facing relation to the lower intake plenum 110. When each fan 140 and 143 rotates, the fan 140 and 142 can draw air up into its internal regions 143 and 145. Drawn-in air is then forced from the fan 140 and 142 in a radially outward direction through the upper exhaust plenum 114 to the exhaust vents 124, 126 or 154, 156.

Depending on the cooling airflow requirements of the side-to-side components 18, e.g., minimum cubic feet of air/minute (cfm) required to maintain a required or desired operating temperature, and/or the type and the rack location of such components 18, each fan 140 and 142 can be selected with respect to its rating and a range of cfm the fan 140 and 142 can deliver to the components 18 during its operation within the unit 100. The height $H_1$ of the side air distribution unit, e.g., 2U, 3U, 4U or 5U, can be sized to accommodate an appropriately-sized/rated fan 140 and 142 that can deliver airflow within a required or desired range of cfm.

In an exemplary embodiment of the unit 100 according to the invention, as shown in FIGS. 23 and 24, each of the two fans 140 and 142 can have a rating of about 270 cfm and can be disposed within the unit 100 having a height $H_1$ of 2U, which accommodates the fan size/rating. Each fan 140 and 142 can deliver airflow to one or more side-to-side components 18 within a required or desired range, e.g., from 0 to about 300 cfm, to provide cooling air sufficient to help to meet the cooling requirements of the side-to-side components 18. In another embodiment, each of the two fans 140 and 142 can be rated at about 500 cfm to deliver airflow within a range of from 0 to about 700 cfm. In alternative embodiments of the unit 100 according to the invention, a single fan or more than two fans can be disposed in the exhaust plenum 114 to provide airflow within a required or desired range of cfm such that the unit 100 provides sufficient cooling air to help to meet the cooling requirements of specific types of side-to-side components 18. The invention is not limited with respect to the number, the size or the rating of each fan 140 and 142 that can be used within the unit 100 to provide cooling air to one or more side-to-side components 18, and anticipates that each side air distribution unit 100 can be configured and arranged to house one or more appropriately-sized/rated fans that can deliver cooling air in a required or desired range of cfm sufficient to at least help to meet the cooling requirements of the side-to-side components 18.

In addition, in further embodiments of the unit 100 according to the invention, one or more fans 140 and 142 can be independently operated to adjust, e.g., increase or decrease, a range of cfm the unit 100 delivers to the side-to-side components 18. In one embodiment, an operator can adjust the range of cfm of each fan 140 and 142 manually, e.g., by manually setting the speed of each fan 140 and 142 to a set point speed, that provides a required or desired airflow rate (cfm). In an alternative embodiment, as described below in further detail, the range of cfm of each fan 140 and 142 can be monitored and controlled independently through electronic control means that can automatically monitor and adjust operation of each fan 140 and 142, e.g., fan speed, in response to any of a number of process variables, e.g., temperature of the side-to-side components 18, to deliver and maintain a required or desired airflow rate (cfm) during operation of the unit 100. The invention is not limited in this respect, and anticipates that the fans 140 and 142 can be independently monitored and controlled through various electrical and/or electronic monitoring and control means in response to various parameter set points and/or process variables to help to deliver and maintain airflow sufficient to meet the cooling requirements of one or more side-to-side components 18.

Further, placement of the side air distribution unit 100 within the rack 14 in relation to one or more side-to-side components 18 can help to increase/maximize flow of cooling air along the intake vents 14A and 14C of the components 18. For instance, placing the unit 100, configured as shown in FIGS. 19A and 19B including the fans 140 and 142 having a rating of about 270 cfm, can deliver airflow either above or below one or more side-to-side components 18 in a range of from 0 up to about 300 cfm. In another instance, placing the unit 100 above a side-to-side component 18 and a second unit 100 below the side-to-side component 18 can help to increase/maximize the total airflow (cfm) available to the component 18 for cooling. The invention is not limited in this respect, and anticipates that any number of side air distribution units 100, with any number of fans providing any range of cfm, can be used in the rack 14 and disposed in relation to one or more side-to-side components 18 to help to provide sufficient cooling air to the components 18 such that the cooling air requirements of each component 18 can be at least minimally met.

Figure 19C:
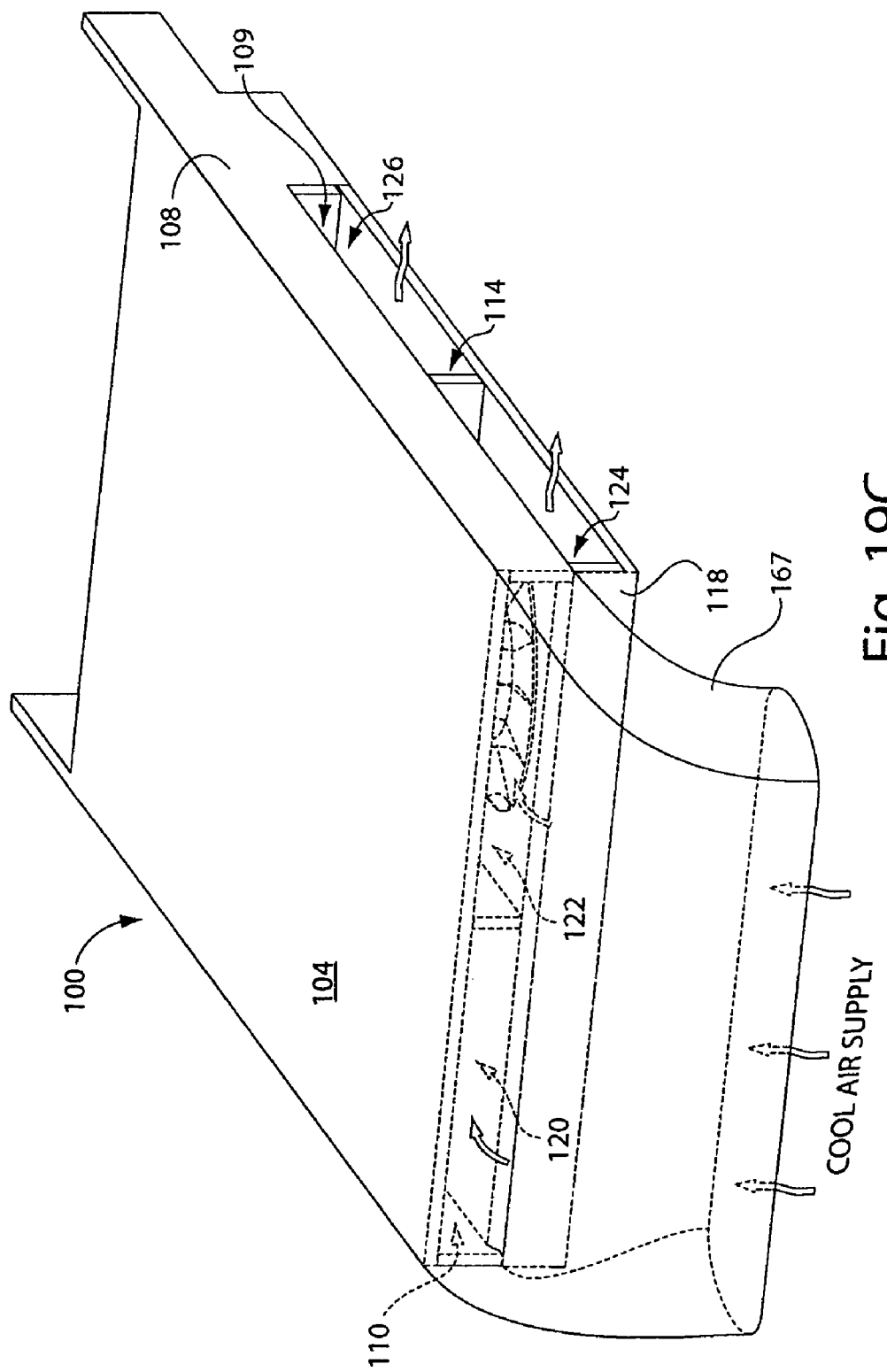
FIG. 19C is a perspective view of any of the units shown in FIGS. 19A and 19B with an air intake tube or boot.

Referring to FIG. 19C, in further embodiments of the side air distribution unit 100 according to the invention, the unit 100 can include the front intake vents 120 and 122 defined along the front panel 118 of the housing 102 and configured to couple with an air intake boot 167. The air intake boot 167 is configured to removably mount or connect to the front panel 118 in fluid communication with the front intake vents 120 and 122, and further configured to help to facilitate flow of air through the intake vents 120 and 122 into the intake plenum 110. In one embodiment, the boot 167 can define a configuration similar to the configuration of the hood-like member 71 described above with reference to FIG. 17. As shown in FIG. 19C, in another embodiment, the boot 167 can be configured as an air tube that defines an interior chamber and is configured to help to direct flow of air into the intake vents 120 and 122. The tube 167 can be connected to a cool air supply, such as a raised floor configuration 67 described above with reference to FIG. 16, or a cool air unit or refrigeration system. The tube or boot 167 can help to increase the volume and/or the rate of flow of cooling air into the unit 100 and to thereby help to optimize/maximize the total cooling air output of the unit 100. The air intake tube or boot 167 according to the invention is not limited with respect to its dimensions or the configuration or shape it defines other than it is configured to help to collect air along the front intake vents 120 and 122 and/or to help to facilitate flow of air into the intake plenum 110.

Figure 19D:
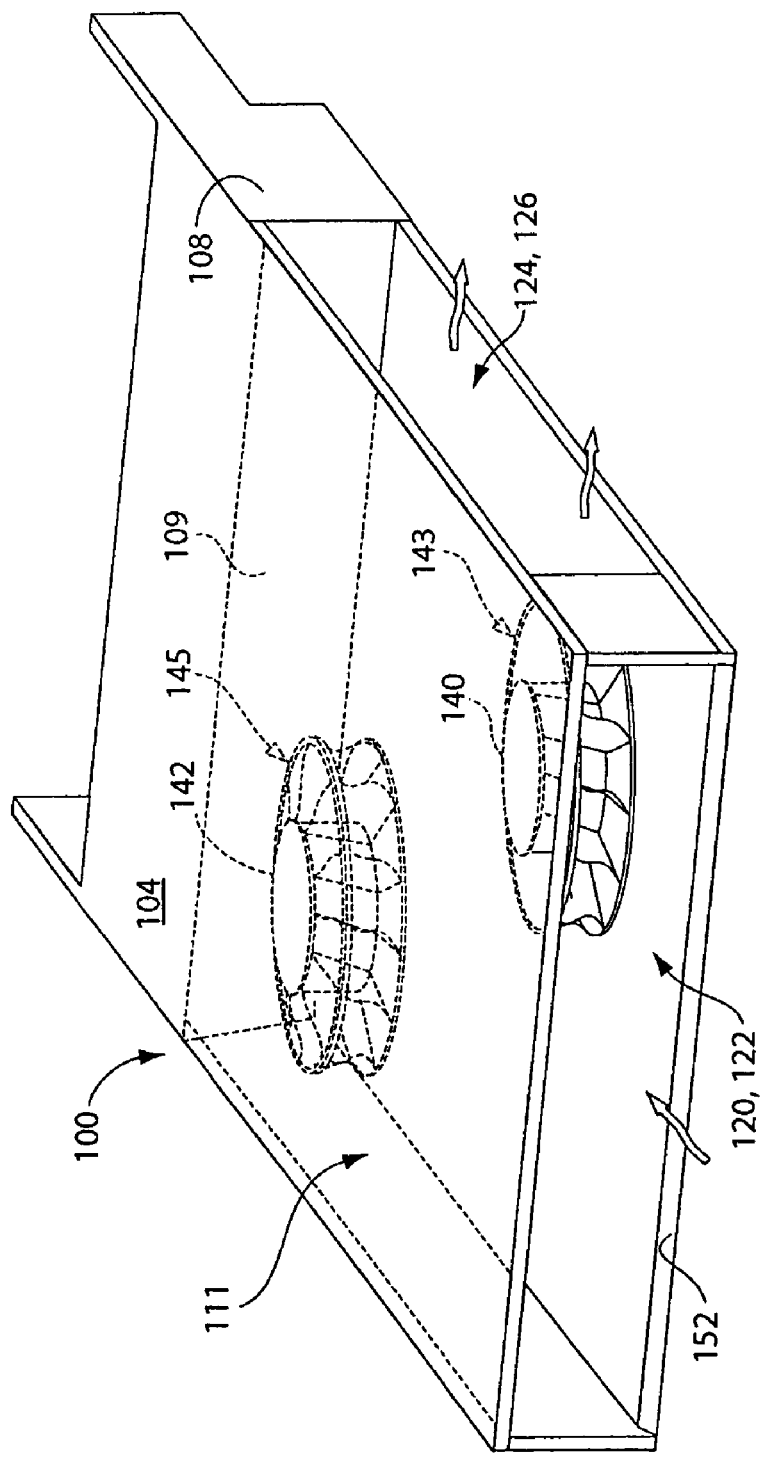
FIGS. 19D and 19E are a perspective view and a top view, respectively, of a side air distribution unit according to a further embodiment of the invention.
Figure 19E:
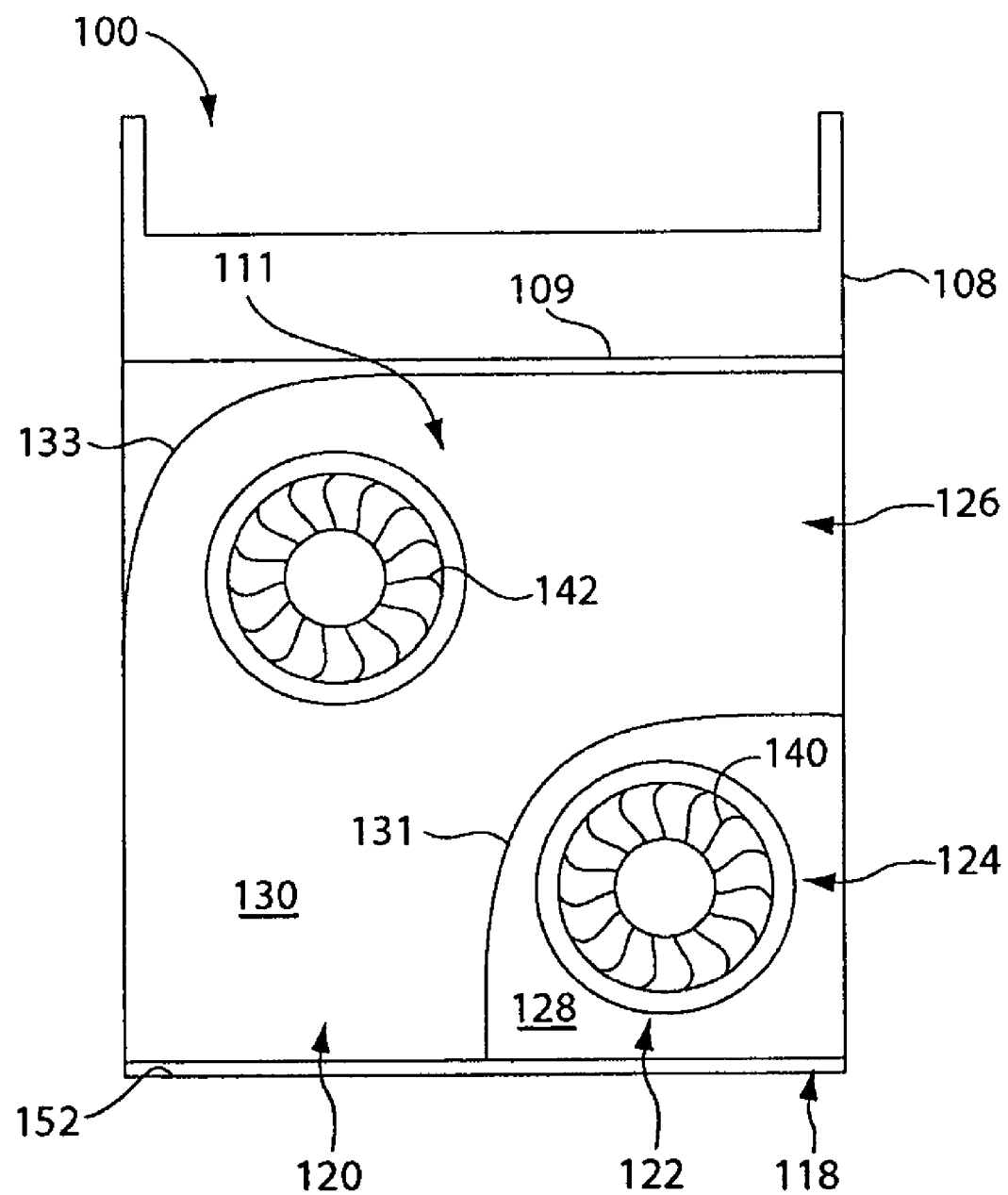

Referring to FIGS. 19D and 19E, in an alternative embodiment of the side air distribution unit 100 according to the invention, the unit 100 can include a single plenum 111 that serves as an intake plenum and an exhaust plenum. One or more fans 140 and 142, as described above, can be mounted or connected to the bottom panel 107, e.g., with screws, and further disposed to draw air from the front intake vents 120 and 122. As each fan 140 and 142 rotates, it draws in air from the intake vents 120 and 122 into the plenum 111 and into its internal region 143 and 145 and then forces the drawn-in air from the internal region 143 and 145 radially outward through the side exhaust vents 124, 126 or 154, 156. As shown in FIG. 19E, the single plenum 111 can be further defined using one or more dividing walls 131 and 133 to define an air path for each fan 140 and 142 that can be configured to help to optimize/maximize the volume and/or the rate of airflow into the air path and/or to help to optimize/maximize the outward airflow vented from the fans 140 and 142 to the exhaust vents 124, 126 or 154, 156. The unit 100 having the single plenum 111 can be used in combination with the air intake tube or boot 167 described above with reference to FIG. 19C to help to increase the volume and/or the rate of airflow into the single plenum 111.

Figure 19F:
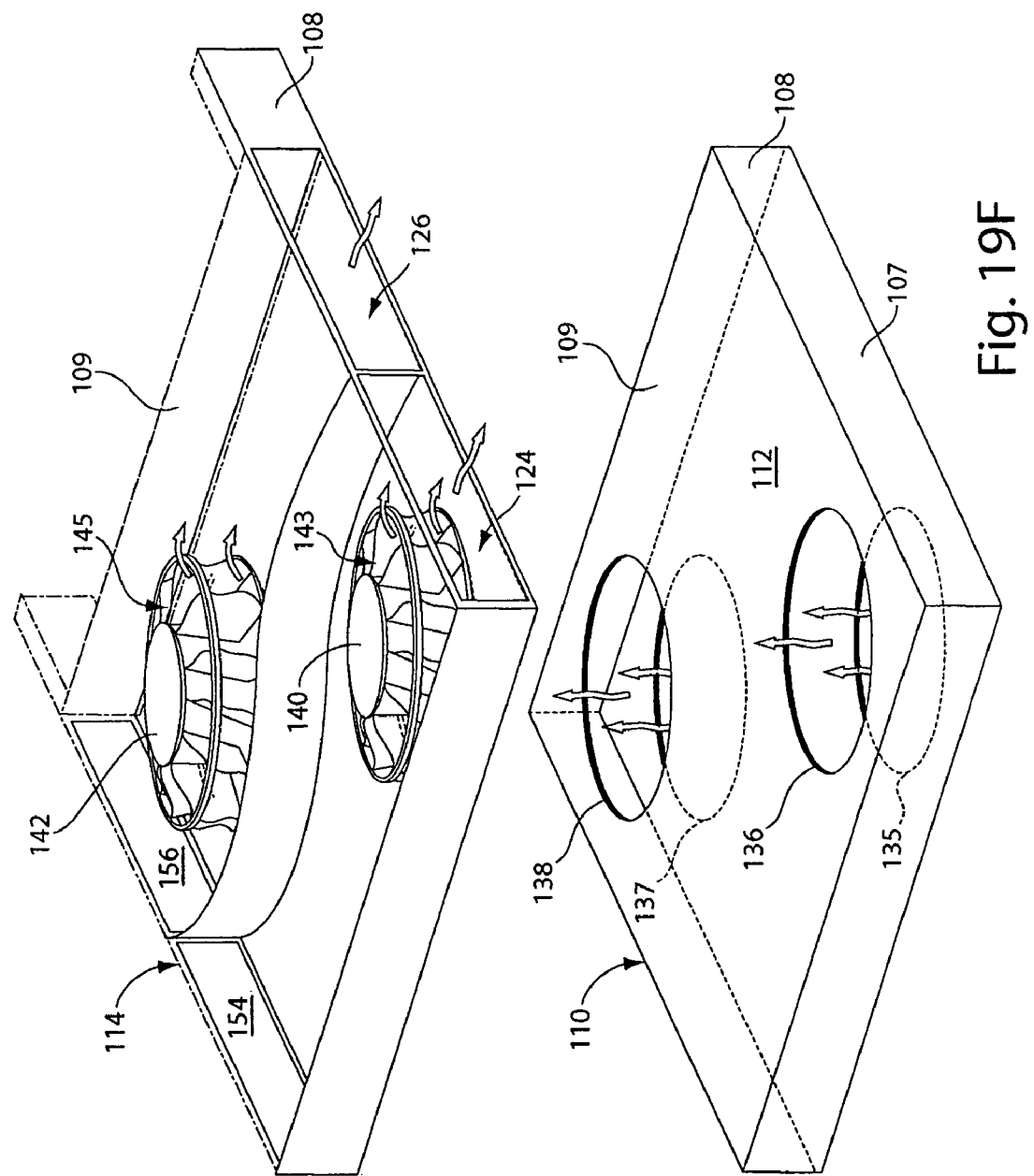
FIGS. 19F and 19G are perspective views of a side air distribution unit according to yet another embodiment of the invention.
Figure 19G:
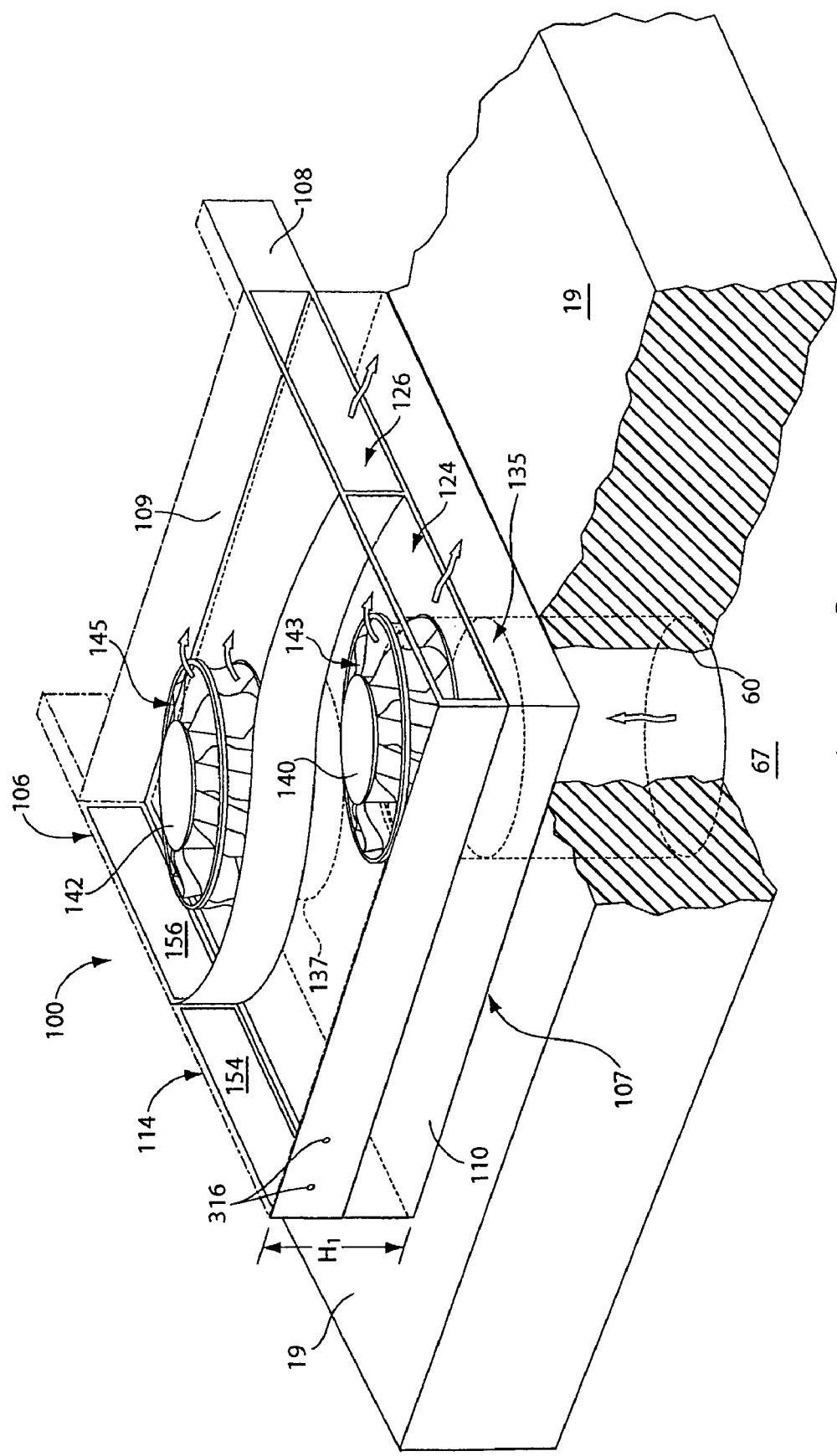

Referring to FIGS. 19F and 19G, in a further embodiment of the side air distribution unit 100 according to the invention, the unit 100 can be configured to be rack-mounted along the bottom U space of the rack 14 and can be further configured and arranged to draw air to the rack 14 through the bottom panel 107 of the unit housing 102. In this case, the exhaust plenum 114 is the upper plenum and the intake plenum 110 is the lower plenum whereby the lower intake plenum 110 is configured and arranged to permit the fans 140 and 142 to draw air from the bottom panel 19 of the enclosure 10 or from the bottom of the rack 14, as described above with reference to FIG. 16. In this case, the fans 140 and 142 are mounted or connected to the midplate 112, e.g., with screws, such that the fan blades or impellers 140' and 142' and the fan hubs 140" and 142" are oriented in a downward manner in facing relation to the bottom panel 107 of the housing 102 such that when the fans 140 and 142 rotate the fans 140 and 142 can draw air from the lower intake plenum 110 up into the internal regions 143 and 145 of the fans 140 and 142. Thereafter, the fans 140 and 142 force air from the internal regions 143 and 145 through the upper exhaust plenum 144 to the exhaust vents 124, 126 or 154, 156.

As shown in FIG. 19F, the bottom panel 107 of the housing 102 can define one or more intake vents or ports 135 and 137 from which the fans 140 and 142 draw air into the intake plenum 110. In one embodiment, the intake ports 135 and 137 can be defined along the bottom panel 107 of the unit 100 and configured to align with the openings in the bottom panel 19 of the enclosure 19, in those cases in which the rack 14 is disposed within the enclosure 10. The intake ports 135 and 137 are further aligned with the ports 136 and 138 of the unit midplate 112 such that the intake ports 135 and 137, the midplate ports 136 and 138 and the fans 140 and 142 are in alignment. Such arrangement permits the fans 140 and 142 to draw air from the intake ports 135 and 137 into the intake plenum 110 and the internal regions 143 and 145 of the fans 140 and 142 from which the drawn-in air is forced through the side exhaust vents 124, 126 or 154, 156. With this configuration, the unit 100 can be used in combination with the raised floor configuration 67, described above with reference to FIG. 16, which includes an air cooling unit or refrigeration system to supply cool air to the raised floor 67. As shown in FIG. 19G, the intake ports 135 and 137 of the unit 100 can be further configured to couple with the one or more ducts 60 shown in FIG. 16 that connect to one or more vents of the raised floor configuration 67 in order to receive cool air from the raised floor and to direct cool air through the intake ports 135 and 137. Drawing cooling air from the intake ports 135 and 137 into the intake plenum 110 eliminates static air pressure that can occur along the front intake vents 120 and 122 of the unit 100, as described with reference to FIGS. 19A and 19B, and can affect the flow of air into the unit 100, as well as the total output of the unit 100. In addition, the height $H_1$ of the unit 100 can be reduced when configured for placement along the bottom U space of the rack 14.

Figure 24A:
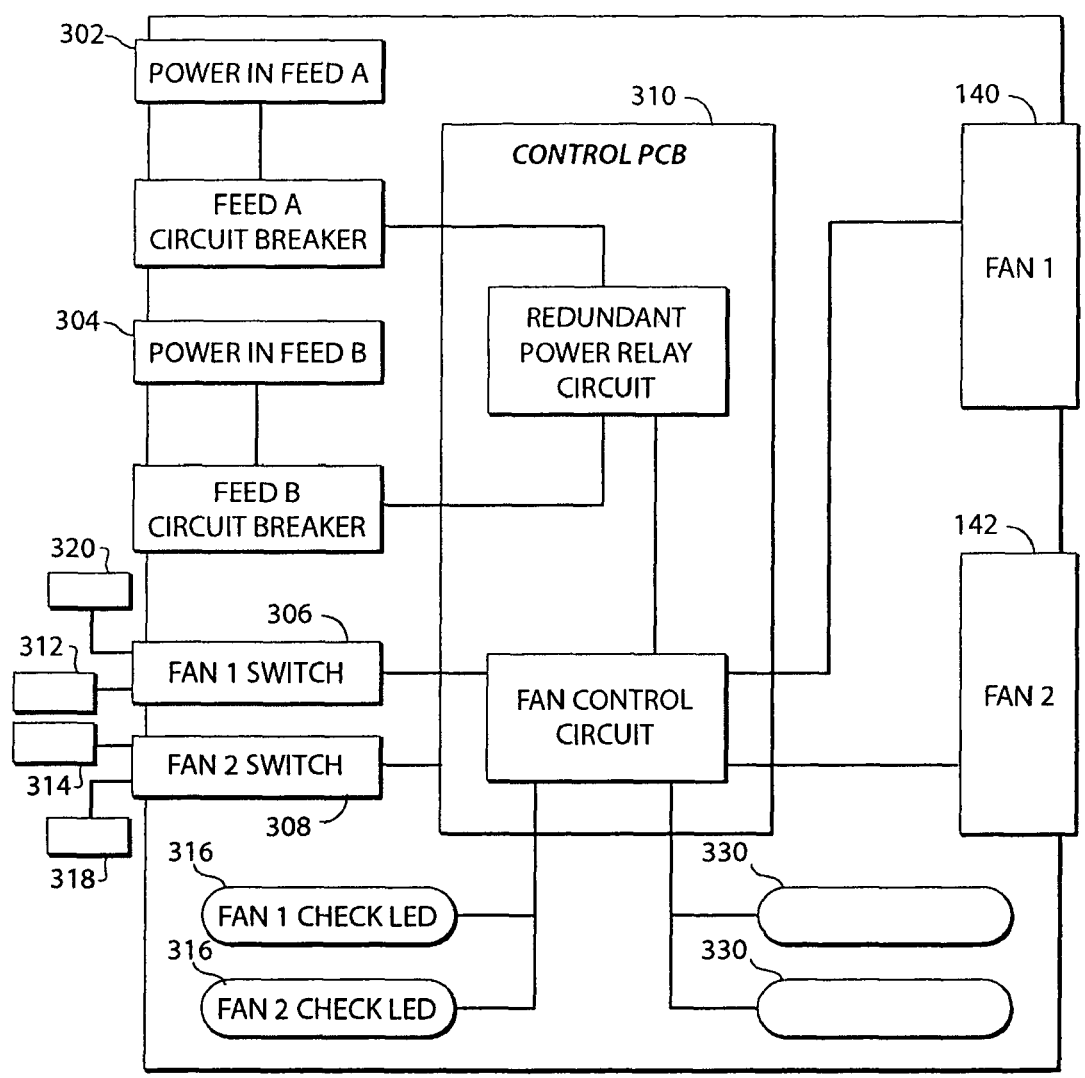
FIG. 24A is a circuit diagram of control circuitry of any of the units shown in FIGS. 19A-19G.

Referring to the schematic circuit diagram of FIG. 24A, and with further reference to FIG. 24, to supply power to the fans 140 and 142, the housing 102 can include dual power input having two power ports 302 and 304 to provide electrical redundancy. The two power ports 302 and 304 are connected to two switches 306 and 308 via control circuitry 310 (shown in phantom in FIG. 24). The control circuitry 310 couples each switch 306 and 308 to one of the fans 140 and 142. In one embodiment, the control circuitry 310 and the switches 306 and 308 can be disposed in the housing 102. The power ports 302 and 304 are configured to receive power cord connectors, e.g., standard three-prong connectors, or other connectors as appropriate for the power being supplied.

The control circuitry 310 can include a redundant power relay circuit and a fan control circuit to connect, for instance, the ports 302 and 302 to the fan switches 312 and 314. While the specifics of the redundant power relay circuit and the fan control circuit are not shown in FIG. 24A or disclosed herein, such circuits are well known to those of ordinary skill in the art. The control circuitry 310 is configured to connect to one of the ports 302 and 304 to the two switches 306 and 308 in a normal mode. Actuating/de-actuating buttons 312 and 314 for turning the fans 140 and 142 on and off can be associated with the fan switches 306 and 308. Actuation of the buttons 312 and 314 causes the fan switches 306 and 308 to close and thereby to couple the control circuitry 310 to the fans 140 and 142 to provide electrical power when the side air distribution unit 100 is powered up. De-actuation of the buttons 312 and 314 causes the fan switches 306 and 308 to break the circuitry 310 coupled with the fans 140 and 142. For instance, de-actuating one of the buttons 312 and 314 can break the circuitry coupled to one of the fans 140 and 142 to thereby reduce the total airflow (cfm) the unit 100 provides when, for instance, certain side-to-side component(s) 18 require less airflow for cooling. The switches 306 and 308 and the respective buttons 312 and 314 can thereby be used for selecting which, or both, of the fans 140 and 142 will operate when the side air distribution unit 100 is powered up. Pressing on the button 312 and 314 will actuate/de-actuate the respective switches 306 and 308.

The control circuitry 310 is further configured to detect a failure in power supply and to switch via the redundant power relay circuit and/or the fan control circuit between alternate power sources. The control circuitry 310 can be configured to detect a failure in power supply, for instance, from the port 302 and, in response, to couple the port 304, e.g., connected to an alternate power source, to the switches 306 and 308 to supply power from the port 304. As shown in FIGS. 19 and 24A, one or more indicator lamps or LED displays 316 disposed along the front panel 118 of the housing 102 can indicate the detection of a power supply failure and/or the port 302 and 304 from which power is being supplied to the unit 100. Each indicator lamp or LED display 316 can indicate the status of one of the fans 140 and 142. In one embodiment, an indicator lamp 316 can display a green light to indicate the respective fan 140 and 142 is receiving power, a red light to indicate fan failure, a motor has failed or a fuse has blown, and no light to indicate that the respective fan 140 and 142 is not receiving any power. Other types of indicators are within the scope of the electrical circuitry of the unit 100 according to the invention to provide the information noted above and/or to provide different and/or additional information with respect to the status and operation of the fans 140 and 142. In addition, the circuitry 310 is further configured to provide dual independent fusing of the fans 140 and 142, such that if one of the fans 140 and 142 fails, then only the other of the fans 140 and 142 will receive operating power.

Figure 24B:
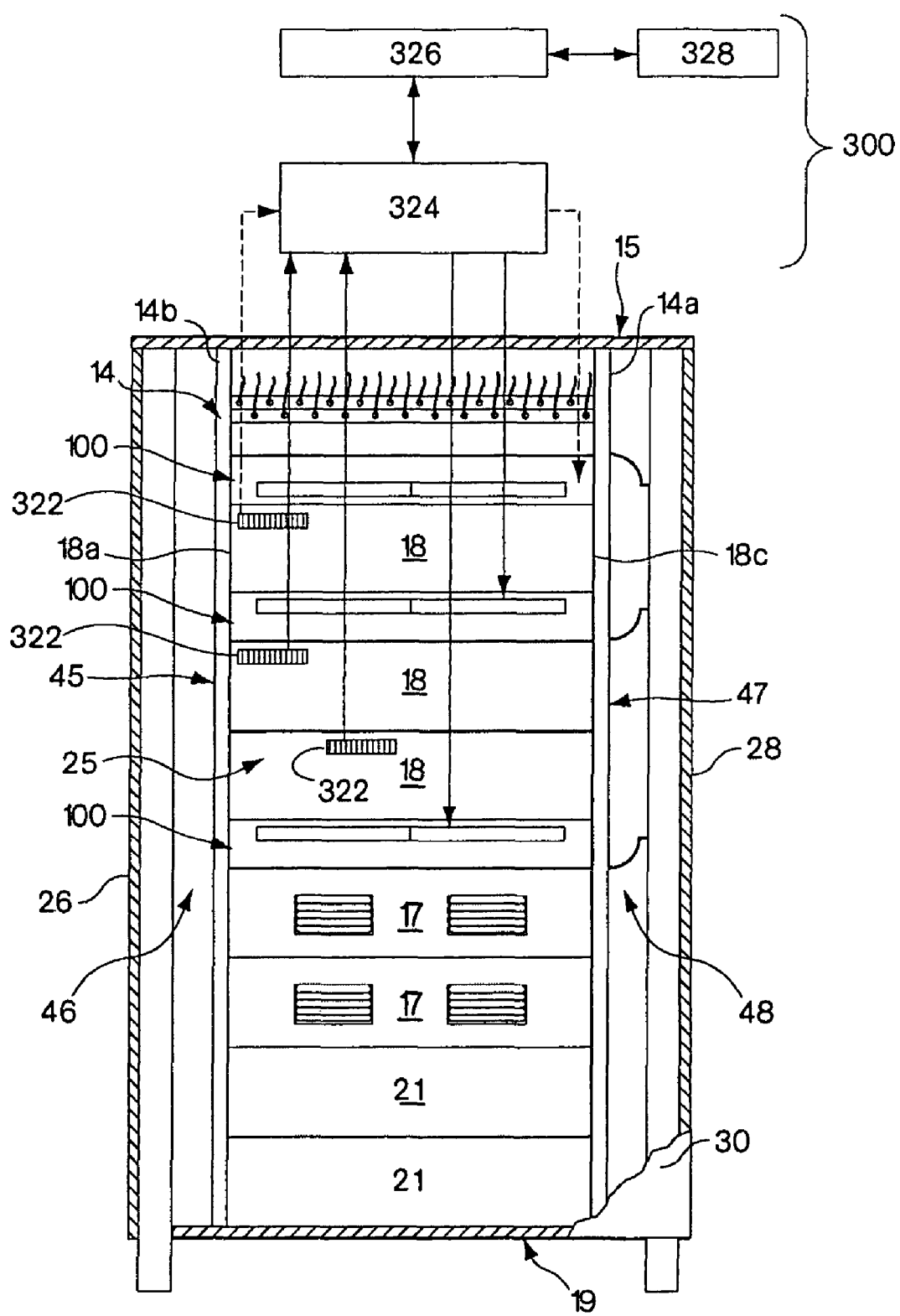
FIG. 24B is a schematic diagram of a control system for use with any of the units shown in FIGS. 19A-19G.

As noted above, the fans 140 and 142 can be monitored and controlled independently through electronic control means that can automatically monitor and adjust the operation of each fan 140 and 142 in response to airflow and/or other requirements. In one embodiment, speed of each fan 140 and 142 can be independently controlled to maintain a required or desired airflow rate (cfm) of the side air distribution unit 100 in response to one or more set point parameters and/or one or more measured process variables. Referring to FIG. 24B, and with further reference to FIGS. 24 and 24A, in one embodiment, one or more side air distribution units 100 disposed within the rack 14 are operatively coupled to a fan speed control system 300 that can automatically and independently control the speed of each fan 140 and 142 in each unit 100 in response to one or more set points and/or measured variables. For instance, the speed of each fan 140 and 142 can be controlled in response to actual fan speed relative to a set point speed, e.g., set manually on the fan 140 and 142 or set automatically through electronic control means. In another instance, fan speed can be adjusted and controlled in response to the thermal output or the hot/warm exhaust airflow vented from the side-to-side components 18 by monitoring/measuring the power load or the electrical current/power drawn by the components 18. In further instances, fan speed can be adjusted and controlled in response to changes in cooling airflow the side air distribution unit 100 delivers by monitoring/measuring changes in air pressure proximate the side exhaust vents 124, 126 or 154, 156 of the unit 100. Fan speed can also be adjusted and controlled in response to temperatures within the enclosure 10 and along either side 45 and 47 of the rack 14 by monitoring/measuring temperatures of air drawn-in by the side-to-side components 18 for cooling. The invention is not limited with respect to the set point(s) and/or the process variable(s) used to monitor and measure the performance of the side air distribution unit 100 and to adjust and control the speed of each fan 140 and 142 to thereby adjust and control the total cooling air output of the unit 100. By way of example, and for purposes of disclosure of at least one embodiment of the invention including the fan speed control system 300, the control system 300 and the unit 100 are described below with respect to monitoring or measuring the thermal output or the power load of the side-to-side components 18 to control the fan speed and total output of the unit 100.

With further reference to FIG. 24A, the fan speed control system 300 can operate based on the power load of or the electrical current drawn by the side-to-side components 18 within the rack 14. The power load of the components 18 relates to the thermal output, e.g., hot/warm exhaust air, produced by the components 18 during operation. In one embodiment, the fan speed control system 300 can operate in a manual and/or semi-manual mode whereby an operator can determine empirically a thermal output or power load of each of the side-to-side components 18 and the corresponding cooling airflow requirements (cfm) of such components 18. The corresponding fan speeds can then be calculated to provide a cooling airflow rate for each fan 140 and 142 within a required or desired range of cfm. The fan speed control system 300 can include speed selectors 318 and 320 for each of the fans 140 and 142 whereby each speed selector 318 and 320 is coupled by the control circuitry 310 to its respective fan 140 and 142, as shown in FIG. 24A. The speed selectors 318 and 320 are configured to permit a user to manually select a set point speed setting for each, or for both, of the fans 140 and 142.

Still referring to FIGS. 24A and 24B, in another embodiment, the control system 300 can be configured to automatically set fan speed and to automatically monitor, adjust and/or control fan speed with respect to the thermal output or power load of the side-to-side components 18. The control system 300 can include one or more monitoring/measuring devices 322 disposed within the rack 14 and configured to monitor/measure a power load of the side-to-side component 18. The one or more monitoring/measuring devices 322 can include, for instance, one or more current or voltage sensors, or can include a switched rack PDU that can measure aggregate power drawn by the rack equipment 17 and/or 18, such as the switched rack PDU Model No. AP7900 or AP7901 available from American Power Conversion of Billerica, Mass. The monitoring/measuring devices 322 can be disposed within the rack 14 or along the rack 14 such that the devices 322 can monitor/measure electrical current drawn by each component 18 and/or a group of the components 18. The control system 300 can further include a programmable controller 324, such as a programmable microprocessor or a PC-type computer, to provide automatic fan speed selection or set point and to provide automatic fan speed monitoring, adjustment and control. For instance, in one embodiment, the one or more current or voltage sensors 322 are operatively coupled to the controller 324, and are configured to monitor/measure electric current drawn by the components 18 at any given time during operation to provide one or more values of the power load of each component 18 or a group of components 18. The sensors 322 can be further configured to transmit one or more signals representative of measured power load values to the controller 324. The controller 324 can be configured to receive the signals from the sensors 322. The controller 324 can be further programmed with various standards or values of one or more process variables, such as power load values and corresponding airflow rates (cfm) that the controller 324 uses to calculate an appropriate response to measured/known thermal outputs of the side-to-side components 18. As shown in FIG. 24A, in response to receipt of one or more signals from the sensors 322, the controller 324 can transmit one or more speed-control signals to the speed selectors 318 and 320 of the control circuitry 310 and/or to a signal input 330 of each fan 140 and 142 to set and/or adjust fan speed to provide an airflow rate within a required range of cfm that corresponds to the measured/known thermal outputs of the side-to-side components 18. The controller 324 can be programmed to set and/or adjust fan speed of each fan 140 and 142 independently and separately from other fans, or to set and/or adjust speed of both fans 140 and 142 simultaneously. In addition, the controller 324 can be further programmed to set and/or adjust fan speed of the fans 140 and 142 of each side air distribution units 100 independently and separately from other units 100 disposed within the rack 14.

In one embodiment, the controller 324 includes a programmable microprocessor configured and arranged for mounting within the housing 102 of the side air distribution unit 100, as shown in phantom in FIG. 24. In an alternative embodiment, the programmable microprocessor 324 can be located external to the unit 100, or remotely from the unit 100 outside the equipment room or data center. In a further embodiment, as shown in FIG. 24B, the programmable microprocessor 324 can be operatively coupled to a remote control system 328, e.g., a computer, through an interface 326 wherein the computer 328 is configured and programmed to set, monitor, adjust and/or control fan speed in response to monitored/ measured power load values that the one or more sensors 305 transmit to the computer 328, e.g., through the microprocessor 325 and the interface 326. The computer 328 can be programmed with an alert capability such that when one or more fans 140 and 142 or one or more units 100 are not operating, e.g., due to a power failure, or are not delivering a required rate of cooling airflow (cfm), e.g., as indicated by a measured increase in power load, the alert capability is enacted. The alert capability can be configured to provide an alarm, e.g., an indicator lamp or LED readout 316 on the unit 100 or a visual or audible alarm at the computer 328, to notify an operator that one or more fans 140 and 142 and/or one or more units 100 are not providing cooling air at a set point rate or within a range of cfm sufficient to meet the cooling requirements of the side-to-side components 18.

As those of ordinary skill in the art can appreciate, the control system 300 can be configured, and the controller 324 and/or the remote computer 328 can be programmed, to monitor/measure any set point(s) and/or process variable(s) affecting the performance of the side air distribution unit 100 and the operation of the fans 140, and to adjust and control the airflow output of the unit 100 in response to such feedback.

With further reference to FIG. 18, the side air distribution unit 100 can be further configured such that an external portion of the unit 100 removably mounts or connects an air-directing device 168 to either side panel 106 and 108 of the housing 102. The air-directing device 168 is configured and arranged to receive cooling airflow from one or both of the left or the right side exhaust vents 124, 126 or 154, 156 of the unit 100. As shown in FIG. 18, the air-directing device 168 can be configured and arranged such that it can be mounted to the housing 102 to direct or channel flow of cooling air in either an upward direction or a downward direction along the left or the right side 45 and 47 of the rack 14. The air-directing device 168 can be further configured to help to broaden and expand a stream/curtain of cooling air as it vents from the unit 100 to thereby slow and diffuse the stream of air as it flows along either side 45 and 47 of the rack 14. The intake vents 18C of the side-to-side components 18 can more easily draw-in air from a slower and more diffuse airflow. In addition, the air-directing device 168 can be further configured to receive a stream/curtain of cooling air as it vents from the unit 100 and to diffuse the stream/curtain into multiple streams of cooling air to further slow and diffuse airflow alongside the rack 14. The air-directing device 168 thus is configured to direct cooling airflow in an upward or downward direction and to help to slow and/or diffuse airflow alongside the rack 14 to deliver useable cooling air to the intake vents 18C of the components 18. Further, in an alternative embodiment, the air-directing device 168 can be configured and arranged to removably mount or connect to the rack 14 such that the air-directing device 168 is disposed adjacent or proximate to the side exhaust vents 124, 126 and 154, 156 of the unit 100, and can be further configured and arranged to remain mounted to the rack 14 when the unit 100 is removed. The invention is not limited with respect to the type, size and/or configuration of the air-directing device 168 other than such device defines a configuration or shape that can help to expand and/or restrict a stream/curtain of cooling air vented from the unit 100 to thereby help to slow and diffuse cooling airflow alongside the rack 14 and to increase useable air to the intake vents 18C of the side-to-side components 18. Thus, various configurations and arrangements of the air-directing device 168 are possible and envisioned. Those of ordinary skill in the art can appreciate that the invention includes different shapes and configurations of the device 168 and different types of arrangements by which the device 168 can be removably or permanently mounted or connected to the rack 14 or the side air distribution unit 100.

Figure 25A:
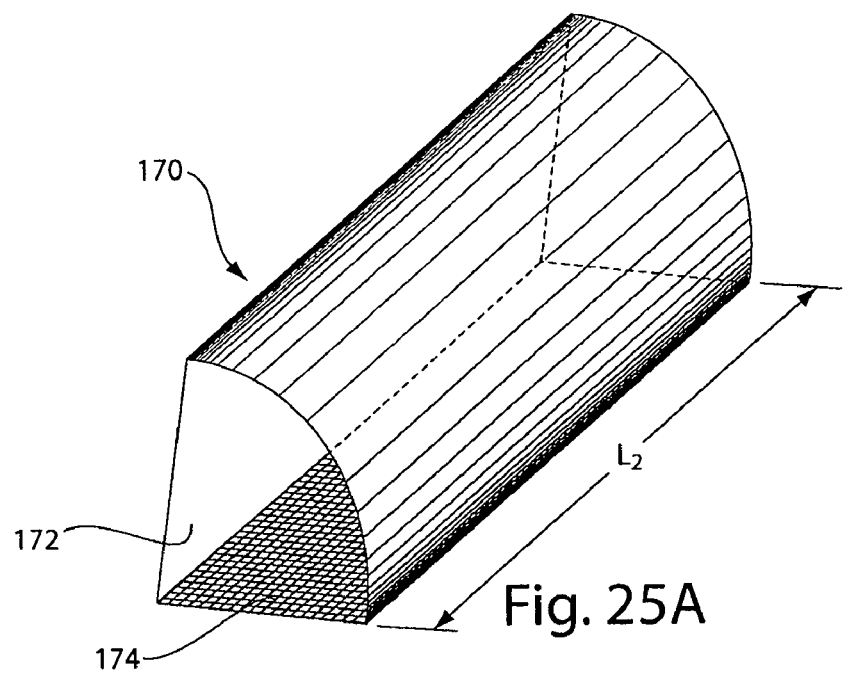
FIG. 25A is a perspective view of a scoop for use with any of the units shown in FIGS. 19A-19G.
Figure 25B:
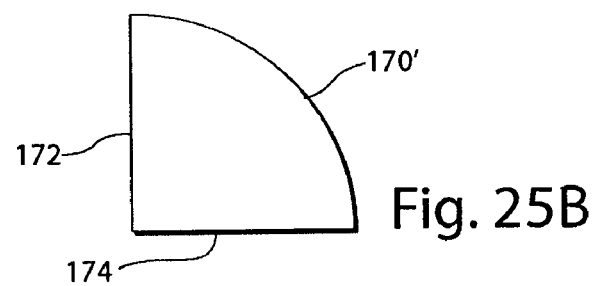
FIG. 25B is a side view of the scoop shown in FIG. 25A.
Figure 25C:
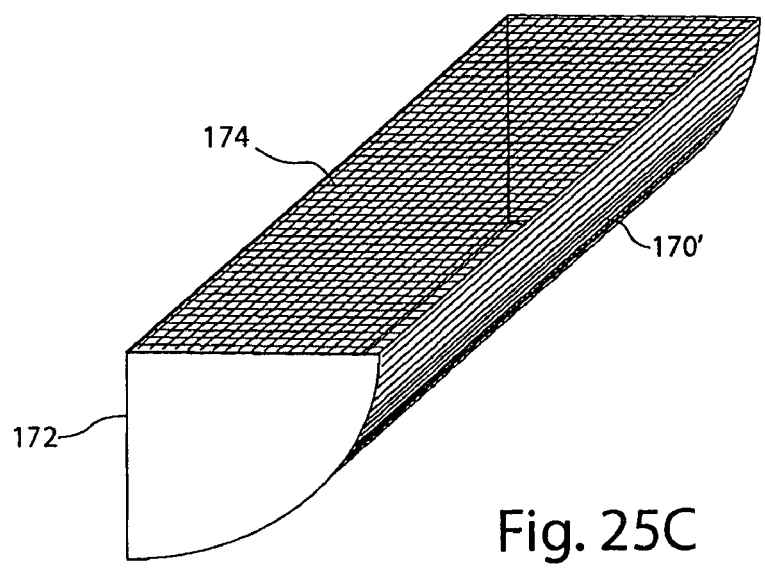
FIG. 25C is a perspective view of the scoop shown in FIG. 25A at an inverted orientation.

Referring to FIGS. 25A-25C, in one embodiment, the invention provides the air-directing device 168 configured as a scoop 170 for use with the side air distribution unit 100. The scoop 170 is configured and arranged such that it can removably mount or connect to the unit 100 or the rack 14. In one embodiment, an external portion of the unit 100 can be configured to removably mount or connect the scoop 170 along the right or the left side panel 106 and 108 of the housing 102 such that the scoop 170 is disposed to receive air from either the right or the left side exhaust vents 124, 126 or 154, 156 during operation of the unit 100. As shown in FIGS. 24 and 25A-25C, the scoop 170 can define a curved cross-sectional configuration or an arc 170'. The configuration of the scoop 170 permits the scoop 170 to receive and collect a stream/ curtain of cooling air the unit 100 vents from either the left or the right side exhaust vents 124, 126 or 154, 156. In addition, the configuration of the scoop 170 helps the scoop 170 to direct cooling air to flow either an upward or downward direction along either the left or the right side 45 and 47 of the rack 14. The scoop 170 is configured such that it is flexible with respect to the direction in which it directs airflow, when mounted or connected to the housing 102 or the rack 14, the same scoop 170 can be disposed in a first orientation to direct airflow in an upward direction, and can be disposed in a second orientation to direct airflow in a downward direction. As shown by FIGS. 25A and 25C, the scoop 170 is simply inverted to change the direction with which it directs air. In addition, the scoop 170 is configured to permit the same scoop 170 to be used along the left and the right side of the unit 100. Further, the shape/configuration of the scoop 170 causes cooling air to flow only, or substantially only, upward or downward toward side-to-side airflow components 18 rack-mounted above or below the side air distribution unit 100. The scoop 170 thereby helps to increase cooling airflow along the left or the right side 45 and 47 of the rack 14 such that the intake vents 18C of the components 18 can drawn-in sufficient air.

Figure 25D:
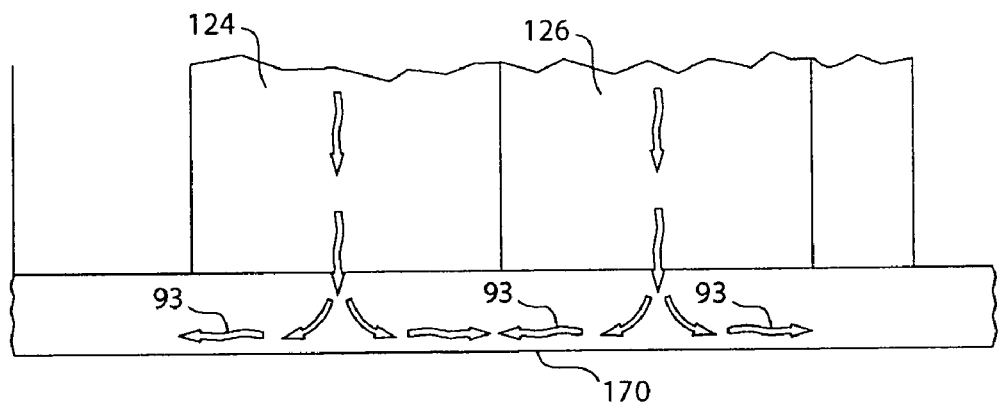
FIG. 25D is a top view schematic of side exhaust vents of any of the units shown in FIGS. 19A-19G with the scoop shown in FIG. 25A mounted thereto.

Referring to FIG. 25D, and with further reference to FIGS. 25A-25C, the scoop 170 can be configured to define a length $L_2$ longer than the total width $W_4$ of the right or the left side exhaust vents 124, 126 and 154, 156. The elongated length $L_2$ permits the scoop 170 to collect a stream of cooling air and to allow the stream of cooling air to expand along the scoop's length $L_2$, as shown by arrows 93 in FIG. 25D, to thereby slow down the flow of air. In addition, as shown in FIGS. 25A and 25C, the scoop 170 includes an exhaust grill 174 disposed along a side of the scoop 170 through which a stream/curtain of vented air is directed. The grill 174 creates static air pressure that further helps to broaden the flow of air and to thereby diffuse the air stream as it passes from the scoop 170 through the grill 174. The intake vents 18C can more easily draw air into the components 18 from a slow and diffuse air stream. The scoop 170 thereby helps to optimize/maximize useable cooling air to the side-to-side components 18.

Figure 25E:
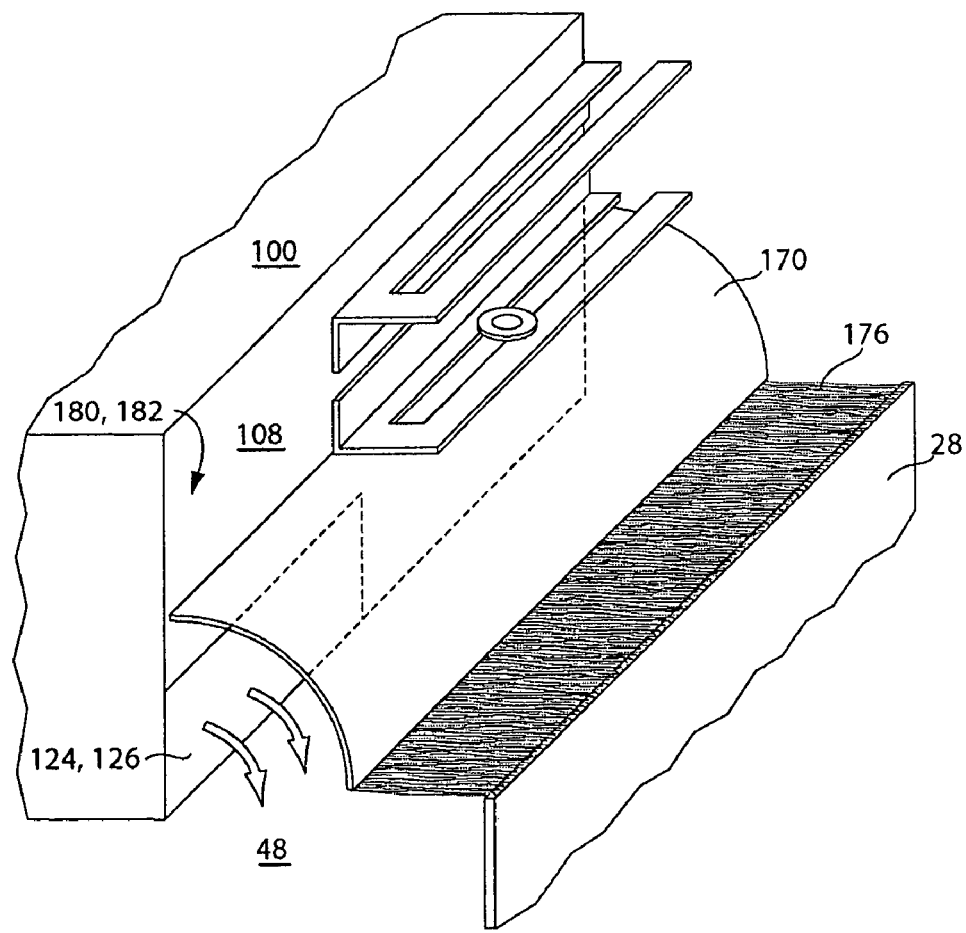
FIG. 25E is a perspective schematic view of the scoop shown in FIG. 25A with a brush grommet connected to any of the units shown in FIGS. 19A-19G.

Referring to FIG. 25E, in one embodiment, the scoop 170 can be further configured such that a longitudinal portion of the scoop 170 terminates into a brush grommet 176. The brush grommet 176 is configured and sized such that when the scoop 170 is mounted to the unit 100 or the rack 14, the brush grommet 176 is disposed adjacent or flush with the left side panel 26 or the right side panel 28 of the enclosure 10. The brush grommet 176 thereby helps to prevent/minimize loss of cooling air from the side 46 and 48 of the rack 14 to the exhaust plenum 22. In addition, the brush grommet 176 helps to prevent/minimize the amount of hot/warm air the side vents 18A and 18C of the side-to-side components 18 draw from the exhaust plenum 22 into the side 46 and 48 of the rack 14. The brush grommet 176 can be permanently or removably disposed along the length $L_2$ of the scoop 170, and can be further configured to permit cabling along either side 46 and 48 of the rack 14. FIG. 25E depicts the scoop 170 with the brush grommet 176 mounted or connected to the right side panel 108 of the side air distribution unit housing 102 or the right vertical rails 14a and 14d of the rack 14. The scoop 170 with the brush grommet 176 disposed thereto can be similarly mounted or connected to the left side panel 106 of the housing 102 or the left vertical rails 14b and 14d of the rack 14 with similar effects along the left side 45 of the rack 14.

Figure 25F:
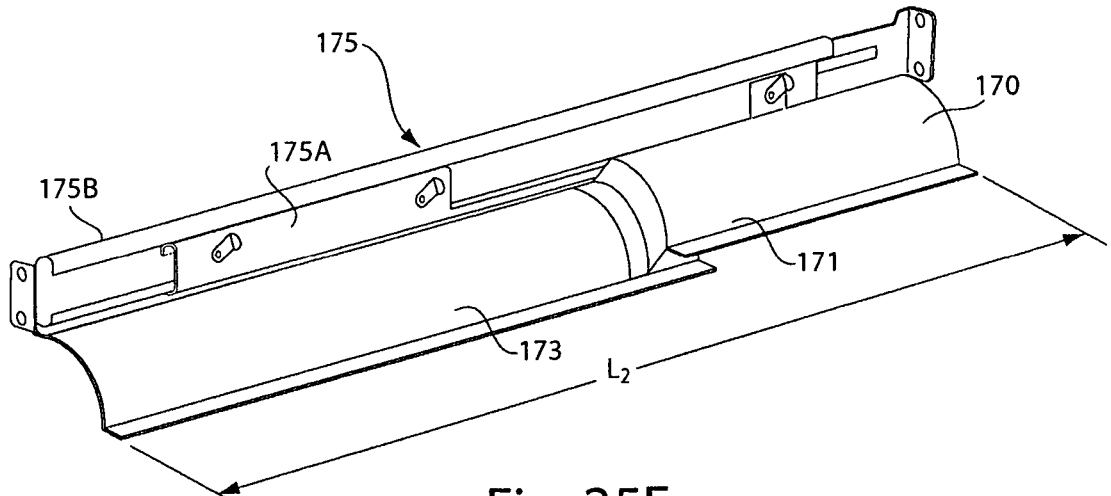
FIG. 25F-25G is a perspective view of an adjustable scoop for use with any of the units shown in FIGS. 19A-19G.
Figure 25G:
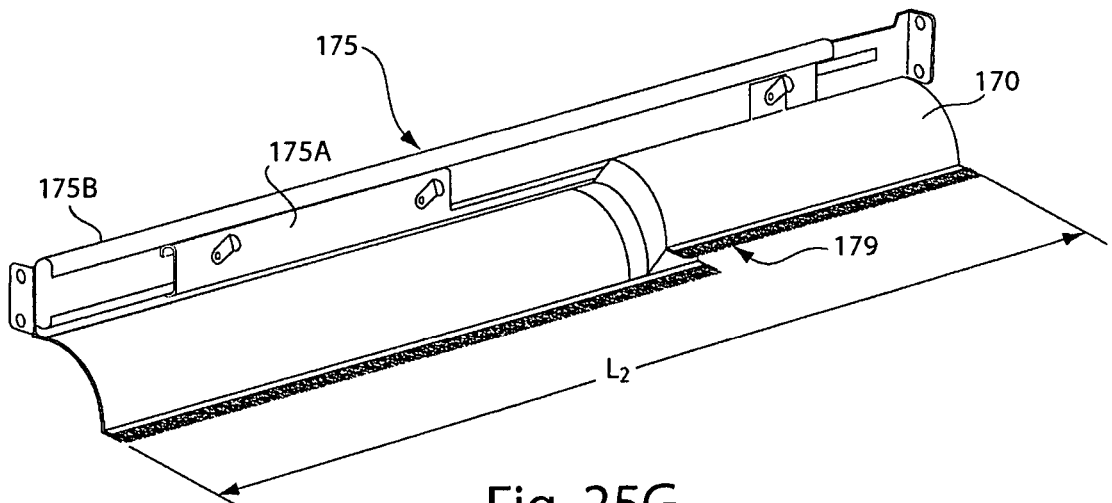

Referring to FIGS. 25F and 25G, in a further embodiment of the scoop 170 according to the invention, the scoop 170 can be configured as an adjustable scoop 170 such that the scoop length $L_2$ can be increased or decreased. The adjustable scoop 170 can include a first scoop 171 and a second scoop 173. The first and the second scoops 171 and 173 can be configured and sized such that the first scoop 171 slides over at least a portion of the second scoop 173 to overlap with the second scoop 173. As shown in FIG. 25F, the first and the second scoops 171 can be mounted to an adjustable flange 175 disposed along either the left or the right panel 106 and 108 of the housing 102 of the side air distribution unit 100. The adjustable flange 175 can be configured as separate sliding panels 175A and 175B, with each panel 175A and 175B configured to mate with and to slide along the other panel. The sliding panels 175A and 175B are further configured to accept and mount one of the first and the second scoops 171 and 173 and to thereby permit the first scoop 171 to slide over at least a portion of the second scoop 173 to increase or decrease the length $L_2$ of the scoop 170.

In a further embodiment, the first and the second scoops 171 and 173 can each include a longitudinal portion that terminates into an overlapping brush grommet 179. The overlapping brush grommet 179 can be disposed adjacent or flush with either the left side wall 26 or the right side wall 28 of the enclosure 10 when the adjustable flange 175, with the first and the second scoops 171 and 173 connected thereto, is mounted or connected to the left or the right panel 106 and 108 of the unit housing 102. As described above with reference to FIG. 25E, the overlapping brush grommet 179 helps to permit cabling, and helps to separate cooling air from hot/warm exhaust air.

Figure 26A:
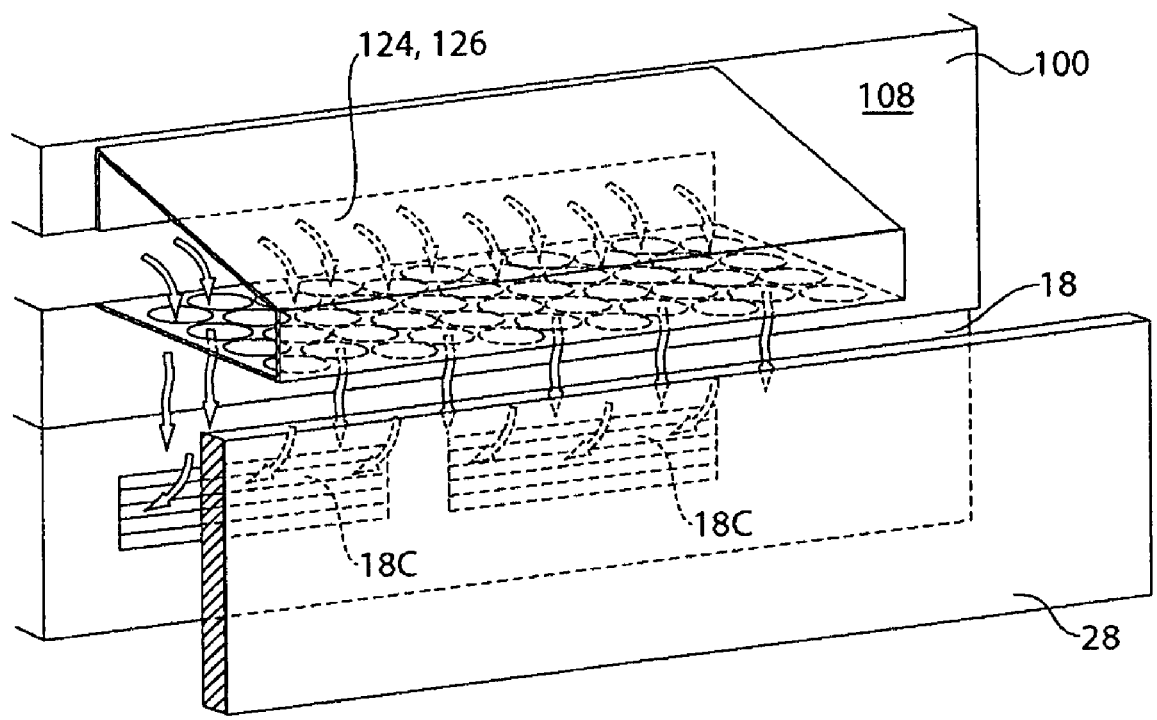
FIG. 26A is a perspective view of an air manifold for use with any of the units shown in FIGS. 19A-19G.
Figure 26B:
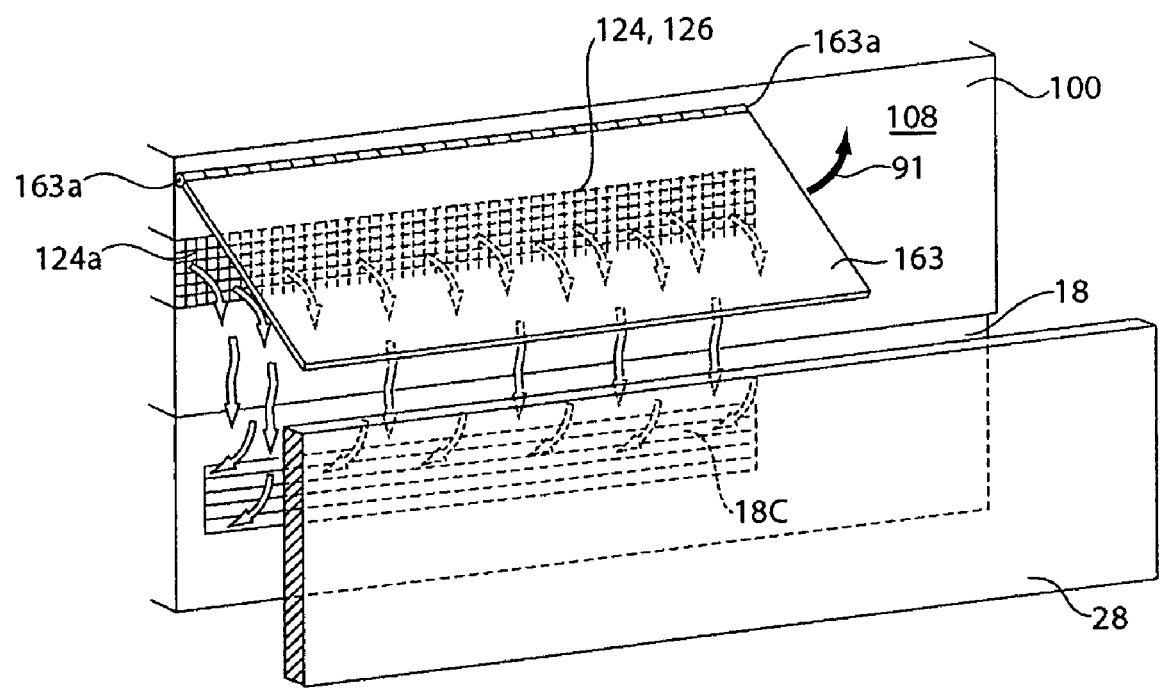
FIG. 26B is a perspective view of an air baffle for use with any of the units shown in FIGS. 19A-19G.
Figure 26C:
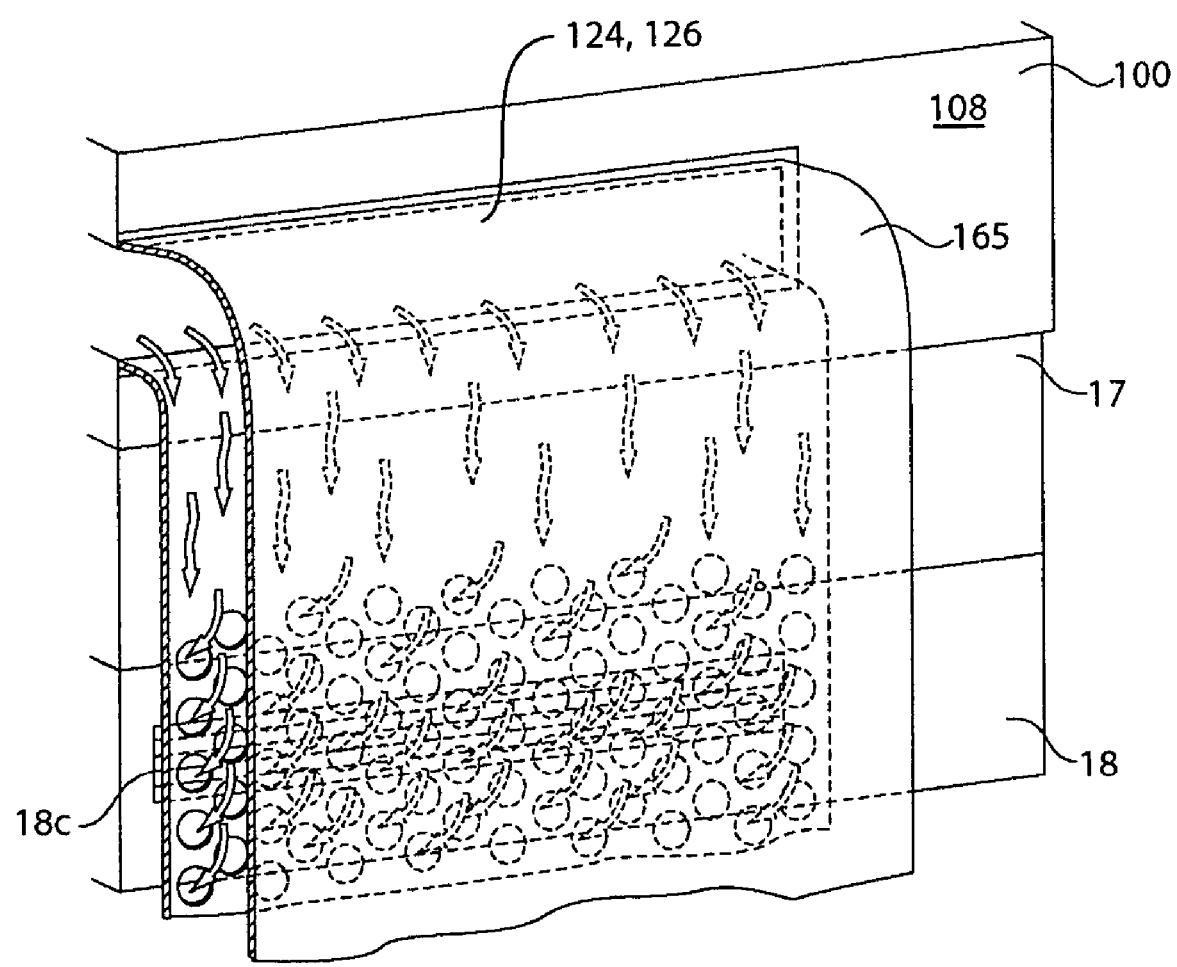
FIGS. 26C-26E are views of an air tube or boot for use with any of the units shown in FIGS. 19A-19G.

Referring to FIGS. 26A-26C, other embodiments of the air-directing device 168 according to the invention can be used with the side air distribution unit 100 to help to direct cooling airflow in an upward or a downward direction, as well as to help to slow and diffuse flow of cooling air vented from the left or the right side exhaust vents 124, 126 or 154, 156 of the unit 100. As shown in FIG. 26A, an air manifold 161 can be removably connected to the side panel 106 and 108 of the unit 100 or to the rack 14, such that the air manifold 161 is in fluid communication with one or both of the left or the right vents 124, 126 or 154, 156. The air manifold 161 is disposed and configured to collect a stream of cooling air vented from the unit 100 and to create airflow resistance that slows and diffuses the flow of air from the manifold 161. As shown in FIG. 26A, the manifold 161 is configured to allow air to collect within the manifold 161 and to permit an air stream to broaden and expand along the manifold 161 length and width to slow and diffuse air. In addition, the manifold 161 can define a plurality of openings 161a along a side of the manifold 161 from which air vents. The plurality of openings 161a are configured to serve as an exhaust grill, as discussed above, to help to create static pressure that broadens and diffuses air as it vents from the manifold 161.

As shown in FIG. 26B, the air-directing device 168 can be configured as a set of one or more baffles 163 removably or permanently connected to the side panel 106 and 108 of the housing 102 of the unit 100. The baffle 163 can be disposed and configured to pivot along hinged edges 163a such that the baffle 163 opens and closes against the side vents 124, 126 or 154, 156 in response to air venting from the exhaust vents 124, 126 or 154, 156. The baffle 163 can be biased via a spring (not shown) or other means to block the exhaust vents 124, 126 or 154, 156 when the unit 100 is not operating and cooling air is not venting from the unit 100. In use, a stream of cooling air can force the baffle 163 to pivot outward, as shown by arrows 91 in FIG. 26B, to an extent permitted by the biasing spring or other means. The baffle 163 can be disposed at an outward position such that the baffle 163 is angled, e.g., at a 45 degree angle, to help to direct airflow in an upward or downward direction toward the intake vents 18C of the side-to-side components 18. In addition, the angled baffle 163 can be used in combination with an exhaust grill 124a mounted along the exhaust vents 124, 126 or 154, 156 to help to create an airflow resistance that can help to diffuse the stream of air as it vents from the unit 100.

Figure 26D:
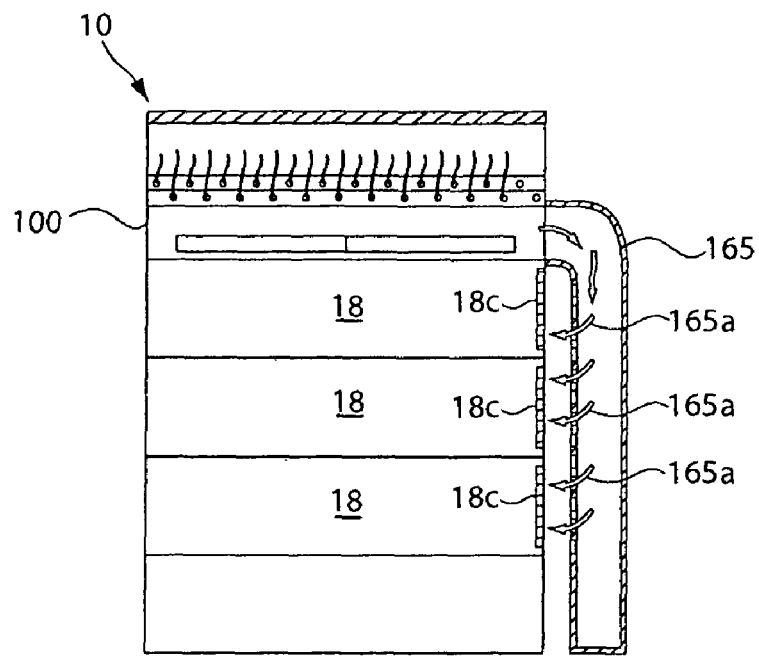
Figure 26E:
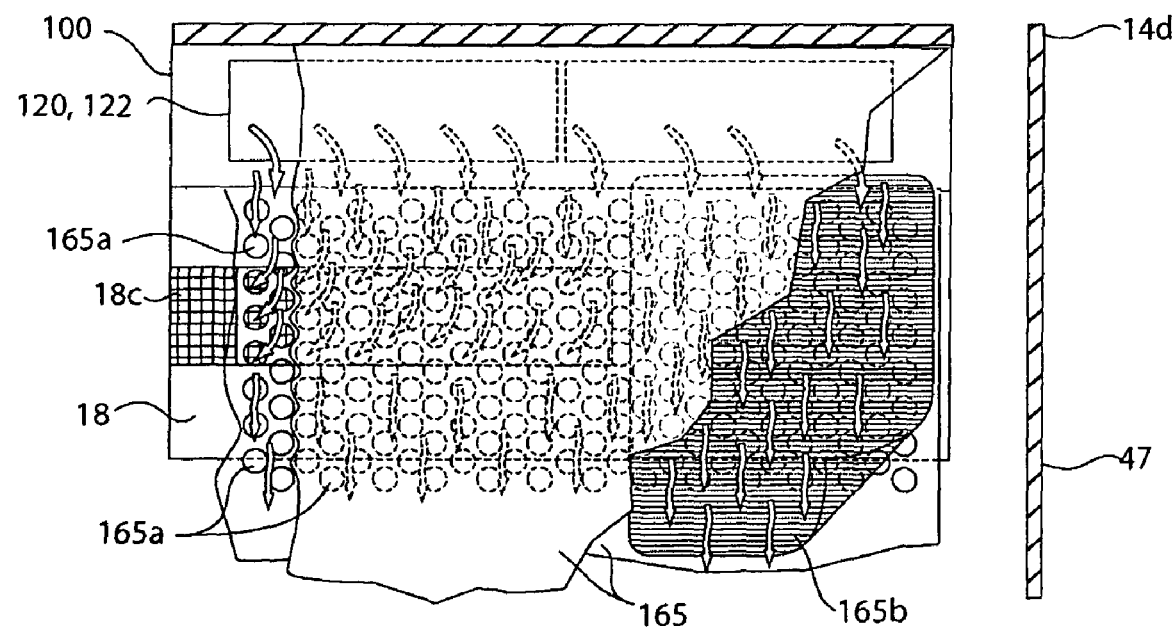

As shown in FIG. 26C-26E, in still a further embodiment of the air-directing device 168 according to the invention, an air tube or boot 165 defining a plurality of openings 165a can be configured to removably mount or connect to the side 106 and 108 of the unit 100. When mounted, the tube or boot 165 is disposed and configured to collect air vented from the unit 100 within its interior and to allow air to flow along a length of the boot 165 to the left or the right side 45 or 47 of the rack 14. The plurality of openings 165a can be defined along a side of the boot 165 that is in facing relation to the intake vents 18C of the side-to-side components 18, as shown in FIGS. 26C and 26D, and each opening 165a can be configured to permit air to flow from the interior of the boot 165 and to pass through the opening 165a to an area proximate the intake vents 18C. The shape and/or the length of the tube or boot 165 and the plurality of openings 165a help to create airflow resistance that slows and diffuses the stream of air as the air flows along the interior of the tube or boot 165 and passes through each opening 165a. The boot 165 thereby helps to deliver a flow of cooling air that the intake vents 18C can readily draw from. The boot 165, as shown in FIG. 26D, can be sealed or tied off at its bottom portion remote from the exhaust vents 124, 126 or 154, 156 to help to contain air and to ensure a sufficient volume of air from which the intake vents 18C can draw. As shown in FIG. 26D, the boot 165 can have dimensions, e.g., a length, to accommodate the size and the location of the side-to-side components 18. The length of the boot can be adjusted to accommodate different heights of the side-to-side components 18.

In addition, the boot 165 can define a width that is sufficient to accommodate different depths of various types of side-to-side components 18 made by different manufacturers. As shown in FIG. 26E, the boot 165 can have a width to extend along and accommodate a depth (length $L_1$) of the unit 100 and/or of the side-to-side components 18. To help to define an area from which air flows from the interior of the boot 165 to an area proximate to the intake vents 18C, a portion of the openings 165a can be blocked off using a cover or film, e.g., removable. Similar to the partition 39 shown in FIG. 8B, the boot 165 can be constructed of a material, e.g., a heat resistant polyethylene, that permits a removable cover or film 165b, e.g., Mylar®, to be affixed thereto along an interior or exterior surface to help to block the portion of openings 165a and to thereby confine flow of air from the boot 165 interior to the intake vents 18C. As shown in FIG. 26E, the cover or film 165b is suitable to help to prevent the intake vents 18C from drawing hot/warm exhaust air from the exhaust plenum 22 to the side 45 and 47 of the rack 14, and can further help to prevent the mixing of cooling air with exhaust air. Further, the boot 165 can be constructed of a material that defines either a rigid or flexible structure, or a combination thereof.

Figure 27A:
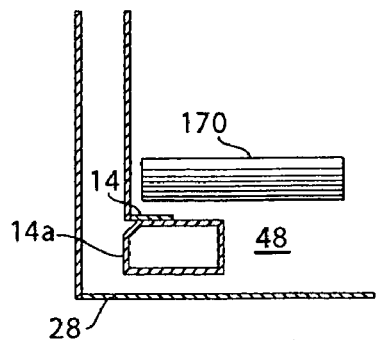
FIG. 27A is a top view schematic of any of the units shown in FIGS. 19A-19G rack mounted in a wide rack with the scoop shown in FIG. 25A.
Figure 27B:
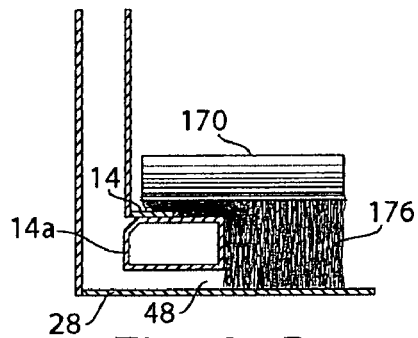
FIG. 27B is a top view schematic of any of the units shown in FIGS. 19A-19G rack mounted in a wide rack with the scoop shown in FIG. 25A having a brush grommet.

Referring to FIGS. 27A-27E, in further embodiments of the side air distribution unit 100 according to the invention, additional configurations can be used in association with the unit 100 to help to prevent loss of cooling air from either side 45 and 47 of the rack 14, e.g., where the rack 14 is disposed within the enclosure 10. Such configurations can further help to separate cooling air from hot/warm exhaust air circulating within the exhaust plenum 22 of the enclosure 10. In addition, such configurations can be disposed and arranged to help to prevent/minimize the amount of hot/warm exhaust air that the vents 18A and 18C of the side-to-side components 18 draw from the exhaust plenum 22 to either side 45 and 47 of the rack 14. As shown in FIGS. 27A and 27B, the scoop 170 can be mounted or connected to the unit 100 or the rack 14, as described below in further detail, such that the scoop 170 is disposed adjacent one of the front vertical rails 14a and 14b of the rack 14. The rack 14 depicted in FIGS. 27A and 27B is a wide rack 14 having a width of about 23 inches, which thereby creates potential areas for loss of cooling air alongside the rack 14. Where the unit 100 is disposed in a wide rack 14, the scoop 170 can be positioned, as shown in FIGS. 27A and 27B, to help to prevent loss of cooling air to the front side of the enclosure 10. In addition, as shown in FIG. 27B, a brush grommet 177 can be mounted or connected, e.g., removably, to the scoop 170 such that the brush grommet 177 is disposed adjacent or flush with either the left or right side panel 26 and 28 of enclosure 10. The scoop 170 and/or the brush grommet 177 not only help to prevent loss of cooling air from the side 45 and 47 of the rack, but also help to prevent mixing of cooling air and exhaust air during operation of the components 18.

Figure 27C:
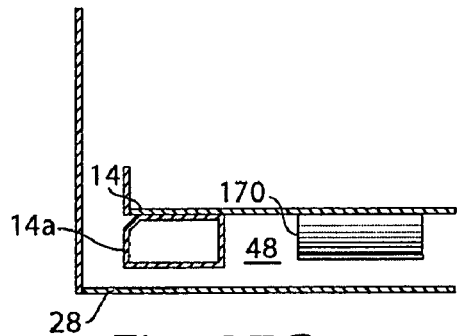
FIG. 27C is a top view schematic of any of the units shown in FIGS. 19A-19G rack mounted in a narrow rack with the scoop shown in FIG. 25A.
Figure 27D:
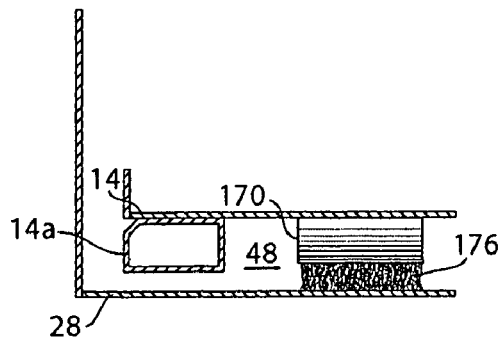
FIG. 27D is a top view schematic of any of the units shown in FIGS. 19A-19G rack mounted in a narrow rack with the scoop shown in FIG. 25A having a brush grommet.

As shown in FIGS. 27C and 27D, the unit 100 can be disposed in a narrow rack 14 having a width of about 19 inches. The scoop 170 can be positioned such that it helps to prevent cooling air loss from either side 45 and 47 of the rack 14 to the front of the rack 14. The scoop 170 can further include the brush grommet 177 mounted or connected to the scoop 170 such that when the scoop 170 is connected to the unit 100 or the rack 14, the brush grommet 177 is adjacent or flush with a side panel 26 and 28 of the enclosure 10 to help to prevent loss of cooling air and mixing of cool and exhaust air. In addition, the brush grommet 177 helps to accommodate various enclosure/cabinet structures made by different manufacturers to enable the scoop 170 and the brush grommet 177 combination to be used with any type or configuration of cabinet/enclosure. For instance, some cabinets/enclosures including along side panels rigid mounting members. The brush grommet 177 can bend and/or conform to such members to enable the brush grommet 177 to be effective in helping to confine cooling air and to block exhaust air.

Figure 27E:
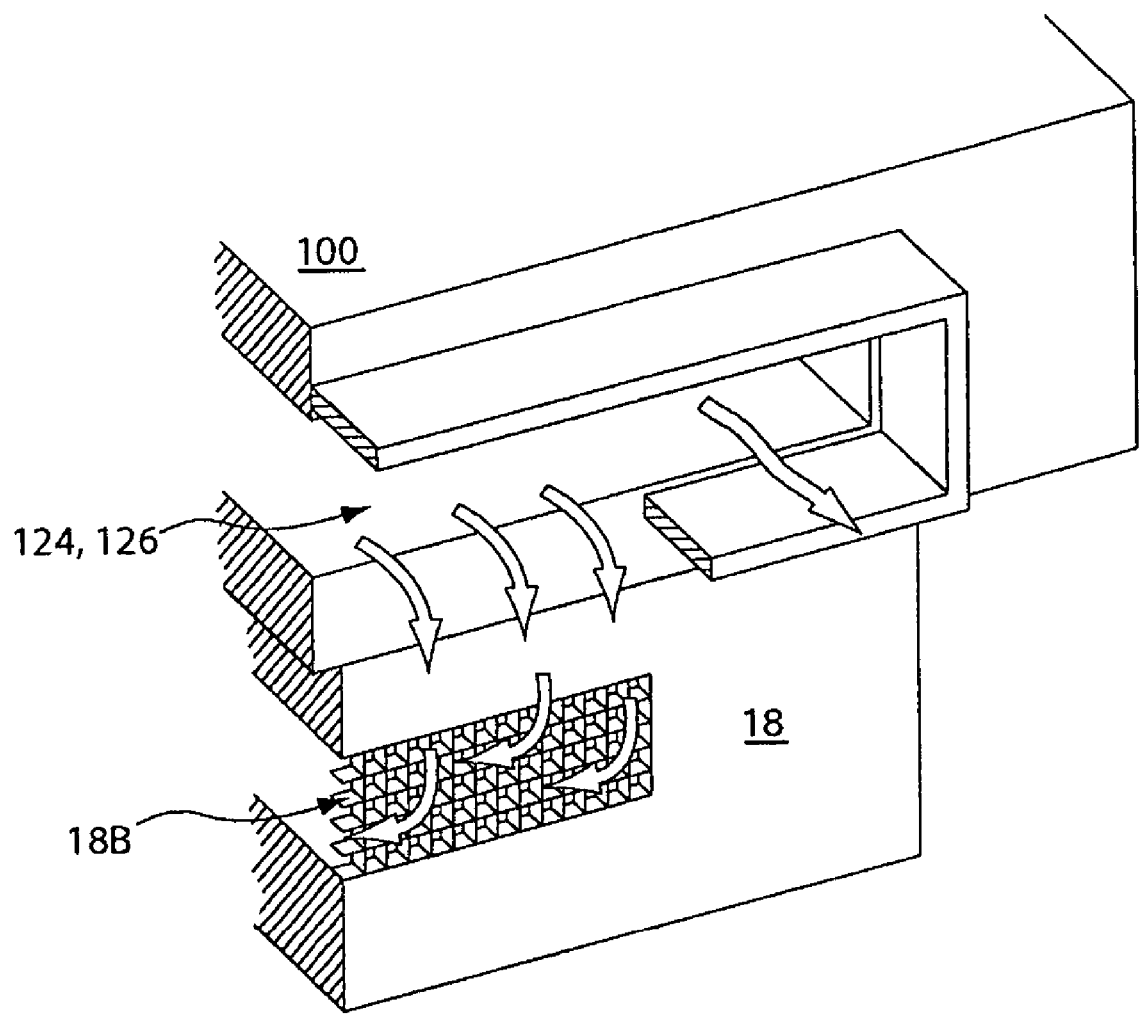
FIG. 27E is a side view schematic of any of the units shown in FIGS. 19A-19G with a horizontal seal.

In a further embodiment of the invention shown in FIG. 27E, a horizontal seal 181 can be mounted to either side panel 106 and 108 of the housing 102 adjacent the left or the right side exhaust vents 124, 126 or 154, 156 to help to direct vented cooling air along the sides 46 and 48 of the rack 14 such that the side intake vents 18A and 18C of the components 18 can draw cooling air therefrom. In addition, the horizontal seal 181 can be configured to surround an outer perimeter of the exhaust vents 124, 126 and 154, 156, and further configured to extend toward either side panel 26 and 28 of the enclosure 10 to thereby help to prevent loss of cooling air and to help to separate cooling air from exhaust air. As described below in further detail with reference to FIGS. 32A-32D, when used in combination with a baffle 200 that can extend from a rear vertical rail 14c and 14d of the rack 14, the seal 181 can help to deliver air to the intake vents 18C of the components 18.

Figure 28:
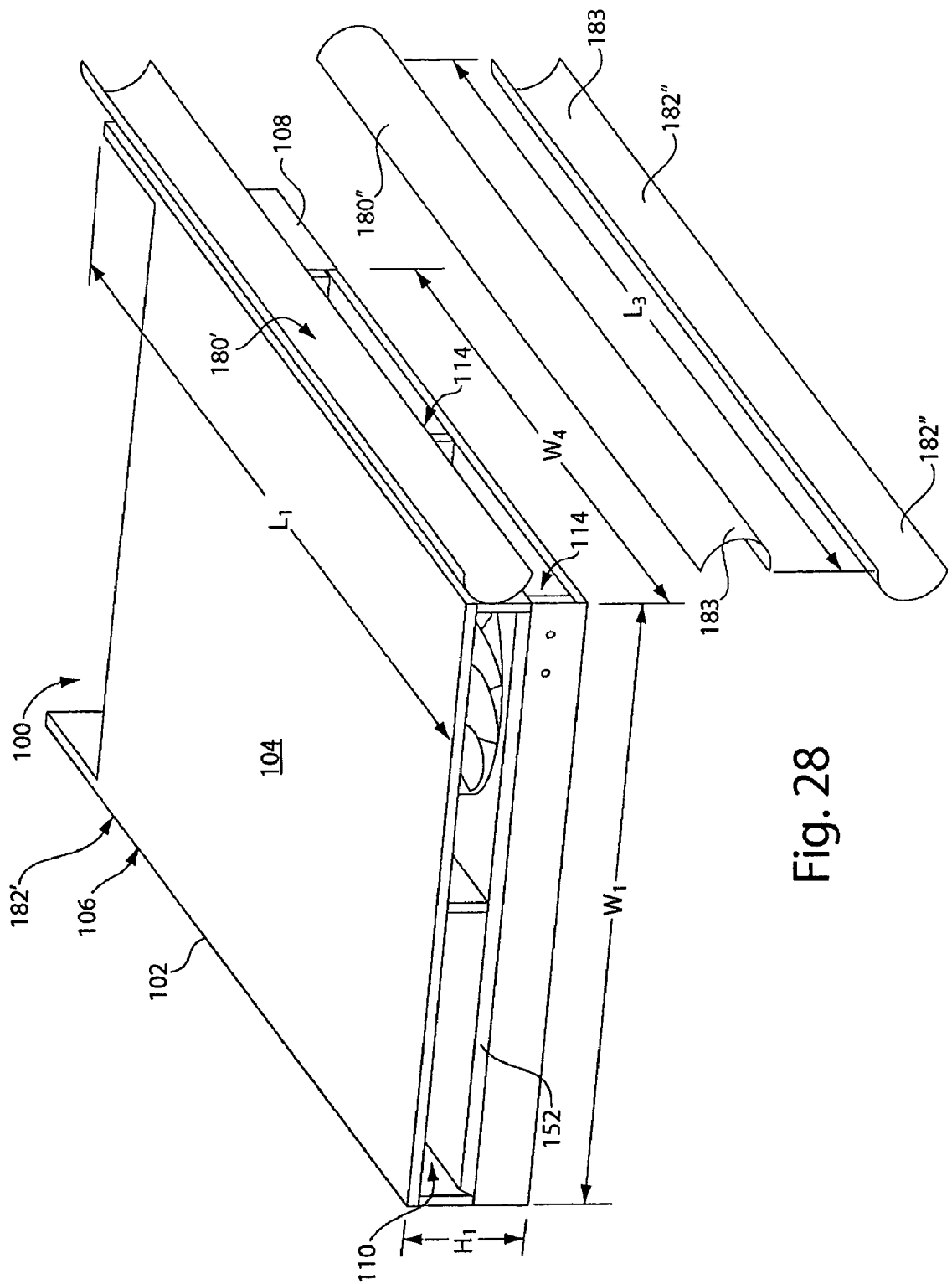
FIG. 28 is a cut-away perspective view of the unit shown in FIG. 19A with side mounting brackets.

Referring to FIG. 28, and with further reference to FIG. 24, in one embodiment, the unit 100 can include a mounting bracket 180, 182 disposed along each side panel 106 and 108 of the housing 102. Each mounting bracket 180, 182 has a pair of mounting flanges 184, 184' and 186, 186'. The pair of mounting flanges 184, 184' and 186, 186' includes a first or front mounting flange 184, 186 disposed along a front portion of the mounting bracket 180, 182 and a second or rear mounting flange 184', 186' disposed along a back portion of the mounting bracket 180, 182. As shown in FIG. 28, terminal ends of the mounting flanges 184, 184' and 186, 186' are configured and arranged such that the front mounting flanges 184, 186 can be connected to the front vertical rails 14a, 14b of the rack 14, and the back mounting flanges 184', 186' can be connected to the rear vertical rails 14c, 14d. As described below in further detail, the mounting brackets 180, 182 and the mounting flanges 184, 184' and 186, 186' help to permit rack mounting of the side air distribution unit 100.

As shown in FIG. 28, each mounting bracket 180, 182 includes a first bracket 180', 182' and a second bracket 180", 182". The first bracket 180', 182' connects to the side panel 106 and 108 of the housing 102 above the side exhaust vents 124, 126 and 154, 156. The second bracket 180", 182" is complimentary to the first bracket 180', 182' and configured and sized to receive and to mate with the first bracket 180', 182' such that the first and the second brackets 180', 182' and 180", 182" removably couple. As shown in FIGS. 24 and 27, the first and the second brackets 180', 180" and 182' and 182" are configured as elongated brackets having a length $L_3$ extending along at least a portion of the length $L_1$ of the housing 102, and preferably extending along substantially the length $L_1$ of the housing 102. The first and second brackets 180', 182' and 180", 182" have inwardly curved longitudinal edges 183 configured and sized such that a terminal end of the second bracket 180", 182" accepts a terminal end of the first bracket 180', 182' to permit the first bracket 180', 182' to slide into the second bracket 180", 182" to thereby removably couple the first and second brackets 180', 182' and 180", 182". As described above, terminal end portions of the flanges 184, 184' and 186, 186' of the second bracket 180", 182" are configured to connect to the front rails 14a, 14b and the back rails 14c, 14d of the rack 14, respectively, to rack-mount the second bracket 180", 182". Where the second bracket 180", 182" is rack-mounted, the second bracket 180", 182" can accept the first bracket 180', 182', as described, and allow the first bracket to slide into the second bracket to removably mount the side air distribution unit 100 to the rack 14. In use, the bracket 180, 182 and the flange 184, 184' and 186, 186' configurations provide flexibility that permits the side air distribution unit 100 to be removably rack-mounted at any location within the rack 14 that would optimize flow of cooling air to the components 18 using side-to-side airflow, and to be readily relocate the unit 100 within the rack 14 when the rack 14 and/or one or more of the enclosures 10 are reconfigured.

Still referring to FIG. 24, in one embodiment, the mounting flanges 184, 184' and 186, 186' can be further configured to mount or connect the scoop 170 to the second mounting bracket 180", 182" to thereby mount the scoop 170 to the rack 14, e.g., at a location the second mounting bracket 180", 182" is rack-mounted. Each mounting flange 184, 184' and 186, 186' can include a sliding flange 190 that defines a narrow opening or slot 192. The opening or slot 192 is sized and configured to accept and retain a mounting portion of a fastener 194, e.g., a cage nut, while permitting the fastener 194 to move or slide in either direction along the opening or slot 192, as shown by arrows 98 in FIG. 24. The fastener 192 is configured to connect to the scoop 170 and to mount the scoop 170 to the sliding flange 190. The fastener 192, e.g., the cage nut, permits the scoop 170 to slide along the slot 192 in either direction to enable the scoop 170 to be positioned at a desired location along the sliding flange 190. When the side air distribution unit 100 is rack-mounted via the mounting brackets 180 and 182, the sliding flange 190 and cage nut 194 combination allow the scoop 170 to slide along the slot 192 to dispose the scoop 170 at a desired position adjacent the right or the left side exhaust vents 124, 126 or 154, 156. Once placed at the desired position, the cage nut 194 can be secured or tightened to prevent the scoop 170 from sliding from the desired position.

The second mounting brackets 180", 182" with the mounting flanges 184, 184' and 186, 186' and the sliding flange 190 and cage nut 190 combination permit the second mounting brackets 180", 182" and the scoop 170 to remain rack-mounted when the side air distribution unit 100 is removed from the rack 14. In addition, the configuration of the sliding flange 190 and cage nut 190 combination on each of the second mounting brackets 180", 182" permits a single scoop 170 to be mounted on either side of the rack 14 and on either side of the air distribution unit 100. For instance, the scoop 170 positioned on the right side of the unit 100, can be removed from the sliding flange 190 of the right mounting bracket 180", inverted and connected to the sliding flange 190 of the left mounting bracket 182" to position the scoop 170 on the left side of the unit 100. Because the second mounting brackets 180", 182" are removably connected to the rack 14 via the mounting flanges 184, 184' and 186, 186', the second mounting brackets 180", 182" and the scoop 170 can be readily connected to and removed from the rack 14 in order to vertically reposition the side air distribution unit 100. The invention is not limited in this respect, and anticipates other types of configurations and arrangements of brackets, flanges and/or other devices that removably rack-mount the unit 100 to the rack 14, and that removably rack-mount the scoop 170 to the rack 14 or the unit 100.

Figure 29A:
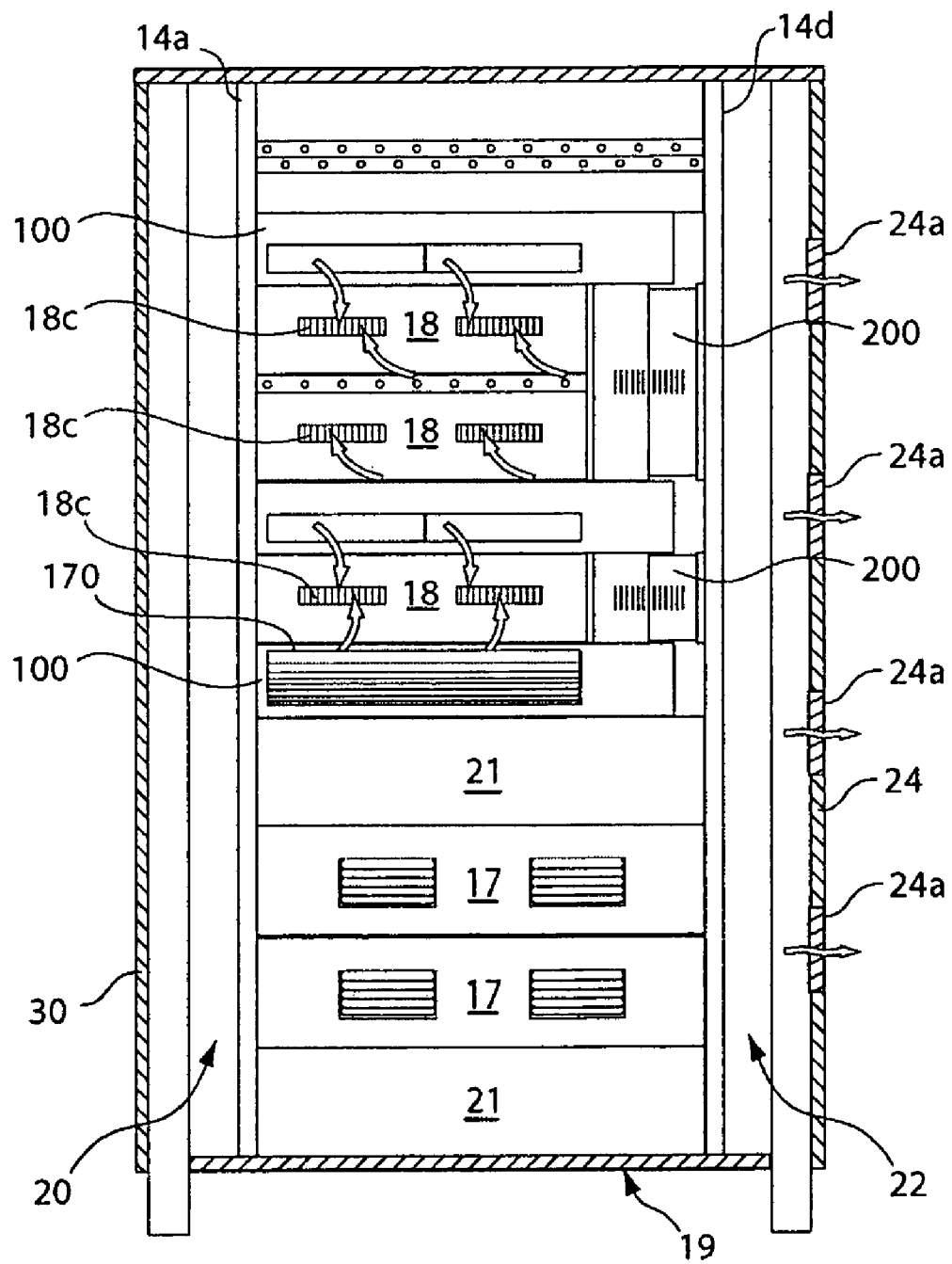
FIG. 29A is a right side view of the rack shown in FIG. 1 with any of the units shown in FIGS. 19A-19G rack mounted thereto with a number of baffles.
Figure 29B:
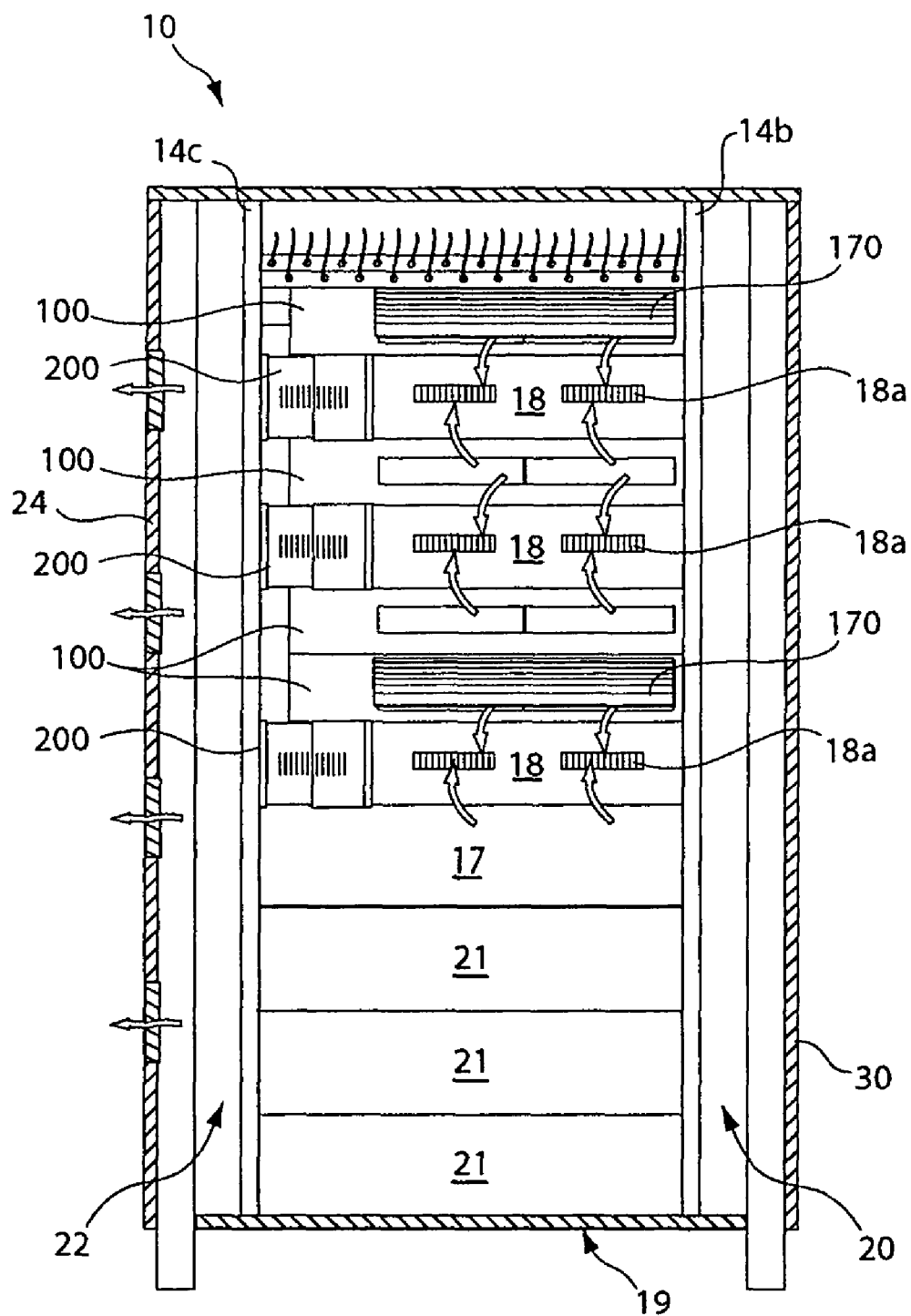
FIG. 29B is a left side view of the rack shown in FIG. 1 with any of the units shown in FIGS. 19A-19G rack mounted thereto with a number of baffles.

Referring to FIGS. 29A and 29B, in further embodiments of the invention, the side air distribution unit 100 can be used in combination with a baffle 200 configured to connect to the rear vertical rails 14c and 14d of the rack 14 and to extend from the rear rails 14c and 14d to the back of a telecommunications component 18 or to the back of the side air distribution unit 100. As shown in a right side view of the enclosure 10 in FIG. 29A, the baffle 200 connects to the right rear rail 14d and extends to the back of the component 18 or the rack-mounted unit 100. The location of the baffle 200 helps to prevent side air intakes 18C defined along the side-to-side components 18 from drawing hot/warm exhaust air from the exhaust plenum 22 into the right side of the rack 14 and into the components 18. In addition, the location of the baffle 200 helps to prevent a negative air pressure created by a stream of air venting from the unit 100 to the right side 47 of the rack 14 from drawing hot/warm air from the exhaust plenum 22. As shown in a left side view of the enclosure 10 in FIG. 29B, the baffle 200 is configured to similarly connect to the left rear rail 14c and to extend from the rail 14c to the back of the rack-mounted unit 100 or the side-to-side component 18. The baffle 200 helps to prevent left air intakes 18A defined long the left side of components 18 from drawing hot/warm air from the exhaust plenum 22 into the left side 45 of the rack 14 and into the components 18. The location of the baffle 200 similarly helps to prevent a negative air pressure created by a stream of air venting from the unit 100 to the right side 47 of the rack 14 from drawing hot/warm air from the exhaust plenum 22. Further, the baffle 200 can be configured to have a length $L_4$ that accommodates the depth of the side-to-side airflow component 18 and/or the depth or length $L_1$ of the side air distribution unit 100.

Figure 30:
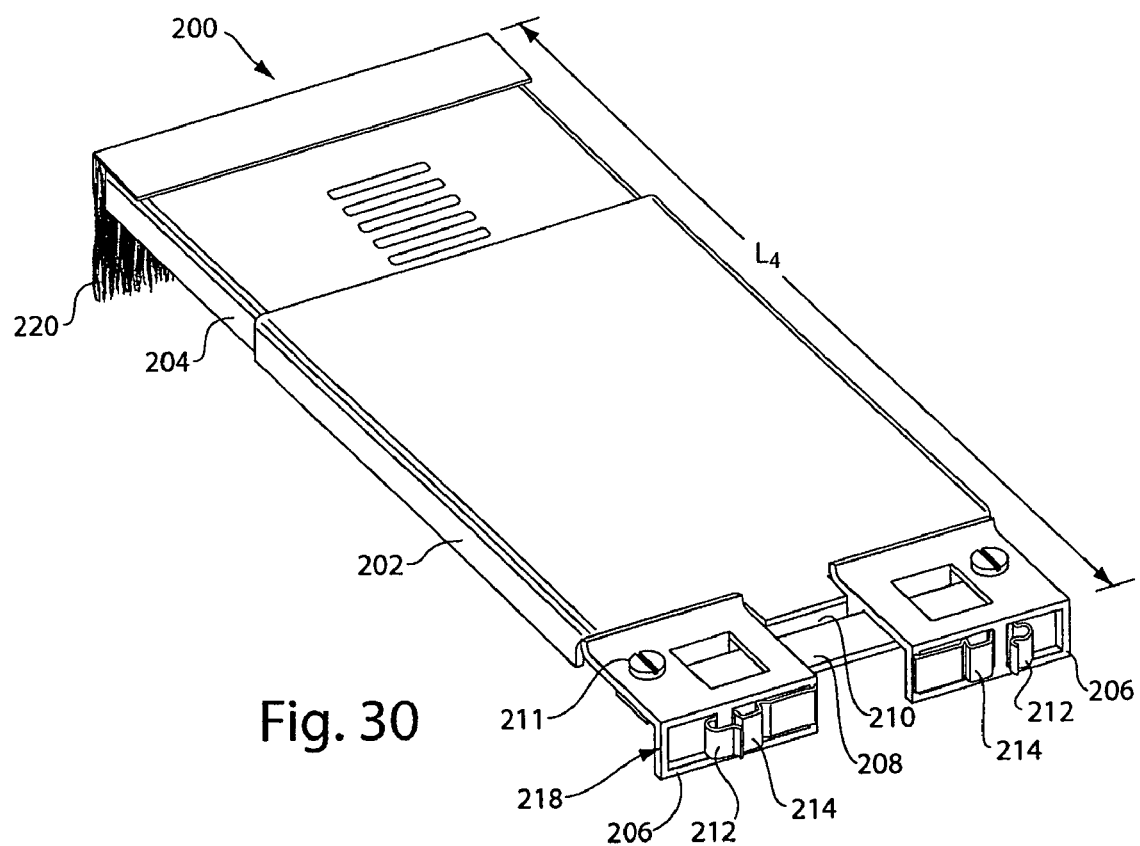
FIG. 30 is a perspective view of a baffle shown in FIGS. 29A-29B.
Figure 31:
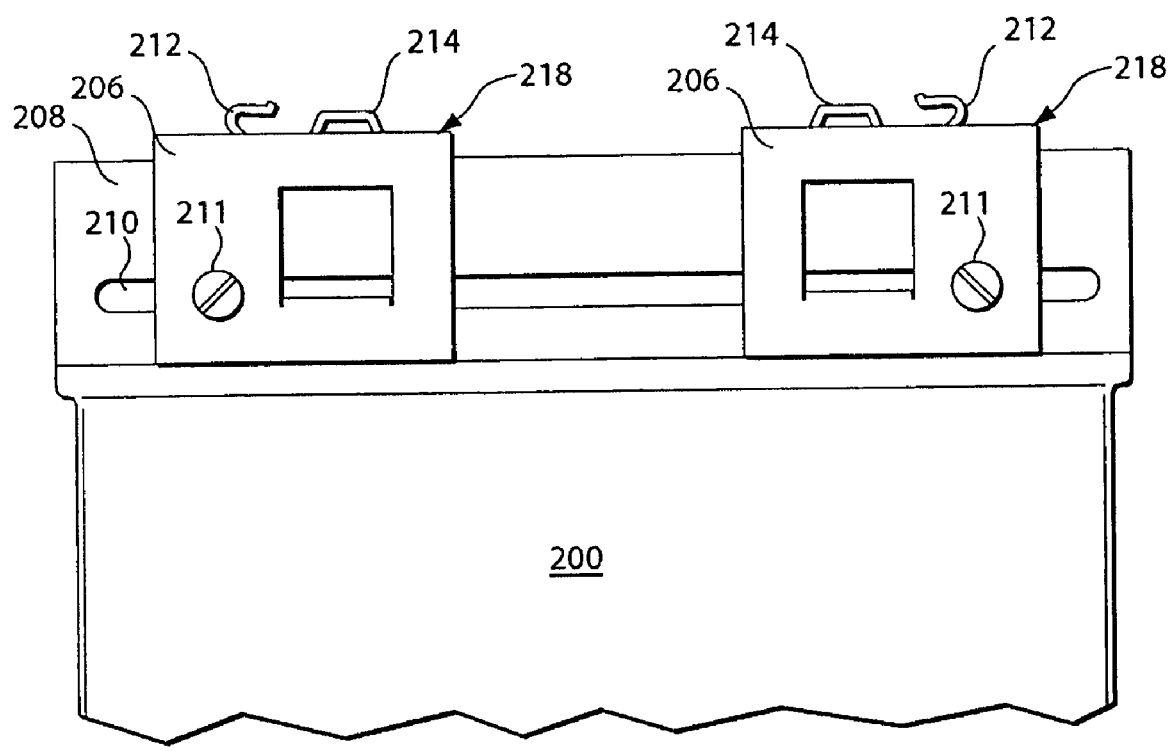
FIG. 31 is a top view of one end of the baffle shown in FIG. 30.
Figure 32A:
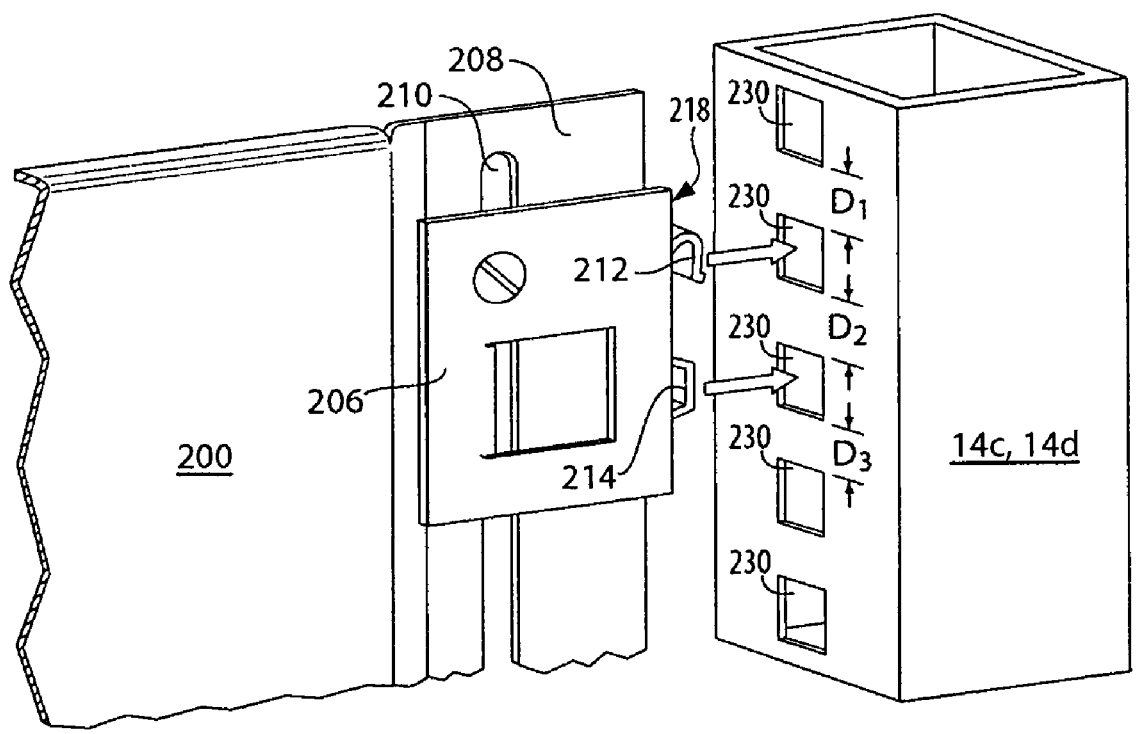
FIG. 32A is a partial perspective view of the baffle shown in FIG. 30 and a partial perspective view of a vertical mounting rail of a rack.

Referring to FIGS. 30 and 31, and with further reference to FIGS. 29A and 29B, in one embodiment, the baffle 200 can be configured such that the length $L_4$ of the baffle 200 can be adjusted, e.g., increased or decreased. The adjustable baffle 200 can include one or more plates, each plate configured to slidably receive another plate such that the baffle 200 can be extended or shortened by the telescoping extension/contraction of the multiple plates. In one embodiment, the baffle 200 includes a first plate 202 and a second plate 204 with the first plate 202 configured to slidably receive the second plate 204 such that the length $L_4$ of the baffle 200 can be adjusted to accommodate various depths of different types of side-to-side components 18. The baffle 200 can further include a third plate in order to adjust the depth or length $L_4$ of the baffle 200. The baffle 200 is thereby flexible and can be used with components 18 made by different manufacturers.

As shown in FIGS. 30 and 31, one terminal end of the baffle 200 includes one or more sliding mounting fasteners 206. In one embodiment, the mounting fasteners 206 are configured to be slidably connected to a baffle-mounting flange 208. The flange 208 defines a narrow elongated opening or slot 210 configured to receive one or more fasteners 211, e.g., screws, to connect each of the mounting fasteners 206 to the flange 208. The slot 210 receives a screw 211 connected to the mounting fastener 206 to mount the fastener to the flange 208 and to permit the fastener 206 to slide along the slot 210.

With further reference to FIG. 30, a terminal end of the baffle 200 opposite to the end of the baffle 200 defining the baffle-mounting flange 208 includes a brush grommet 220. When the baffle 200 is mounted to one of the rear vertical rails 14c and 14d, the brush grommet 220 is disposed adjacent or flush with a portion of a side wall of the side-to-side component 18 proximate to the back end of the component 18. The baffle 200 and the brush grommet 220 are thereby disposed or mated to the component 18 to help to block/prevent exhaust air from being drawn from the exhaust plenum 22 and to prevent cooling air from moving from the side 46 and 48 of the rack 14 into the exhaust plenum 22. The brush grommet 220 is configured to receive cables through the brush portion to permit cabling to and from the components 17 and 18.

Referring to FIGS. 32A-32D, and with further reference to FIGS. 30 and 31, the baffle 200 can be rack-mounted at any location along the rack 14 by virtue of the mounting fasteners 206. Each mounting fastener 206 has a clip 212 and a depressible button 214 located along an outer edge 218 of the fastener 206. Each of the clip 212 and the depressible button 214 are configured and sized such that openings 230 defined in the rear vertical rails 14c and 14d of the rack 14 can receive the clip 212 and the button 214 to thereby mount the baffle 200 to a vertical rail 14c and 14d. The openings 230 defined in the vertical rails 14c and 14d are standard openings of a conventional 23-inch or 30-inch rack 14 that are spaced according to industry standard units to universally accept a variety of equipment for rack mounting. As shown in FIG. 32, $D_1$ and $D_2$ measure ⅝ inch and $D_3$ measures ½ inch, which represent standard spacing of rack-mount openings 230 of convention rack designs. The sliding mounting fasteners 206 permit the baffles 200 to be used with standard 23-inch and 30-inch equipment racks, e.g., for use with 19-inch and 23-inch components 17 and 18, and to be mounted at any location along the vertical rails 14c and 14d of the rack 14. The baffle 200, therefore, can mount at any point along the rack 14 and can be used with all types of equipment components 17 and 18. In addition, the configuration of the mounting fasteners 206 permits the baffle 200 to connect to the left rear rail 14c and to the right rear vertical rail 14d such that the same baffle 200 can be used on either side of the rack 14. The baffle 200 is simply inverted to mount on the left or the right 45 and 47 of the rack 14. Further, the mounting fasteners 206 provide additional flexibility due to the ability of the fasteners 206 to slide along the slot 210. To attach the baffle 200 to the rack 14, a height of the baffle 200 is approximately aligned with a height of, for instance, a side-to-side component 18 and with one or more openings 203 defined in the vertical rail 14c or 14d. The mounting fastener 206 oriented toward the top of the baffle 200 can be slid to the top of the slot 210, and the clip 212 and the button 214 can be inserted into rail openings 203. The mounting fastener 206 below the fastener 206 positioned toward the top of the baffle 200 can then slide up or down along the slot 210 until the clip 212 and the button 214 of the fastener 206 are aligned with rail openings 203 to permit the remaining fastener 206 to be connected to the rack 14.

Thus, the baffle 200 and the mounting fasteners 206 permit the baffle 200 to be positioned either on the left side 45 or the right side 47 of the rack 14 and permit the fasteners 206 to connect to openings 203 defined anywhere along the rear vertical rails 14c and 14d. The mounting fasteners 206 further permit the baffle 200 to be aligned with a component 17 and 18 rack-mounted at any location within the rack 14.

As shown in FIGS. 32B and 32C, the mounting fasteners 206 can be configured as removable fasteners 206 that can be removably connected or mounted to the baffle 200. As shown in FIG. 32B, the fasteners 206 can be removably coupled to the slot 210 or removably connected to the mounting flange 208, e.g., using screws. To adjust the baffle 200 from a position along the left side 45 of the rack 14 to a position along the right side 47 of the rack 14, the fasteners 206 can be removed from the baffle 200, inverted and recoupled or reconnected to an alternate side of the mounting flange 208 or the slot 210 to permit the baffle 200 to be mounted to an opposite side of the rack 14. As shown in FIG. 32C, the baffle 200 can be further configured such that the baffle 200 is connected to a rear vertical rail 14c and 14d using conventional fasteners, e.g., screws, that are accepted by the openings 230 defined in the rails 14c and 14d.

As shown in FIG. 32D, a multi-plate baffle 200 having, for instance, the first plate 202 and the second plate 204, as described above with reference to FIG. 30, can be configured to permit the baffle 200 and the brush grommet 220 combination to be mounted on either side of the rack 14. The first plate 202 can be further configured to telescopically accept the second plate 204 whether the second plate 204 is oriented in a position where the brush grommet 220 extends outward to the left of the second plate 204 or to the right of the second plate 204. As shown in FIG. 32D, the first plate 202 can accept the second plate 204 such that the brush grommet extends outward to the left of the baffle 200 such that the baffle 200 can be used along the left side 45 of the rack 14 and the brush grommet 220 can be disposed adjacent or flush with the left side panel 26 of the enclosure 10. To adjust the baffle 200 for use on the right side 47 of the rack 14, the second panel 204 is removed from the first panel 202 and inverted, as shown by arrows 250 in FIG. 32D, such that side A, formerly oriented toward the top of the baffle 200, is oriented toward the bottom of the baffle 200 and side B, formerly oriented toward the bottom of the baffle 200, is oriented toward the top of the baffle 200. The same baffle 200 and brush grommet 220 can be used along the right side of the rack 14 and the brush grommet 220 can be disposed adjacent or flush with the right side panel 28 of the enclosure 19. The baffle 200 and brush grommet 220 combination can thereby be mounted on either side of the rack 14 and at any height along the rear vertical rail 14c and 14d to further the flexibility of the side air distribution unit 100.

Referring to FIGS. 19A-19G, assembly and placement of the side air distribution unit 100 can be done easily and in a relatively short time. Ease of assembly and disassembly of the unit 100 permits the unit 100 to be serviced and permits any of the fans 140 and 142 and the control elements, e.g., the control circuitry 310, to be maintained or replaced. Each fan 140 and 142 can be mounted or connected, e.g., using screws, to the bottom panel 107 of the housing 102, as shown in FIGS. 19A and 19C, such that the fan 140 and 142 is in alignment with one of the ports 136 and 138 defined in the midplate 112 and is in fluid communication with the upper intake plenum 110 when the midplate 112 is connected to the housing 102. In those embodiments of the unit 100 according to the invention in which the intake plenum 110 is the lower plenum, as shown in FIG. 19B and FIGS. 19F and 19G, each fan 140 and 142 is mounted or connected, e.g., using screws, to either the midplate 112 or to the top panel 104 of the housing 102 in alignment with and one of the ports 136 and 138 defined in the midplate 112 such that the fan 140 and 142 is in fluid communication with the lower intake plenum 110. The fan blades or impellers 140' and 142' and the fan hub 140" and 142" of each fan 140 and 142 are thereby oriented in a downward manner in facing relation to the bottom panel 107 of the housing 102. The fans 140 and 142 can draw air from the lower intake plenum 100 upward into its internal region 143 and 145 and can vent air from its internal region 143 and 145 into the upper exhaust plenum 114. Further, in embodiments of the invention shown in FIGS. 19F and 19G, each fan 140 and 142 can be further aligned with one of the port 136 and 138 of the midplate 112 such that the fan 140 and 142 is in alignment with one of the intake ports 135 and 137 defined in the bottom panel 107 of the housing 102 to place the fan 140 and 142 in fluid communication with the port 135 and 137 when the midplate 112 is connected to the housing 102. In alternative embodiments of the invention shown in FIGS. 19D and 19E, the fans 140 and 142 can be mounted or connected, e.g., using screws, to the bottom plate 107 of the housing 102.

A portion of the housing 102 can be preformed or can be assembled wherein the bottom panel 107, the side panels 106 and 108, the front panel 118 and the back panel 109 are joined. The midplate 112 can be mounted or connected, e.g., using screws, to the portion of the housing 102 such that it is disposed parallel to the bottom panel 107, and parallel to the top panel 104 when the top panel 104 is joined to the housing 102. When the midplate 112 is joined to the portion of the housing 102, the top plate 104 can be connected to the portion of the housing 102 to enclose the unit 100.

Referring to FIGS. 24 and 28, once assembled, the unit 100 can be placed in the rack 14 at a desired location within the rack 14 by connecting the unit 100 to the front vertical rails 14a and 14b of the rack 14 and/or the rear vertical rails 14c and 14d via the mounting brackets 180 and 182. As one stage of assembly, the mounting brackets 180 and 182 can be mounted or connected to the unit 100 before the unit 100 is disposed within the rack 14. The unit 100 with the mounting brackets 180 and 182 can then be placed at a desired location/height within the rack 14 by connecting the mounting brackets 180 and 182 along the front rails 14a and 14b and/or the rear rails 14c and 14d of the rack 14. As an alternative stage of assembly, the second brackets 180" and 182" of the mounting brackets 180 and 182 can be removed from the first brackets 180' and 182' and mounted to the front rails 14a and 14b and/or the rear rack rails 14c and 14d at a desired location/height before the unit 100 is placed in the rack 14. The first brackets 180' and 182' disposed along the side panels 106 and 108 of the unit housing 102 can then be coupled to the mounted second brackets 180" and 182", as described above, such that the second brackets 180" and 182" receive the first brackets 180' and 182' and allow the first brackets 180' and 182' to move along the second brackets 180" and 182" to thereby place the unit 100 within the rack 14.

Once placed in the rack 14, the unit 100 can be connected to one or more sources of power, and arranged to draw air as desired. Power cords are connected to the power ports 302 and 304, e.g., to couple an AC power source such as a wall socket or an uninterruptible power supply to one of the ports 302 and 304 and to connect a battery to the other of the ports 302 and 304. The invention is not limited in this respect and alternative sources of power can be supplied as well as different arrangements can be used to provide power to the unit 100.

In addition, one or more air directing devices 168 can be coupled to the exhaust vents 124, 126 and 154, 156 of the unit 100 before or after the unit 100 is placed in the rack 100. One or more baffles 200 can be connected to one or both of the rear rails 14c and 14d of the rack 14 either before or after the unit 100 is placed in the rack 14.

Figure 33:
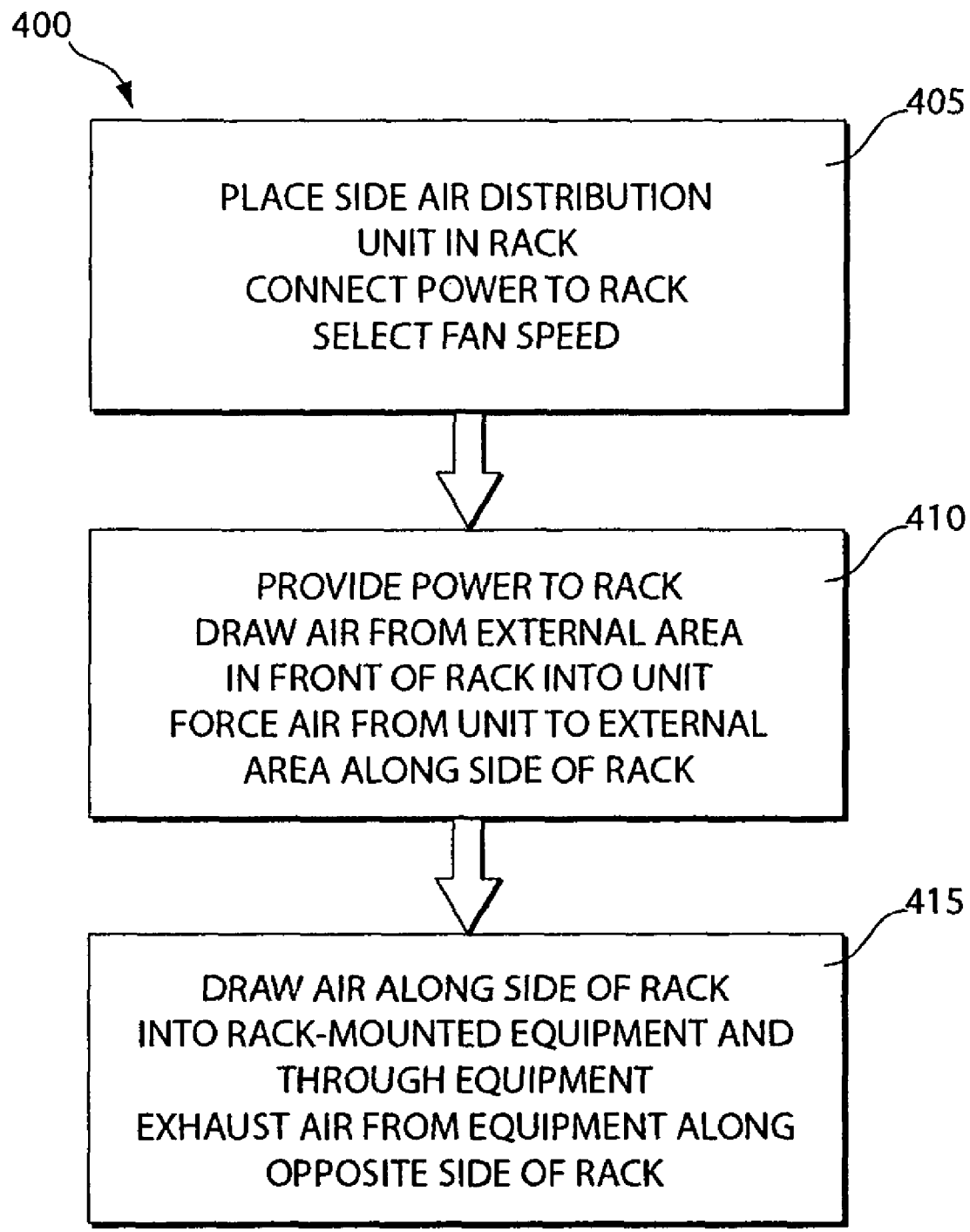
FIG. 33 is a block flow diagram of a method of cooling equipment mounted in a rack shown in FIG. 18 using any of the units shown in FIGS. 19A-19G.

Referring to FIG. 33, with further reference to FIGS. 18 and 19A-19G, a method 400 for cooling rack-mounted components 18 that use a side-to-side airflow using the side air distribution unit 100 includes the stages shown. The method, however, is exemplary only and not limiting. The method 400 can be altered, e.g., by adding, removing and/or rearranging stages.

At stage 405, the side air distribution unit 100 according to the invention is placed within the rack 14. The unit 100 can be placed above or below one or more side-to-side components 18, e.g., by disposing the unit 100 in the rack 14 using the mounting brackets 180 and 182. In an alternative embodiment, the unit 100 can be placed along the bottom U space of the rack 14, e.g., by disposing the unit 100 in the rack 14 using the mounting brackets 180 and 182 such that the unit 100 is the lowest or one of the lowest components within the rack 14. Power cords are connected to one or both of the power ports 302 and 304 of the unit 100 to provide power to the fans 140 and 142. A user can actuate one or both of the fan switches 306 and 308 to thereby select one or both of the fans 140 and 142 to receive power. In addition, a user can manually set fan speed, if the fans 140 and 142 are configured for multiple speed operation, using one or both of the fan speed selectors 318 and 320 to select the speed of each fan 140 and 142. In other aspects of the unit 100 according to the invention, a user can use the control system 300 to program or automatically set fan speed. The fan speed selected is preferably a speed of each fan 140 and 142 such that as air vents through the exhaust vents 124, 126 or 154, 156, air remains substantially as an air curtain or a continuous stream of air.

At stage 410, the unit 100 is powered on to provide a flow of air to either the left side 45 or the right side 47 of the rack 14. The fans 140 and 142 of the unit 100 rotate and draw air from either the front intake vents 120 and 122, or through the bottom intake ports 135 and 137 defined in the bottom panel 107 of the housing 10, and into the interior chamber of the unit 100. The fans 140 and 142 further draw air into the fan blades or impellers 140' and 142' and into the internal regions 143 and 147 of the fans 140 and 142 from which the fans 140 and 142 forces air radially outward toward the exhaust side vents 124, 126 or 154, 156 such that air flows from the vents 124, 126 and 154, 156 and along either the left side 45 or the right side 47 of the rack 14. The vented air can thereafter be directed in an upward direction away from the bottom of the rack 14 or in a downward direction away from the top of the rack 14 along the sides of the rack-mounted components 18 and, in particular, along the side intake vents 18A and 18C of the components 18.

At stage 415, air flowing along either the left side 45 or the right side 47 of the rack 14 is drawn into the left intake vents 18A or the right intake vents 18C of the side-to-side components by one or more fans disposed within the components 18. For instance, one or more fans can be disposed within one or more of the components 18 along the left exhaust vents 18B or the right exhaust vents such that as the one or more fans exhaust air from the components 18, the fans thereby draw air into the intake vents 18A and 18C and through the components 18 to provide cooling.

Having thus described at least one illustrative embodiment of the invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. An enclosure comprising:
   a housing having an interior;
   a rack disposed within the interior of the housing, the rack being configured to support rack-mounted equipment;
   a front plenum disposed along a front of the rack in the interior of the housing;
   a side plenum disposed along a side of the rack in the interior of the housing; and
   an air distribution unit for use in the equipment rack, the air distribution unit comprising:
   an air distribution unit housing defining an interior chamber and configured to be supported by the rack;
   at least one air intake vent defined along a front panel of the air distribution unit housing, the at least one air intake vent being disposed and being configured to provide fluid communication between the interior chamber and the front plenum;
   at least one exhaust air vent defined along a side panel of the air distribution unit housing and being disposed at a substantially perpendicular orientation relative to the at least one air intake vent, the at least one exhaust air vent being further disposed and being configured to provide fluid communication between the interior chamber and the side plenum; and at least one fan disposed within the interior chamber and configured to draw in air through the at least one air intake vent into its interior chamber and to vent the air from its interior chamber out through the at least one exhaust air vent, wherein the side plenum is configured with at least one opening to receive the air from the air distribution unit and to deliver the air from the side plenum to the rack mounted equipment, and wherein the air passes across the rack mounted equipment and enters a plenum on an opposite side from the side plenum.

2. The enclosure of claim 1, wherein the air distribution unit further comprises a midplate disposed within the interior chamber between a top panel and a bottom panel disposed opposite to the top panel, the midplate defining the interior chamber with an upper portion between the top panel and the midplate and a bottom portion between the midplate and the bottom panel, the midplate further defining at least one port in the midplate to provide fluid communication between the upper and the lower portions.

3. The enclosure of claim 2, wherein the at least one port of the midplate is configured such that the port receives at least a portion of the at least one fan to permit the at least one fan to draw in air through the at least one air intake port and the upper portion into its interior and to vent drawn-in air from its interior into the lower portion and out through the at least one exhaust air vent.

4. The enclosure of claim 2, wherein the at least one air intake vent is disposed to provide fluid communication between an area external to the air distribution housing and the upper portion, and the at least one exhaust air vent is disposed to provide fluid communication between the bottom portion and an area external to the air distribution housing.

5. The enclosure of claim 4, further comprising the midplate defining a second port to provide fluid communication between the upper and the lower portions, the second port being configured such that the second port receives at least a portion of a second fan, the second fan being disposed and being configured to draw-in air through the at least one air intake vent and the upper portion into its interior and to vent drawn-in air from its interior into the lower portion and through the at least one exhaust air vent.

6. The enclosure of claim 5, wherein the second fan being connected to the bottom panel of the air distribution housing and disposed at an offset position relative to the at least one fan.

7. The enclosure of claim 1, wherein the air distribution unit has a predetermined U height.

8. The enclosure of claim 1, wherein the air distribution unit is removably mounted within an equipment area defined by the rack of the enclosure.

* * * * *